US012532657B2

(12) United States Patent
Ko et al.

(10) Patent No.: US 12,532,657 B2
(45) Date of Patent: Jan. 20, 2026

(54) ORGANIC LIGHT-EMITTING DEVICE AND ELECTRONIC APPARATUS INCLUDING SAME

(71) Applicant: Samsung Display Co., LTD., Yongin-si (KR)

(72) Inventors: Heejoo Ko, Yongin-si (KR); Eunhye Song, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 64 days.

(21) Appl. No.: 18/664,166

(22) Filed: May 14, 2024

(65) Prior Publication Data

US 2024/0324444 A1 Sep. 26, 2024

Related U.S. Application Data

(63) Continuation of application No. 17/082,804, filed on Oct. 28, 2020, now Pat. No. 12,022,726.

(30) Foreign Application Priority Data

May 7, 2020 (KR) ........................ 10-2020-0054777

(51) Int. Cl.
*H01L 51/50* (2006.01)
*H10K 85/30* (2023.01)
(Continued)

(52) U.S. Cl.
CPC ......... *H10K 85/346* (2023.02); *H10K 85/322* (2023.02); *H10K 85/40* (2023.02);
(Continued)

(58) Field of Classification Search
None
See application file for complete search history.

(56) References Cited

U.S. PATENT DOCUMENTS

| | | | |
|---|---|---|---|
| 4,539,507 | A | 9/1985 | VanSlyke et al. |
| 9,184,405 | B2 | 11/2015 | Song et al. |

(Continued)

FOREIGN PATENT DOCUMENTS

| | | | |
|---|---|---|---|
| CN | 108727429 | A | 11/2018 |
| CN | 110294779 | A | 10/2019 |

(Continued)

OTHER PUBLICATIONS

Christof Pflumm, et al., "A Novel Triplet Green Host System and Charge Balance Tuning for High Performance Singlet Blue Devices," SID Symposium Digest of Technical Papers 43 (1), (2012), pp. 434-437.

(Continued)

*Primary Examiner* — Gregory D Clark
(74) *Attorney, Agent, or Firm* — Womble Bond Dickinson (US) LLP

(57) ABSTRACT

Provided is an organic light-emitting device including: a first electrode; a second electrode facing the first electrode; and an organic layer between the first electrode and the second electrode and including an emission layer, wherein the emission layer may include a host and a dopant, the host may include a first compound and a second compound different from the first compound, the dopant may include a third compound and a fourth compound different from the third compound, and the third compound may be a platinum-containing organometallic compound.

18 Claims, 4 Drawing Sheets

(51) Int. Cl.

| | |
|---|---|
| ***H10K 85/40*** | (2023.01) |
| ***H10K 85/60*** | (2023.01) |
| *H10K 50/12* | (2023.01) |
| *H10K 50/15* | (2023.01) |
| *H10K 50/16* | (2023.01) |
| *H10K 50/84* | (2023.01) |

(52) U.S. Cl.

CPC ......... *H10K 85/636* (2023.02); *H10K 85/654* (2023.02); *H10K 85/6572* (2023.02); *H10K 85/6574* (2023.02); *H10K 85/6576* (2023.02); *H10K 50/12* (2023.02); *H10K 50/15* (2023.02); *H10K 50/16* (2023.02); *H10K 50/84* (2023.02)

(56) References Cited

U.S. PATENT DOCUMENTS

| | | | |
|---|---|---|---|
| 9,224,963 | B2 | 12/2015 | Li et al. |
| 10,199,583 | B1 | 2/2019 | Hang et al. |
| 10,290,816 | B2 | 5/2019 | Forrest et al. |
| 2006/0124924 | A1 | 6/2006 | Suh et al. |
| 2007/0148495 | A1 | 6/2007 | Che et al. |
| 2008/0023724 | A1 | 1/2008 | Takeda et al. |
| 2008/0241589 | A1 | 10/2008 | Fukunaga et al. |
| 2015/0155510 | A1 | 6/2015 | Kawata et al. |
| 2015/0295184 | A1 | 10/2015 | Kaiser et al. |
| 2017/0155061 | A1 | 6/2017 | Forrest et al. |
| 2017/0338432 | A1 | 11/2017 | Adamovich et al. |
| 2018/0105740 | A1 | 4/2018 | Lim et al. |
| 2018/0301638 | A1 | 10/2018 | Ahn et al. |
| 2019/0036055 | A1 | 1/2019 | Lin et al. |
| 2019/0296253 | A1 | 9/2019 | Sim et al. |

FOREIGN PATENT DOCUMENTS

| | | | |
|---|---|---|---|
| JP | 2006-302878 | A | 11/2006 |
| JP | 2008-270736 | A | 11/2008 |
| JP | 2011-258373 | A | 12/2011 |
| JP | 2014-535128 | A | 12/2014 |
| JP | 2015-232994 | A | 12/2015 |
| JP | 2017-143243 | A | 8/2017 |
| JP | 2018-123083 | A | 8/2018 |
| JP | 2019-62184 | A | 4/2019 |
| KR | 10-1101940 | B1 | 1/2012 |
| KR | 10-2014-0059713 | A | 5/2014 |
| KR | 10-2014-0103908 | A | 8/2014 |
| KR | 10-2016-0136220 | A | 11/2016 |
| KR | 10-2017-0057163 | A | 5/2017 |
| KR | 10-2019-0087282 | A | 7/2019 |

OTHER PUBLICATIONS

Hsin-Hung Kuo, et al., "Bis-Tridentate Iridium(III) Phosphors with Very High Photostability and Fabrication of Blue-Emitting OLEDs," Advanced Science News, (2018), 5, 1800846, 7 pages.

Hsin-Hung Kuo, et al., "Bis-Tridentate Ir(III) Metal Phosphors for Efficient Deep-Blue Organic Light-Emitting Diodes," Advanced Materials, (2017), 1702464, 7 pages.

Tyler Fleetham, et al., "Development of Tetradentate Pt Complexes for Efficient, Stable, and High Color Purity Blue OLEDs," SID Symposium Digest of Technical Papers, 28.4, 46 (1), (2015), pp. 411-414.

Yirang Im, et al., "Recent Progress in High-Efficiency Blue-Light-Emitting Materials for Organic Light-Emitting Diodes," Advanced Functional Materials, 27(13), (2017), 1603007, 24 pages.

20

30

40

ORGANIC LIGHT-EMITTING DEVICE AND ELECTRONIC APPARATUS INCLUDING SAME

CROSS-REFERENCE TO RELATED APPLICATION

This application is a continuation of U.S. patent application Ser. No. 17/082,804, Oct. 28, 2020, which claims priority to and the benefit of Korean Patent Application No. 10-2020-0054777, filed on May 7, 2020, in the Korean Intellectual Property Office, the entire contents of which are hereby incorporated by reference.

BACKGROUND

1. Field

One or more embodiments of the present disclosure relate to an organic light-emitting device and an electronic apparatus including the organic light-emitting device.

2. Description of Related Art

Organic light-emitting devices (OLEDs) are self-emissive devices that, as compared with other devices of the related art, have wide viewing angles, high contrast ratios, short response times, and excellent characteristics in terms of brightness, driving voltage, and response speed, and produce full-color images.

OLEDs may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit (e.g., transition or relax) from an excited state to a ground state to thereby generate light.

SUMMARY

One or more embodiments relate to an organic light-emitting device having high color purity, high efficiency, and long lifespan and an electronic apparatus including the organic light-emitting device.

Additional aspects of embodiments will be set forth in part in the description which follows and, in part, will be apparent from the description, or may be learned by practice of the presented embodiments of the disclosure.

According to one or more embodiments, an organic light-emitting device may include:

a first electrode, a second electrode facing the first electrode, and an organic layer between the first electrode and the second electrode and including an emission layer, wherein the emission layer may include a host and a dopant, the host may include a first compound and a second compound different from the first compound, the dopant may include a third compound and a fourth compound different from the third compound, and the third compound may be a platinum-containing organometallic compound.

According to one or more embodiments, an electronic apparatus may include a thin-film transistor including a source electrode, a drain electrode, and an active layer; and the organic light-emitting device, wherein the first electrode of the organic light-emitting device may be electrically coupled to any one selected from the source electrode and the drain electrode of the thin-film transistor.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
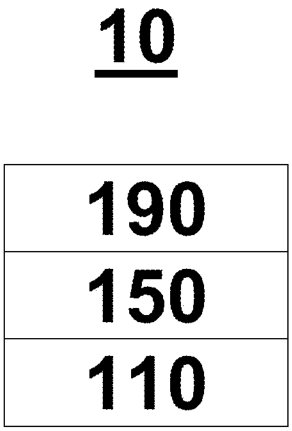
FIG. 1 is a schematic cross-sectional view of an embodiment of an organic light-emitting device.

Reference will now be made in more detail to embodiments of the present disclosure, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in more detail in the written description. Effects, features, and a method of providing the subject matter of the present disclosure will be readily apparent to those of ordinary skill in the art by referring to example embodiments of the present disclosure with reference to the attached drawings. The subject matter of the present disclosure may, however, be embodied in many different forms and should not be construed as being limited to the embodiments set forth herein.

Hereinafter, the subject matter of the present disclosure will be described in more detail by explaining example embodiments of the present disclosure with reference to the attached drawings. Like reference numerals in the drawings denote like elements, and thus, duplicative description thereof will not be repeated.

In the embodiments described in the present specification, an expression used in the singular encompasses the expression of the plural, unless it has a clearly different meaning in the context.

In the present specification, it is to be understood that the terms such as "including," "having," and "comprising" are intended to indicate the existence of the features or components disclosed in the specification, and are not intended to preclude the possibility that one or more other features or components may exist or may be added.

It will be understood that when a layer, region, or component is referred to as being "on" or "onto" another layer, region, or component, it may be directly or indirectly formed over the other layer, region, or component. That is, for example, intervening layers, regions, or components may be present.

Sizes of components in the drawings may be exaggerated for convenience of explanation. In other words, because sizes and thicknesses of components in the drawings may be arbitrarily illustrated for convenience of explanation, the following embodiments are not limited thereto.

The term "organic layer," as used herein, refers to a single and/or a plurality of layers between an anode and a cathode in an organic light-emitting device. A material included in the "organic layer" is not limited to an organic material. For example, the organic layer may include an inorganic material.

As used herein, the expression the "(organic layer) includes a compound represented by Formula N" (wherein N indicates an arbitrary integer) may be construed as meaning the "(organic layer) may include one compound that is represented by Formula Nor two different compounds that are represented by Formula N."

The subject matter of the present disclosure will now be described more fully with reference to the accompanying drawings, in which exemplary embodiments of the present disclosure are shown.

Description of FIG. 1

FIG. 1 is a schematic view of an organic light-emitting device 10 according to an exemplary embodiment. An organic light-emitting device 10 includes a first electrode 110; a second electrode 190 facing the first electrode 110; and an emission layer 150 between the first electrode 110 and the second electrode 190 and including an organic layer 150.

The emission layer may include a host and a dopant, the host may include a first compound and a second compound different from the first compound, the dopant may include a third compound and a fourth compound different from the third compound, and the third compound may be a platinum-containing organometallic compound.

As the organic light-emitting device 10 includes two different types of hosts as co-hosts in the emission layer thereof, balance between holes and electrons in the emission layer may be improved. In addition, the third compound may improve the color purity of light emitted from the organic light-emitting device 10 and luminescence efficiency of the organic light-emitting device 10, and the fourth compound may improve lifespan of the organic light-emitting device 10. Accordingly, as the organic light-emitting device 10 includes the third compound and the fourth compound as co-dopants, the color purity, efficiency, and lifespan characteristics may be improved.

First Electrode 110

In FIG. 1, a substrate may be additionally located under the first electrode 110 or above the second electrode 190. The substrate may be a glass substrate and/or a plastic substrate, each having excellent mechanical strength, thermal stability, transparency, surface smoothness, ease of handling, and water resistance.

The first electrode 110 may be formed by depositing and/or sputtering, onto the substrate, a material for forming the first electrode 110. When the first electrode 110 is an anode, the material for forming the first electrode 110 may be selected from materials having a high work function that facilitate hole injection.

The first electrode 110 may be a reflective electrode, a semi-transmissive electrode, or a transmissive electrode. When the first electrode 110 is a transmissive electrode, a material for forming the first electrode 110 may be selected from indium tin oxide (ITO), indium zinc oxide (IZO), tin oxide ($SnO_2$), zinc oxide (ZnO), and any combinations thereof, but the present disclosure is not limited thereto. In some embodiments, when the first electrode 110 is a semi-transmissive electrode or a reflective electrode, as a material for forming the first electrode 110, at least one selected from magnesium (Mg), silver (Ag), aluminum (Al), aluminum-lithium (Al—Li), calcium (Ca), magnesium-indium (Mg—In), magnesium-silver (Mg—Ag), and any combination thereof may be used, but the present disclosure is not limited thereto.

The first electrode 110 may have a single-layered structure, or a multi-layered structure including two or more layers. In some embodiments, the first electrode 110 may have a triple-layered structure of ITO/Ag/ITO, but the present disclosure is not limited thereto.

Emission Layer in Organic Layer 150

The emission layer may include a host and a dopant, the host may include a first compound and a second compound different from the first compound, the dopant may include a third compound and a fourth compound different from the third compound.

According to one or more embodiments, the first compound and the second compound may be hosts that each transport different types of charge (holes or electrons).

In some embodiments, the first compound may be a hole-transporting host, and the second compound may be an electron-transporting host.

First Compound

In some embodiments, the first compound may be a compound including at least one hole-transporting moiety. In some embodiments, the hole-transporting moiety may include a carbazole group, a dibenzofuran group, a dibenzothiophene group, a dibenzosilole group, and/or an amine group, but the present disclosure is not limited thereto.

According to one or more embodiments, the first compound may include at least one moiety represented by any one selected from Formulae 3-1 to 3-3:

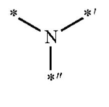
3-1

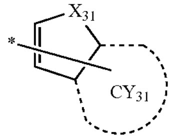
3-2

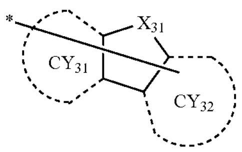
3-3 wherein, in Formulae 3-1 to 3-3, $X_{31}$ may be selected from O, S, N-$(L_{33})_{a33}$-$(R_{33})_{b33}$, $C(R_{33})(R_{34})$, and $Si(R_{33})(R_{34})$, $CY_{31}$ and $CY_{32}$ may each independently be a π-electron rich cyclic group, and

*, *', and *" each indicate a binding site to an adjacent atom.

The term "π-electron rich cyclic group," as used herein, refers to a carbocyclic or heterocyclic group not including *═N—*' as a ring-forming moiety.

In some embodiments, the "π-electron rich cyclic group" may be a benzene group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, a dihydroacridine group, a benzonaphthofuran group, a benzonapthothiophene group, an indolophenanthrene group, a benzofuranophenanthrene group, or a benzothienophenanthrene group, but the present disclosure is not limited thereto.

According to one or more embodiments, $CY_{31}$ and $CY_{32}$ in Formulae 3-1 to 3-3 may each independently be a benzene group, a naphthalene group, a phenanthrene group, a fluorene group, a carbazole group, a dibenzofuran group, a dibenzothiophene group, or a dibenzosilole group.

According to one or more embodiments, the first compound may be a hole-transporting host including at least one moiety represented by any one selected from Formulae 3-1 to 3-3, as shown herein above.

According to one or more embodiments, the first compound may be selected from compounds represented by Formulae 3-11 to 3-14:

Formula 3-11

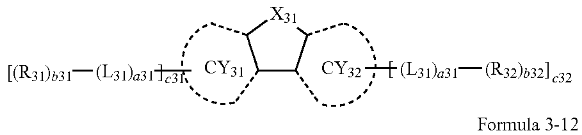

Formula 3-12

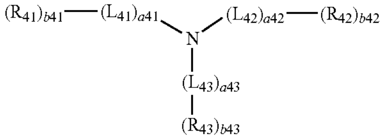

Formula 3-13

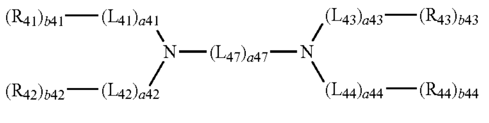

-continued

Formula 3-14

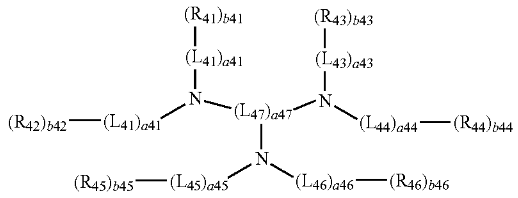

wherein, in Formula 3-11, $CY_{31}$ and ring $CY_{32}$ may each independently be a π-electron rich cyclic group having 3 to 30 carbon atoms, $X_{31}$ may be selected from O, S, N-$(L_{33})_{a33}$-$(R_{33})_{b33}$, $C(R_{33})(R_{34})$, and $Si(R_{33})(R_{34})$, c31 and c32 may each independently be an integer from 0 to 3, wherein, in Formulae 3-11 to 3-14, $L_{31}$ to $L_{33}$ and $L_{41}$ to $L_{47}$ may each independently be selected from a single bond, a substituted or unsubstituted $C_5$-$C_{30}$ carbocyclic group (or a substituted or unsubstituted $C_4$-$C_{30}$ carbocyclic group), and a substituted or unsubstituted $C_1$-$C_{30}$ heterocyclic group, a31 to a33 and a41 to a47 may each independently be an integer from 1 to 10, $R_{31}$ to $R_{34}$ and $R_{41}$ to $R_{47}$ may each independently be selected from hydrogen, deuterium, —F, —Cl, —Br, —I, a hydroxyl group, a cyano group, a nitro group, an amidino group, a hydrazino group, a hydrazono group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_1)(Q_2)$, —$B(Q_1)(Q_2)$, —$C(═O)(Q_1)$, —$S(═O)_2(Q_1)$, and —$P(═O)(Q_1)(Q_2)$, b31 to b33 and b41 to b46 may each independently be an integer from 1 to 10, and at least one substituent of the substituted $C_5$-$C_{30}$ carbocyclic group (or the substituted or unsubstituted $C_4$-$C_{30}$ carbocyclic group), the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, and —$P(=O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, and —$P(=O)(Q_{21})(Q_{22})$; and —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amino group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

According to one or more embodiments, in Formula 3-11, $CY_{31}$ and $CY_{32}$ may each independently be selected from a benzene group, a naphthalene group, an anthracene group, a phenanthrene group, a fluoranthene group, a triphenylene group, a pyrene group, a chrysene group, an indene group, a fluorene group, a spiro-bifluorene group, a benzofluorene group, a dibenzofluorene group, a carbazole group, a benzocarbazole group, a dibenzocarbazole group, a dibenzosilole group, a dibenzofuran group, and a dibenzothiophene group.

In some embodiments, $CY_{31}$ and $CY_{32}$ may each independently be selected from a benzene group, a naphthalene group, a phenanthrene group, a fluorene group, a carbazole group, a dibenzosilole group, a dibenzofuran group, and a dibenzothiophene group.

According to one or more embodiments, in Formulae 3-11 to 3-14, $L_{31}$ to $L_{33}$ and $L_{41}$ to $L_{47}$ may each independently be a single bond or a substituted or unsubstituted π-electron rich cyclic group having 3 to 30 carbon atoms.

In some embodiments, $L_{31}$ to $L_{33}$ and $L_{41}$ to $L_{47}$ may each independently be selected from:

a single bond, a benzene group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a coronene group, an ovalene group, a pyrrole group, an isoindole group, an indole group, a furan group, a thiophene group, a benzofuran group, a benzothiophene group, a benzosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, and a dihydroacridine group; and a benzene group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a coronene group, an ovalene group, a pyrrole group, an isoindole group, an indole group, a furan group, a thiophene group, a benzofuran group, a benzothiophene group, a benzosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, and a dihydroacridine group, each substituted with deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, and a terphenyl group.

In Formulae 3-11 to 3-14, a31 to a33 and a41 to a47 may respectively indicate the number of $L_{31}$ to $L_{33}$ and $L_{41}$ to $L_{47}$, and a31 to a33 and a41 to a47 may each independently an integer from 1 to 10.

According to one or more embodiments, in Formulae 3-11 to 3-14, $R_{31}$ to $R_{34}$ and $R_{41}$ to $R_{46}$ may each independently be selected from:

hydrogen, deuterium, —F, —Cl, —Br, —I, a hydroxyl group, a cyano group, a nitro group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a cyano group, a phenyl group, and a biphenyl group;

a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, —Si($Q_1$)($Q_2$)($Q_3$), —N($Q_1$)($Q_2$), and —B($Q_1$)($Q_2$); and a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, and an azadibenzosilolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, a biphenyl group, and a terphenyl group, wherein $Q_1$ to $Q_3$ may each independently be selected from hydrogen, deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, and a tetraphenyl group.

In some embodiments, in Formulae 3-11 to 3-14, $R_{33}$ and $R_{41}$ to $R_{46}$ may each independently be selected from hydrogen, a substituted or unsubstituted monovalent π-electron rich cyclic group, —Si($Q_1$)($Q_2$)($Q_3$), and —N($Q_1$)($Q_2$), wherein $Q_1$ to $Q_3$ may each independently be selected from hydrogen, deuterium, a $C_1$-$C_{10}$ alkyl group, a $C_1$-$C_{10}$ alkoxy group, a π-electron rich cyclic group, a biphenyl group, and a terphenyl group.

In some embodiments, $R_{33}$ and $R_{41}$ to $R_{46}$ may each independently be selected from:

a phenyl group, a biphenyl group, a terphenyl group, a tetraphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, an isoindolyl group, an indolyl group, a furanyl group, a thiophenyl group, a benzofuranyl group, a benzothiophenyl group, a benzosilolyl group, a dibenzofuranyl group, a dibenzothiophenyl group, a carbazolyl group, a benzocarbazolyl group, a dibenzocarbazolyl group, a dibenzosilolyl group, an indenocarbazolyl group, an indolocarbazolyl group, a benzofurocarbazolyl group, a benzothienocarbazolyl group, a benzosilolocarbazolyl group, an acridinyl group, and a dihydroacridinyl group;

a phenyl group, a biphenyl group, a terphenyl group, a tetraphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, an isoindolyl group, an indolyl group, a furanyl group, a thiophenyl group, a benzofuranyl group, a benzothiophenyl group, a benzosilolyl group, a dibenzofuranyl group, a dibenzothiophenyl group, a carbazolyl group, a benzocarbazolyl group, a dibenzocarbazolyl group, a dibenzosilolyl group, an indenocarbazolyl group, an indolocarbazolyl group, a benzofurocarbazolyl group, a benzothienocarbazolyl group, a benzosilolocarbazolyl group, an acridinyl group, and a dihydroacridinyl group, each substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, and a terphenyl group;

—Si($Q_1$)($Q_2$)($Q_3$) and —N($Q_1$)($Q_2$), wherein $Q_1$ to $Q_3$ may each independently be selected from hydrogen, deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, and a terphenyl group.

b31 to b33 and b41 to b46 may respectively indicate the number of $R_{31}$(s) to $R_{33}$(s) and $R_{41}$(s) to $R_{46}$(s), and b31 to b33 and b41 to b46 may each independently be an integer from 1 to 10.

According to one or more embodiments, the first compound may be selected from the following compounds, but the present disclosure is not limited thereto:

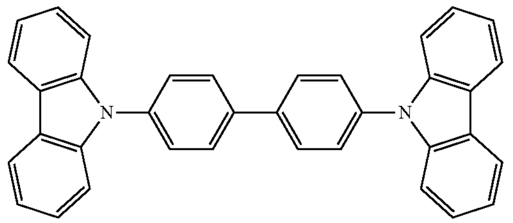

CBP

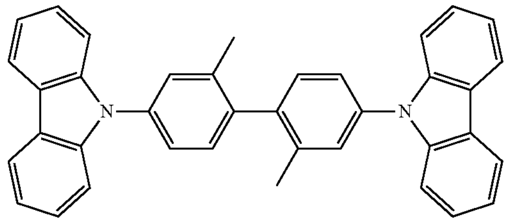

CDBP

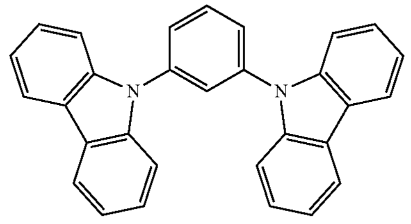

mCP

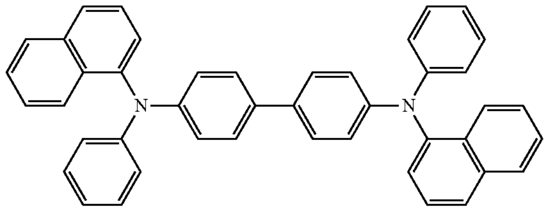

NPB

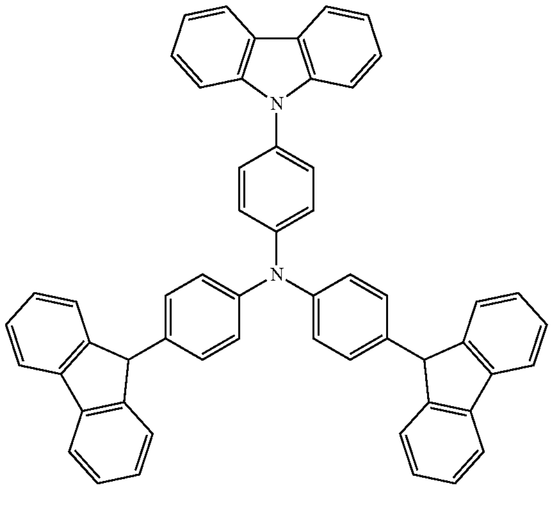

TCTA

-continued

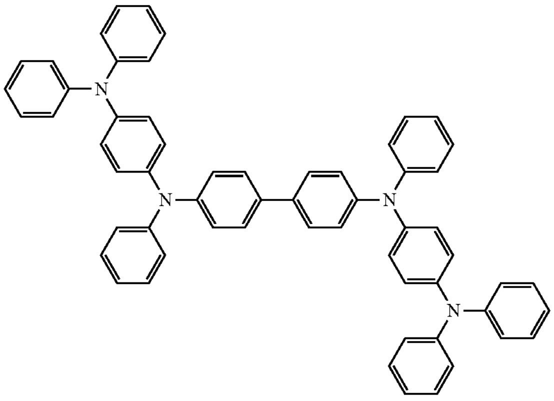

NPNPB

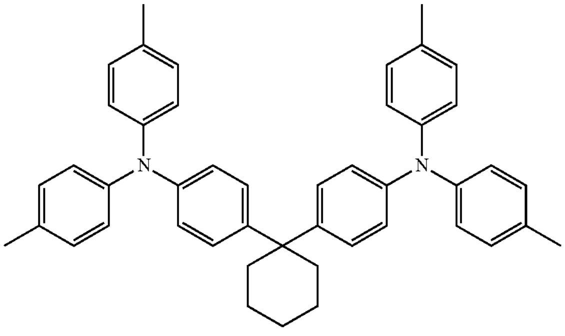

TAPC

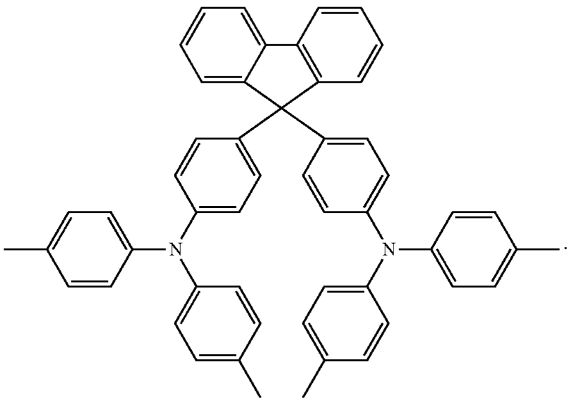

DTAF

Second Compound

The second compound may include at least one electron-transporting moiety. In some embodiments, the second compound may include an electron-transporting moiety including at least one selected from —F, a cyano group, a $C_1$-$C_{60}$ alkyl group substituted with —F or a cyano group, a $C_6$-$C_{60}$ aryl group substituted with —F or a cyano group, and a π-electron-depleted nitrogen-containing cyclic group.

In some embodiments, the second compound may be represented by Formula 4-1:

Formula 4-1

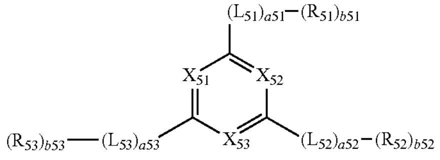

wherein, in Formula 4-1, $X_{51}$ may be N or $C[(L_{54})_{a54}$-$(R_{54})_{b54}]$, $X_{52}$ may be N or $C[(L_{55})_{a55}$-$(R_{55})_{b55}]$, and $X_{53}$ may be N or $C[(L_{56})_{a56}$-$(R_{56})_{b56}]$, $L_{51}$ to $L_{56}$ may each independently be selected from a single bond, a substituted or unsubstituted $C_5$-$C_{30}$ carbocyclic group (or a substituted or unsubstituted $C_4$-$C_{30}$ carbocyclic group) and a substituted or unsubstituted $C_1$-$C_{30}$ heterocyclic group, a51 to a56 may each independently be an integer from 1 to 10, $R_{51}$ to $R_{56}$ may each independently be selected from hydrogen, deuterium, —F, —Cl, —Br, —I, a hydroxyl group, a cyano group, a nitro group, an amidino group, a hydrazino group, a hydrazono group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, and $—P(=O)(Q_1)(Q_2)$, b51 to b56 may each independently be an integer from 1 to 10, and at least one substituent of the substituted $C_5$-$C_{30}$ carbocyclic group (or the substituted or unsubstituted $C_4$-$C_{30}$ carbocyclic group), the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from the aforementioned substituents.

According to one or more embodiments, in Formula 4-1, $L_{51}$ to $L_{56}$ may each independently be selected from: a single bond, a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azaindene group, an azaindole group, an azabenzofuran group, an azabenzothiophene group, an azabenzosilole group, an azafluorene group, an azacarbazole group, an azadibenzofuran group, an azadibenzothiophene group, and an azadibenzosilole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, a dibenzofuran group, a dibenzothiophene group, carbazole group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azaindene group, an azaindole group, an azabenzofuran group, an azabenzothiophene group, an azabenzosilole group, an azafluorene group, an azacarbazole group, an azadibenzofuran group, an azadibenzothiophene group, and an azadibenzosilole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a naphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a dibenzofuranyl group, a dibenzothiophenyl group, a carbazolyl group, an imidazolyl group, a pyrazolyl group, a thiazolyl group, an isothiazolyl group, an oxazolyl group, an isoxazolyl group, a pyridinyl group, a pyrazinyl group, a pyridazinyl group, a pyrimidinyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a cinnolinyl group, a phenanthridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an oxadiazolyl group, a triazinyl group, a thiadiazolyl group, an imidazopyridinyl group, an imidazopyrimidinyl group, an azaindenyl group, an azaindolyl group, an azabenzofuranyl group, an azabenzothiophenyl group, an azabenzosilolyl group, an azafluorenyl group, an azacarbazolyl group, an azadibenzofuranyl group, an azadibenzothiophenyl group, an azadibenzosilolyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, wherein $Q_{31}$ to $Q_{33}$ may each independently be selected from a $C_1$-$C_{10}$ alkyl group, a $C_1$-$C_{10}$ alkoxy group, a phenyl group, a phenyl group substituted with a $C_1$-$C_{10}$ alkyl group, a biphenyl group, a terphenyl group, and a naphthyl group.

In some embodiments, in Formula 4-1, $R_{51}$ to $R_{56}$ may each independently be selected from:

hydrogen, deuterium, —F, —Cl, —Br, —I, a hydroxyl group, a cyano group, a nitro group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a cyano group, a phenyl group, and a biphenyl group;

a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, —$Si(Q_1)(Q_2)(Q_3)$, —$N(Q_1)(Q_2)$, and —$B(Q_1)(Q_2)$; and a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, and an azadibenzosilolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, a biphenyl group, and a terphenyl group, wherein $Q_1$ to $Q_3$ may each independently be selected from hydrogen, deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, and a tetraphenyl group.

According to one or more embodiments, the second compound may be selected from the following compounds, but the present disclosure is not limited thereto:

ETH1

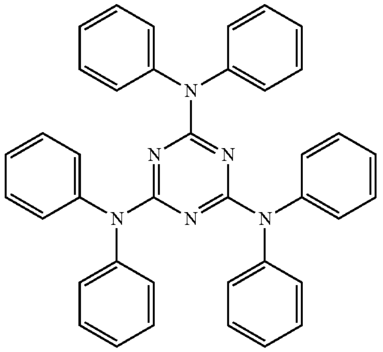

ETH2

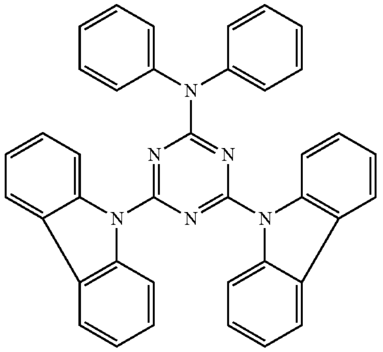

ETH3

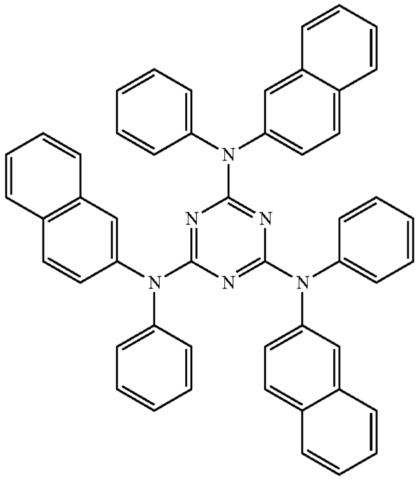

-continued
ETH4
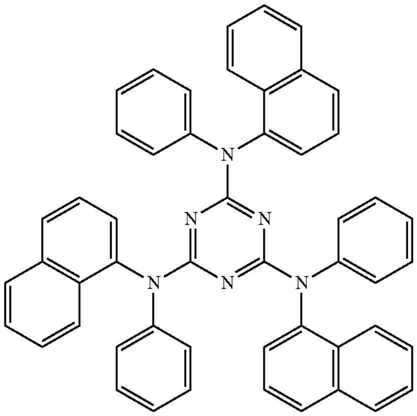
ETH5
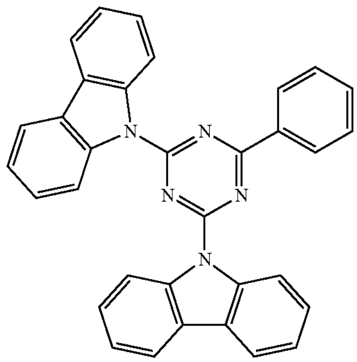
ETH6
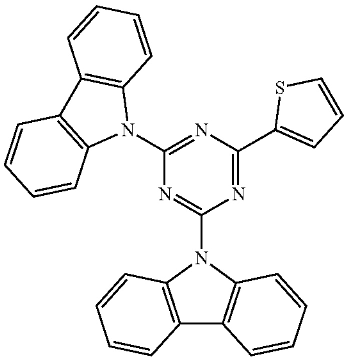
ETH7
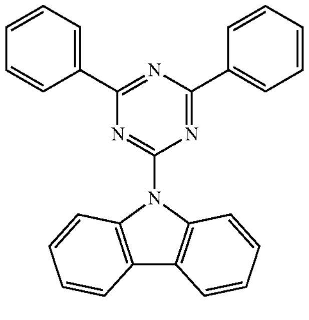
-continued
ETH8
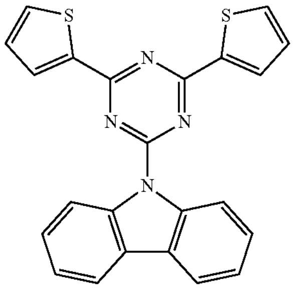
ETH9
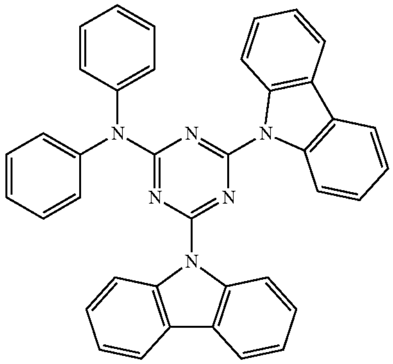
ETH10
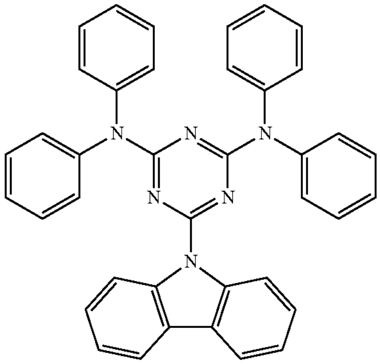
ETH11
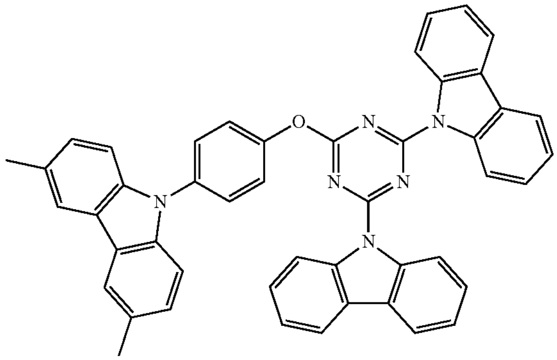

-continued
ETH12
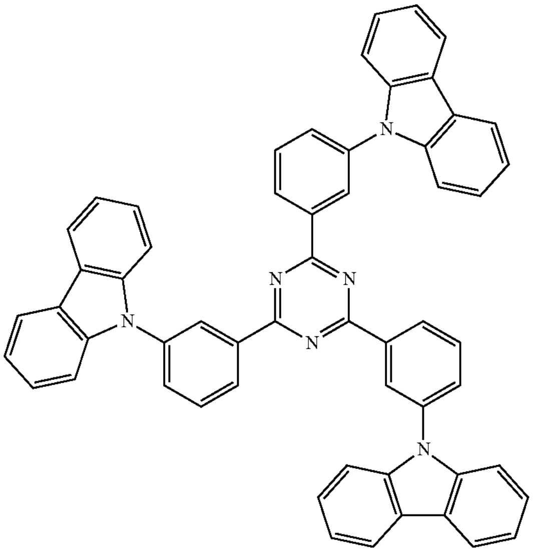
ETH13
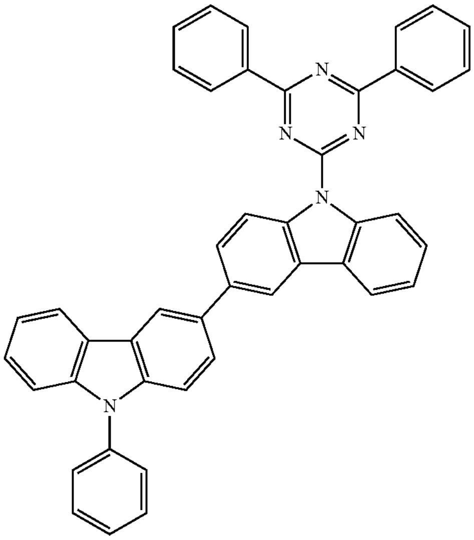
ETH14
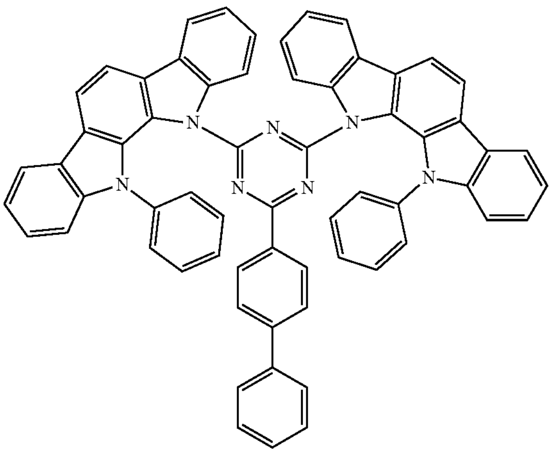
-continued
ETH15
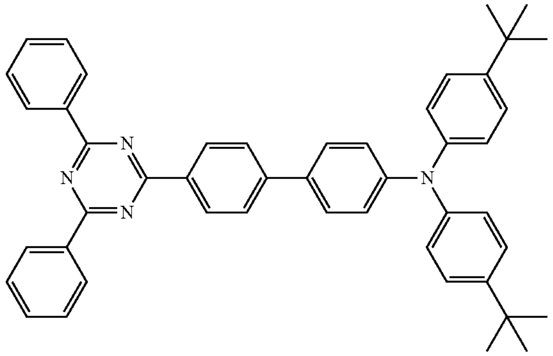
ETH16
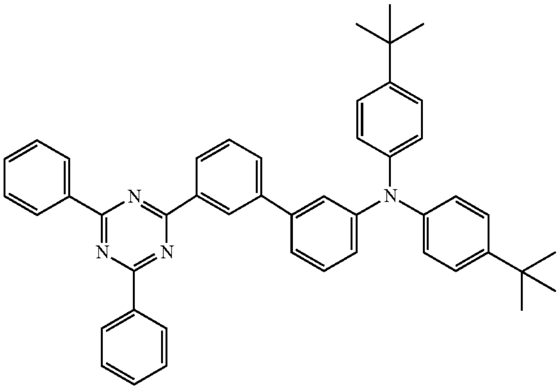
ETH17
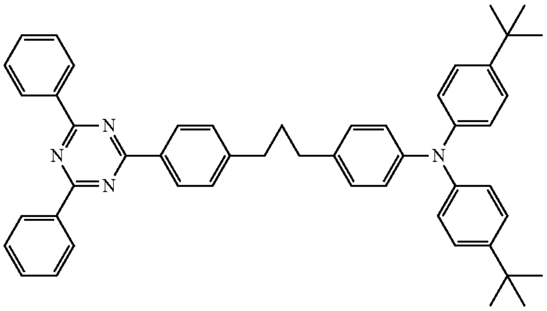
DIC-TRZ
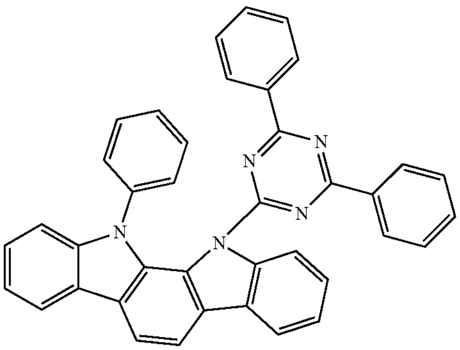
The organic light-emitting device may include mixed hosts of the first compound and the second compound. Accordingly, charge balance in an emission layer of the organic light-emitting device may be improved, as compared with an organic light-emitting device including a single host. In some embodiments, when the first compound and the second compound are hosts that may each transport different types of charge (holes or electrons), balance of holes and electrons in the emission layer may be suitably maintained, thus improving driving characteristics of the organic light-emitting device. For example, the exciton profile may be improved in the emission layer, thus improving efficiency of the organic light-emitting device.

In some embodiments, a host in the emission layer may include a compound represented by Formula 301:

$$[Ar_{301}]_{xb11}\text{-}[(L_{301})_{xb1}\text{-}R_{301}]_{xb21} \quad \text{Formula 301}$$

wherein, in Formula 301, $Ar_{301}$ may be selected from a substituted or unsubstituted $C_5$-$C_{60}$ carbocyclic group (or a substituted or unsubstituted $C_4$-$C_{30}$ carbocyclic group) and a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer from 0 to 5, $R_{301}$ may be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, and —$P(=O)(Q_{301})(Q_{302})$, and xb21 may be an integer from 1 to 5, wherein $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but the present disclosure is not limited thereto.

In some embodiments, in Formula 301, $Ar_{301}$ may be selected from:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but the present disclosure is not limited thereto.

When xb11 in Formula 301 is 2 or greater, at least two $Ar_{301}$(s) may be bound via a single bond.

In one or more embodiments, the compound represented by Formula 301 may be represented by Formula 301-1 or 301-2:

Formula 301-1

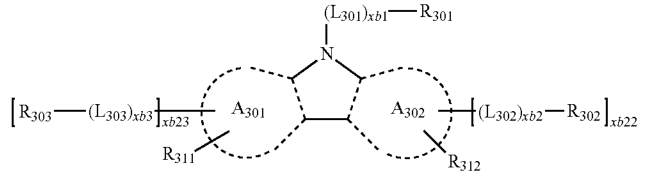

-continued

Formula 301-2

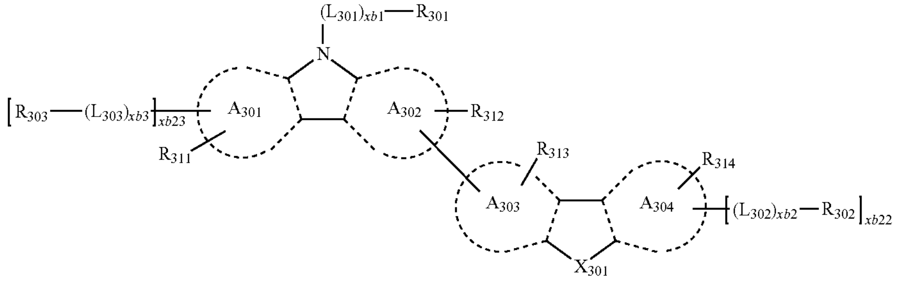

wherein, in Formulae 301-1 to 301-2, $A_{301}$ to $A_{304}$ may each independently be selected from a benzene group, a naphthalene group, a phenanthrene group, a fluoranthene group, a triphenylene group, a pyrene group, a chrysene group, a pyridine group, a pyrimidine group, an indene group, a fluorene group, a spiro-bifluorene group, a benzofluorene group, a dibenzofluorene group, an indole group, a carbazole group, a benzocarbazole group, a dibenzocarbazole group, a furan group, a benzofuran group, a dibenzofuran group, a naphthofuran group, a benzonaphthofuran group, a dinaphthofuran group, a thiophene group, a benzothiophene group, a dibenzothiophene group, a naphthothiophene group, a benzonapthothiophene group, and a dinaphthothiophene group, $X_{301}$ may be O, S, or N-[$(L_{304})_{xb4}$-$R_{304}$], $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), xb22 and xb23 may each independently be 0, 1, or 2, $L_{301}$, xb1, $R_{301}$, and $Q_{31}$ to $Q_{33}$ may respectively be understood by referring to the descriptions of $L_{301}$, xb1, $R_{301}$, and $Q_{31}$ to $Q_{33}$ provided herein, $L_{302}$ to $L_{304}$ may each be understood by referring to the description of $L_{301}$ provided herein, xb2 to xb4 may each be understood by referring to the descriptions of xb1 provided herein, and $R_{302}$ to $R_{304}$ may each be understood by referring to the description of $R_{301}$ provided herein.

In some embodiments, in Formulae 301, 301-1, and 301-2, $L_{301}$ to $L_{304}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, wherein $Q_{31}$ to $Q_{33}$ may respectively be understood by referring to the descriptions of $Q_{31}$ to $Q_{33}$ provided herein.

In some embodiments, in Formulae 301, 301-1, and 301-2, $R_{301}$ to $R_{304}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, wherein $Q_{31}$ to $Q_{33}$ may respectively be understood by referring to the descriptions of $Q_{31}$ to $Q_{33}$ provided herein.

In some embodiments, the host may include an alkaline earth metal complex and/or a zinc (Zn) complex. For example, the host may include a beryllium (Be) complex, e.g., Compound H55, a magnesium (Mg) complex, and/or a zinc (Zn) complex.

In some embodiments, the host may include at least one selected from 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'- bis(N-carbazolyl)-1,1'-biphenyl (CBP), 1,3-di-9-carbazolylbenzene (mCP), 1,3,5-tri(carbazol-9-yl)benzene (TCP), and Compounds H1 to H55, but the present disclosure is not limited thereto:
H1
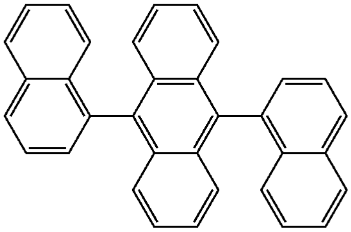
H2
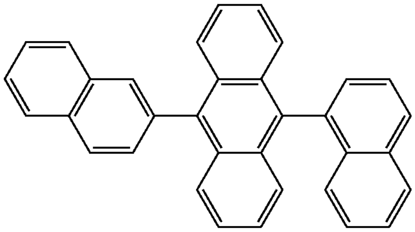
H3
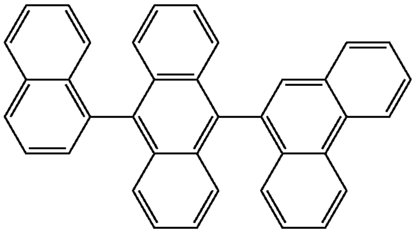
H4
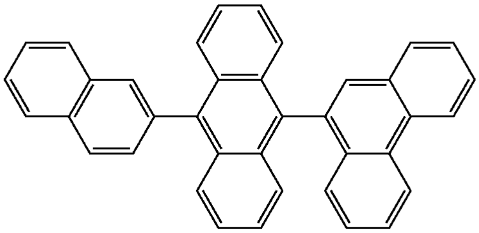
H5
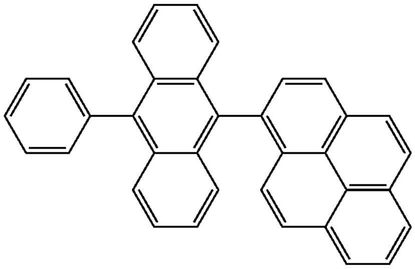
H6
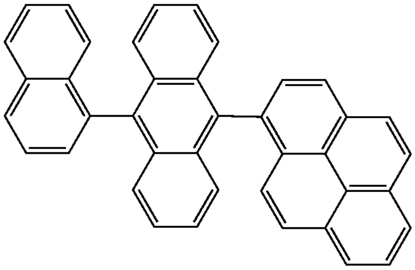
-continued
H7
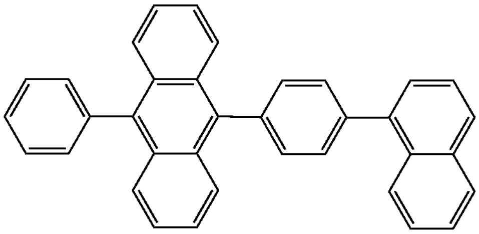
H8
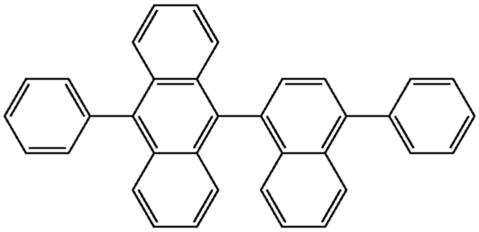
H9
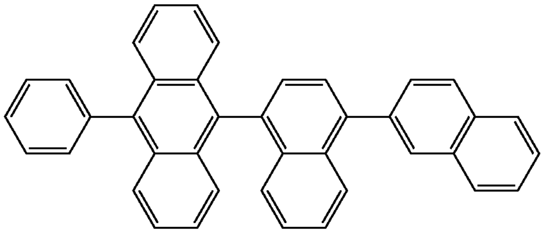
H10
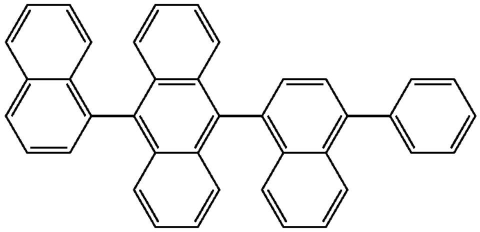
H11
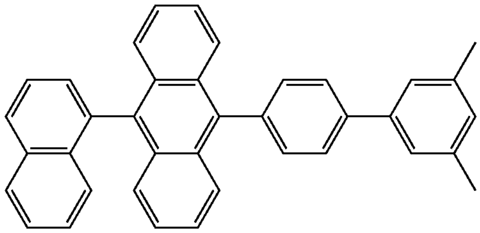
H12
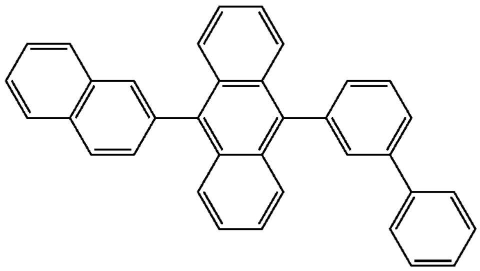

-continued
H13
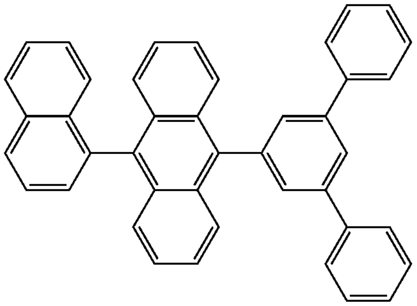
H14
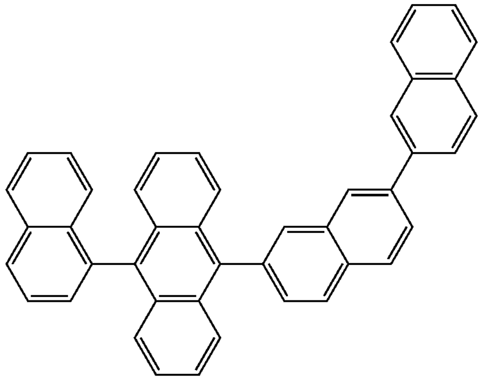
H15
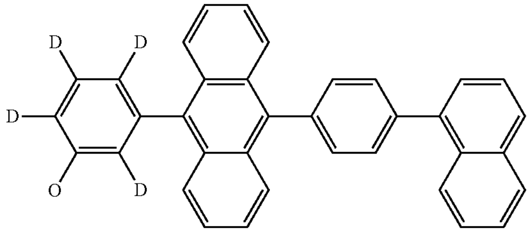
H16
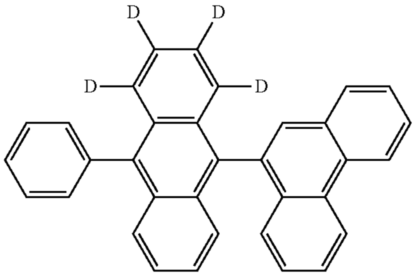
H17
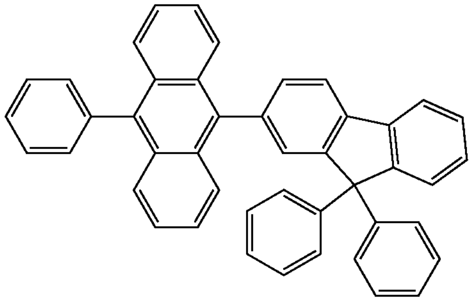
-continued
H18
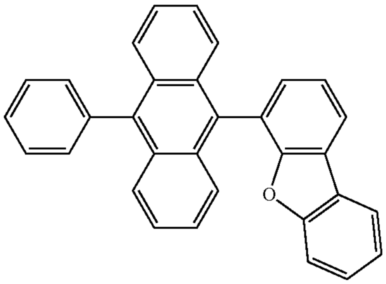
H19
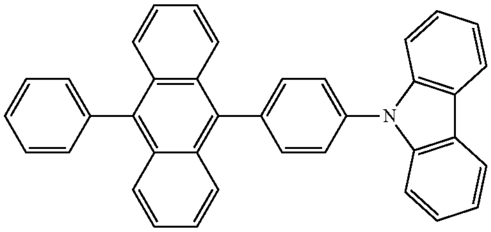
H20
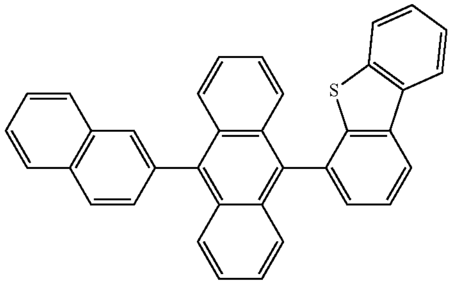
H21
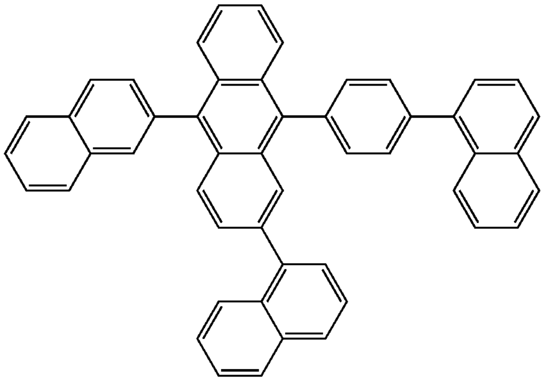
H22
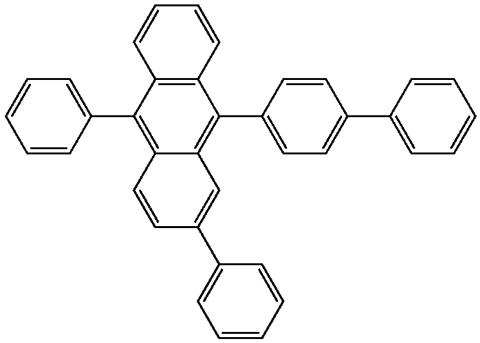

-continued
H23
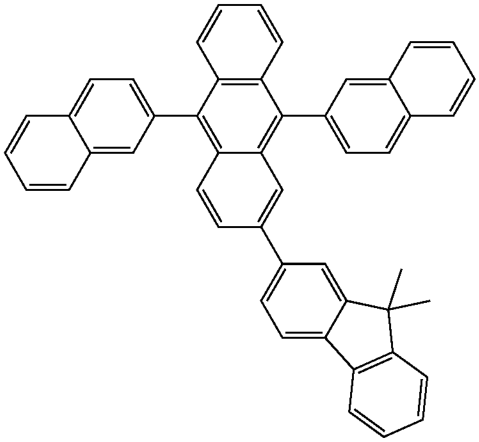
H24
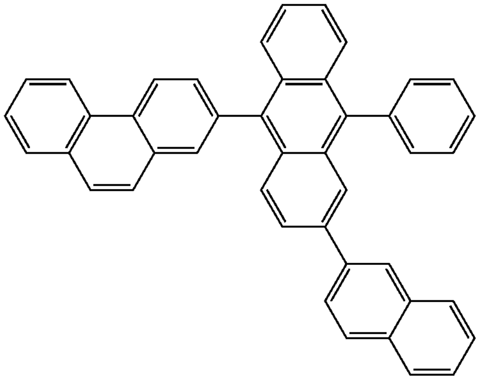
H25
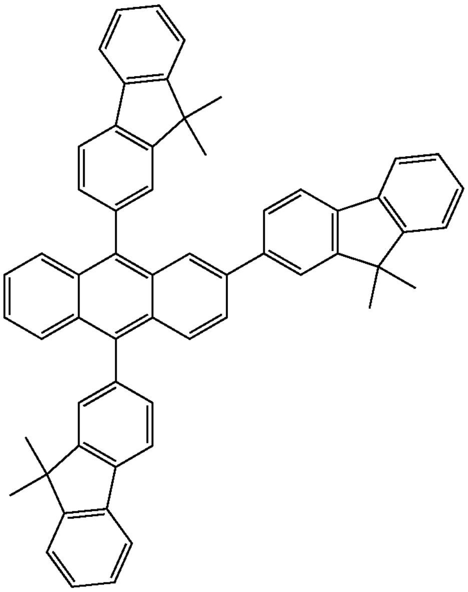
-continued
H26
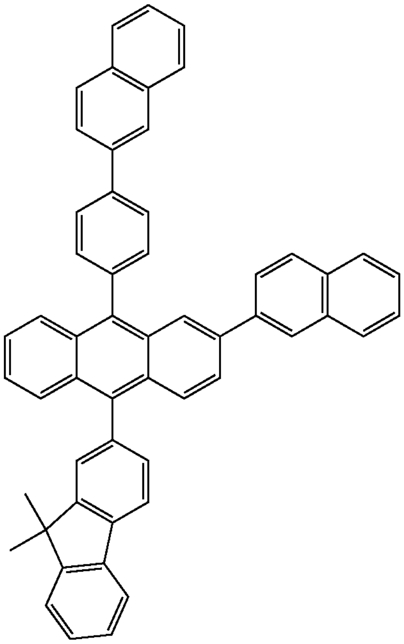
H27
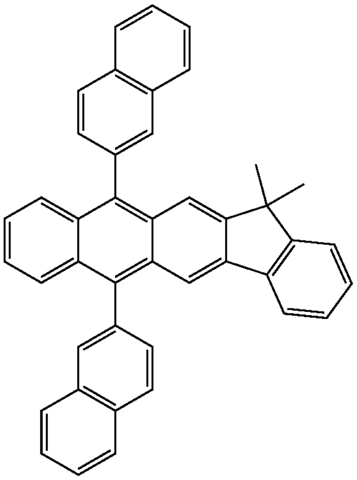
H28
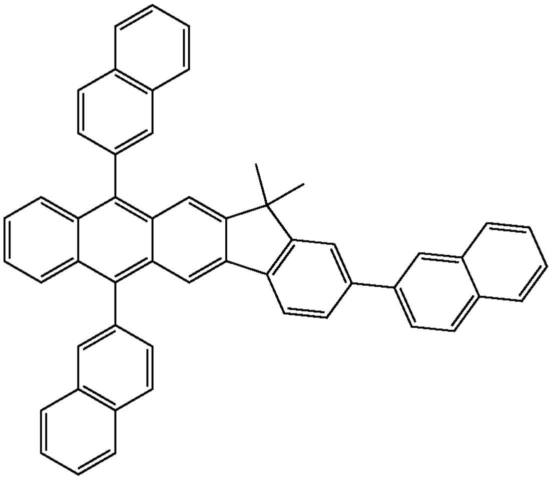

H29
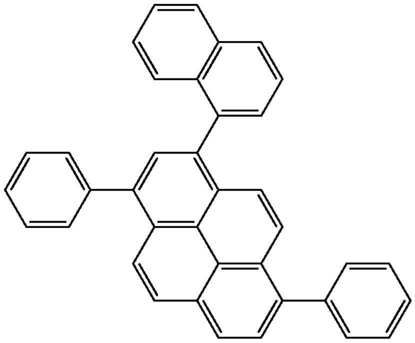
H30
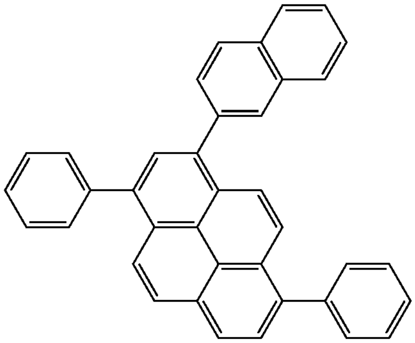
H31
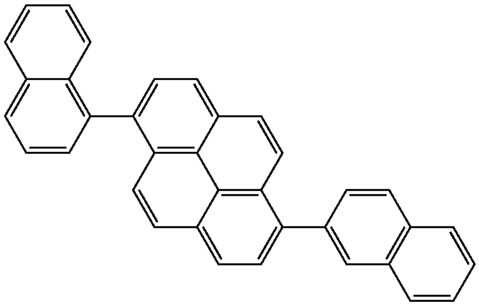
H32
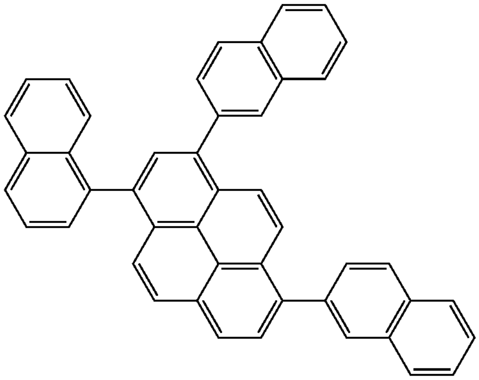
H33
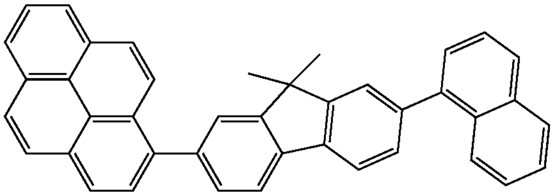
H34
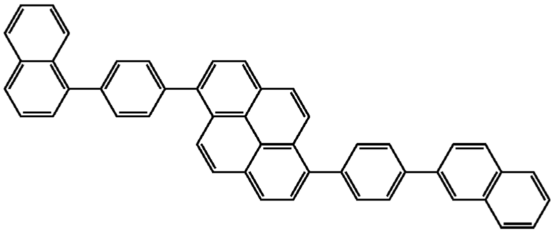
H35
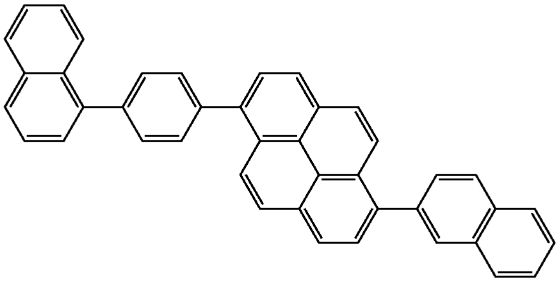
H36
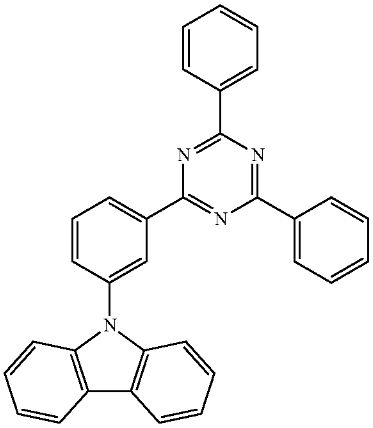
H37
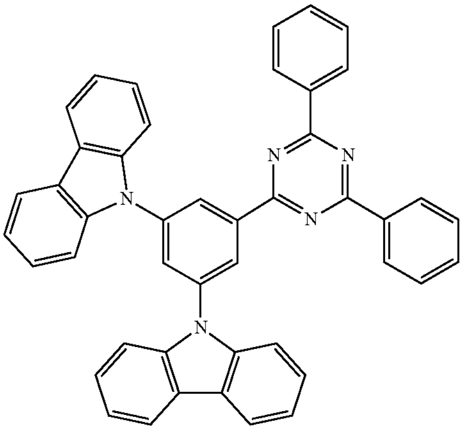
H38
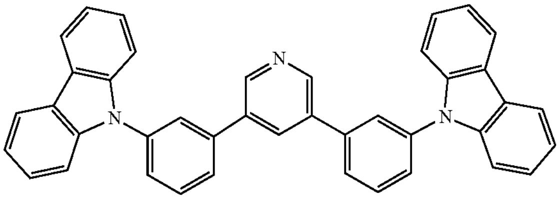

-continued
H39
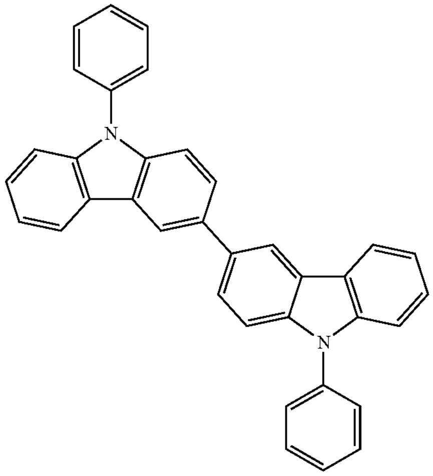
H40
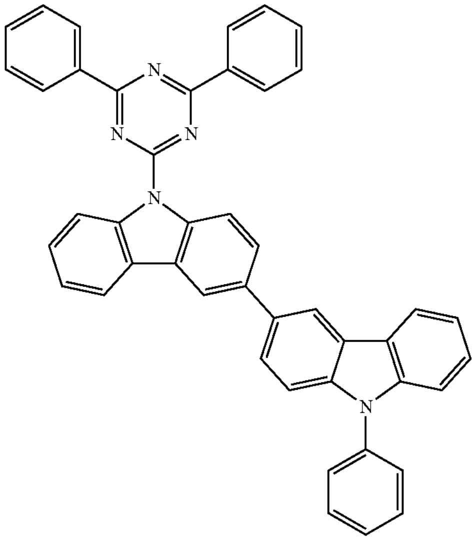
H41
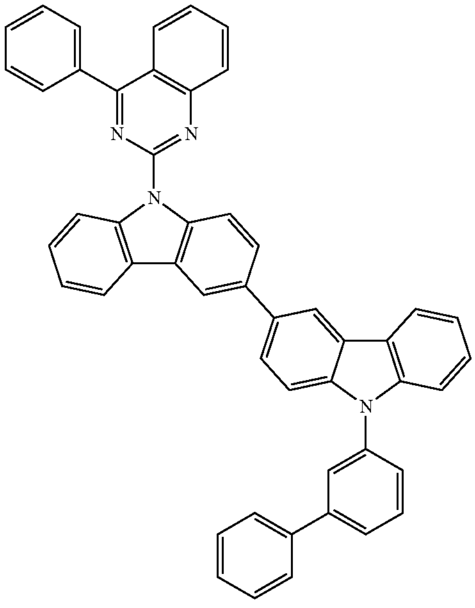
-continued
H42
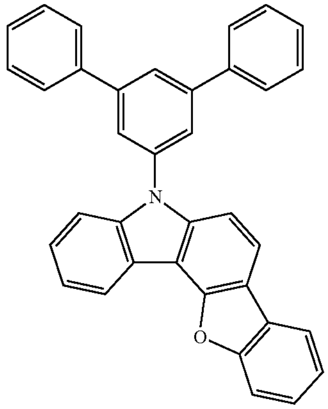
H43
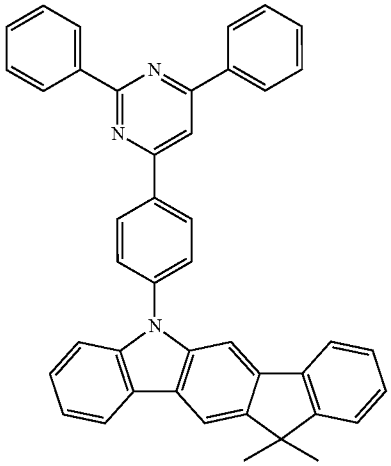
H44
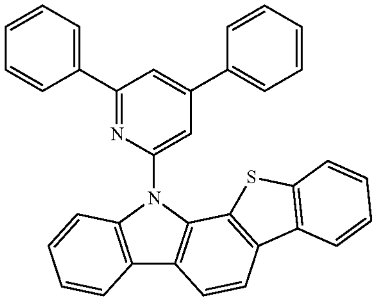
H45
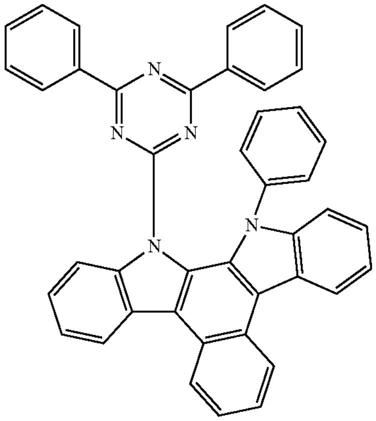

-continued
H46
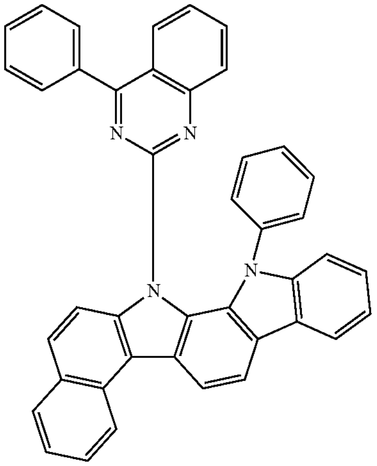
H47
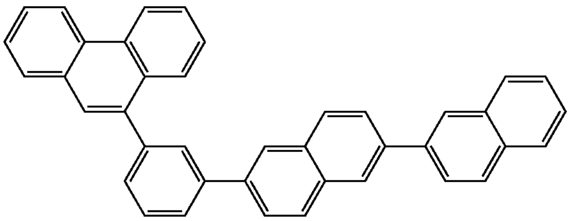
H48
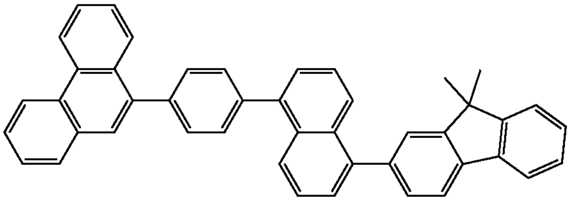
H49
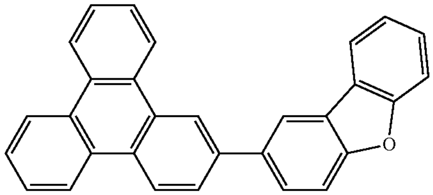
H50
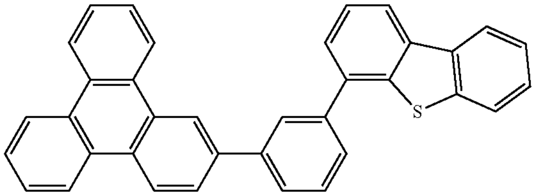
H51
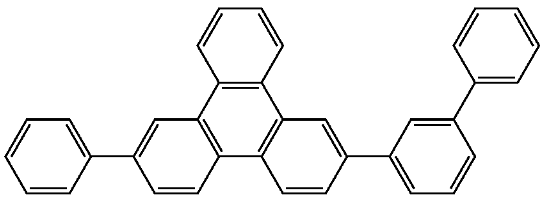
-continued
H52
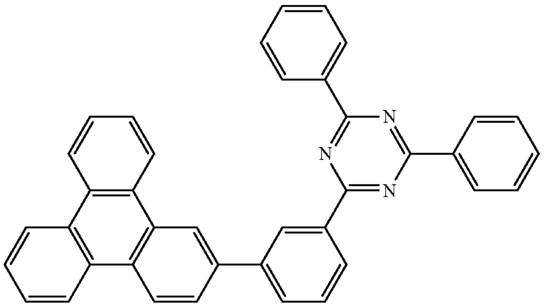
H53
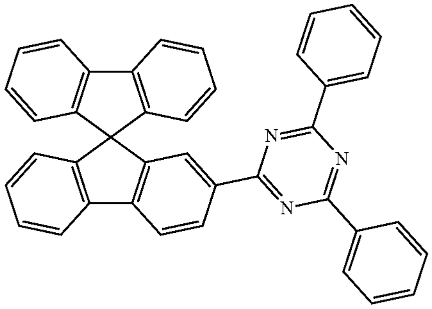
H54
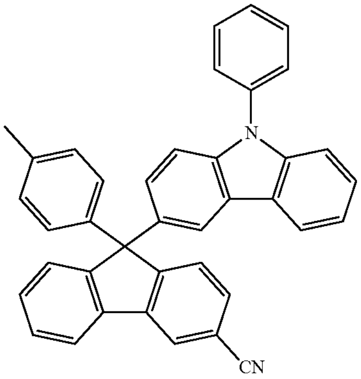
H55
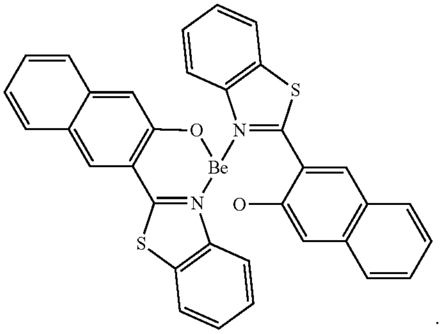
Third Compound and Fourth Compound
According to one or more embodiments, the third compound and the fourth compound may each independently be an organometallic compound represented by Formula 1:
Formula 1
$$M(L_1)_{n1}(L_2)_{n2}$$

-continued

Formula 1A

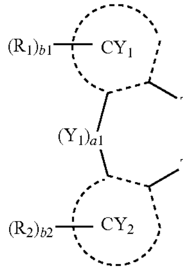

Formula 1B

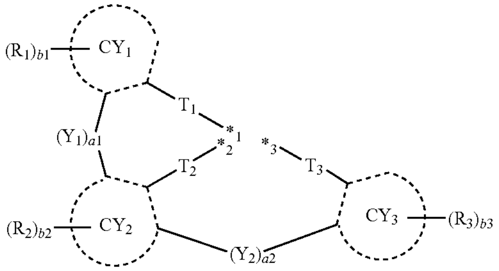

Formula 1C

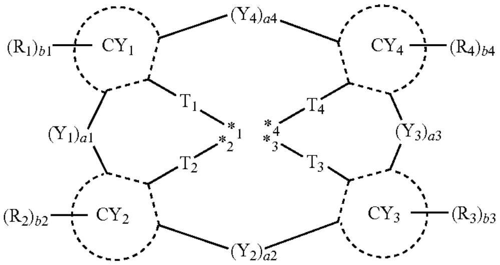

wherein, in Formulae 1 and 1A to 1C,

M may be selected from a first-row transition metal, a second-row transition metal, and a third-row transition metal, wherein M in the third compound may be platinum (Pt), $L_1$ may be selected from represented by a ligand represented by Formula 1A, a ligand represented by Formula 1B, and a ligand represented by Formula 1C, $L_2$ may be selected from a monodentate ligand, a bidentate ligand, and a tridentate ligand, n1 may be selected from 1, 2, and 3, n2 may be selected from 0, 1, 2, 3, and 4, $CY_1$ to $CY_4$ may each independently be selected from a $C_5$-$C_{30}$ carbocyclic group (or a substituted or unsubstituted $C_4$-$C_{30}$ carbocyclic group) and a $C_1$-$C_{30}$ heterocyclic group, $Y_1$ to $Y_4$ may each independently be selected from a single bond, a double bond, a substituted or unsubstituted $C_6$-$C_{60}$ arylene group, a substituted or unsubstituted $C_1$-$C_{30}$ heteroarylene group, *—O—*', *—S—*', *—C(=O)—*', *—S(=O)—*', *—C($R_5$)($R_6$)—*', *—C($R_5$)=C($R_6$)—*', *—C($R_5$)=*', *—Si($R_5$)($R_6$)—*', *—B($R_5$)—*', *—N($R_5$)—*', and *—P($R_5$)—*', a1 to a3 may each independently be selected from 1, 2, and 3, a4 may be selected from 0, 1, 2, and 3, and when a4 is 0, $CY_2$ and $CY_4$ may not be connected to each other, $T_1$ to $T_4$ may each independently be selected from a chemical bond (e.g., a single bond), *—O—*', *—S—*', *—B($R_7$)—*', *—N($R_7$)—*', *—P($R_7$)—*', *—C($R_7$)($R_8$)—*', *—Si($R_7$)($R_8$)—*', *—Ge($R_7$)($R_8$)—*', *—C(=O)—*', and *—C(=S)—*', $*_1$, $*_2$, $*_3$, and $*_4$ may each be a binding site to M, $R_1$ to $R_8$ may each independently be selected from hydrogen, deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), wherein adjacent groups from among $R_1$ to $R_8$ may optionally be bound to form a substituted or unsubstituted $C_5$-$C_{60}$ carbocyclic group (or a substituted or unsubstituted $C_4$-$C_{30}$ carbocyclic group) or a substituted or unsubstituted $C_1$-$C_{60}$ heterocyclic group, adjacent groups from among $R_1$ to $R_8$ and $Y_1$ to $Y_4$ may optionally be bound to form a substituted or unsubstituted $C_5$-$C_{60}$ carbocyclic group (or a substituted or unsubstituted $C_4$-$C_{30}$ carbocyclic group) or a substituted or unsubstituted $C_1$-$C_{60}$ heterocyclic group, b1 to b4 may each independently be an integer from 0 to 10, and at least one substituent of the substituted $C_6$-$C_{60}$ arylene group, the substituted $C_1$-$C_{30}$ heteroarylene group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, the substituted monovalent non-aromatic condensed heteropolycyclic group, the substituted $C_5$-$C_{60}$ carbocyclic group (or the substituted $C_4$-$C_{30}$ carbocyclic group), and the substituted $C_1$-$C_{60}$ heterocyclic group may be selected from the aforementioned substituents.

In some embodiments, M in Formula 1 may be selected from iridium (Ir), platinum (Pt), osmium (Os), ruthenium (Ru), rhodium (Rh), palladium (Pd), copper (Cu), silver (Ag), gold (Au), titanium (Ti), zirconium (Zr), hafnium (Hf), europium (Eu), terbium (Tb), and thulium (Tm), but the present disclosure is not limited thereto.

In some embodiments, the fourth compound may be a compound where M is Ir or Pt, but the present disclosure is not limited thereto.

According to one or more embodiments, in Formulae 1A to 1C, $CY_1$ to $CY_4$ may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a carbene moiety-containing group, a thiophene group, a furan group, a selenophene group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

According to one or more embodiments, at least one selected from $CY_1$ and $CY_2$ in Formula 1A, at least one selected from $CY_1$ to $CY_3$ in Formula 1B, and at least one selected from $CY_1$ to $CY_4$ in Formula 1C may be a carbene moiety-containing group.

According to one or more embodiments, in Formulae 1A to 1C, $Y_1$ to $Y_4$ may each independently be selected from a single bond, a double bond, *—O—*', *—S—*', *—C($R_5$)($R_6$)—*', and *—N($R_5$)—*'.

In some embodiments, in Formulae 1A to 1C, $R_1$ to $R_8$ may each independently be selected from:

hydrogen, deuterium, —F, —Cl, —Br, —I, a hydroxyl group, a cyano group, a nitro group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a cyano group, a phenyl group, and a biphenyl group;

a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, —Si($Q_1$)($Q_2$)($Q_3$), —N($Q_1$)($Q_2$), and —B($Q_1$)($Q_2$); and a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, and an azadibenzosilolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, a biphenyl group, and a terphenyl group, wherein $Q_1$ to $Q_3$ may each independently be selected from hydrogen, deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, and a tetraphenyl group.

According to one or more embodiments, at least one selected from $R_1$ to $R_2$ in Formula 1A, at least one selected from $R_1$ to $R_3$ in Formula 1B, and at least one selected from $R_1$ to $R_4$ in Formula 1C may each be an electron-donating group.

In some embodiments, the electron-donating group may be a substituent selected from an iso-propyl group, a tert-butyl group, and groups represented by Formulae 10-1 to 10-61:

10-1

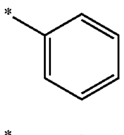

10-2

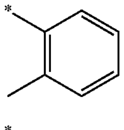

10-3

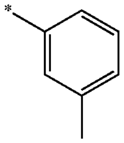

-continued 10-4

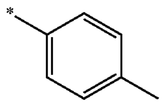

10-5

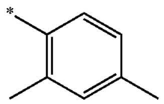

10-6

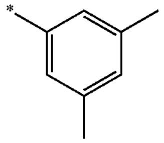

10-7

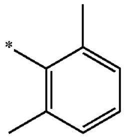

10-8

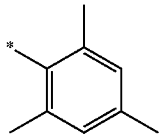

10-9

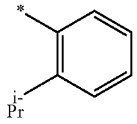

10-10

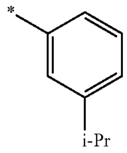

10-11

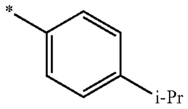

10-12

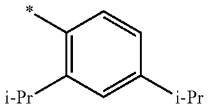

10-13

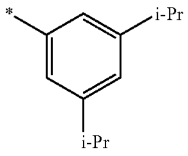

10-14

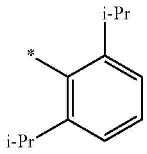

-continued
10-15
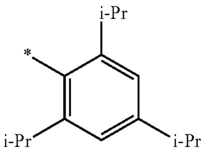
10-16
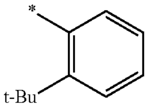
10-17
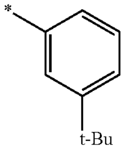
10-18
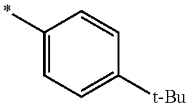
10-19
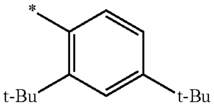
10-20
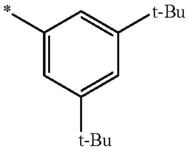
10-21
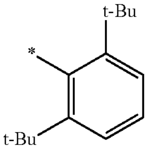
10-22
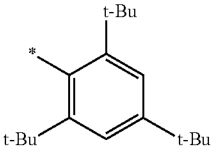
10-23
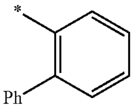
10-24
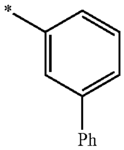
10-25
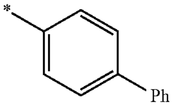
-continued
10-26
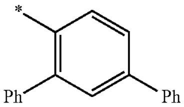
10-27
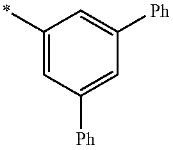
10-28
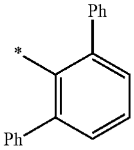
10-29
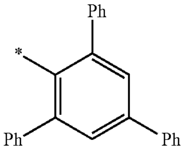
10-30
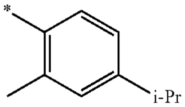
10-31
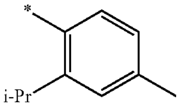
10-32
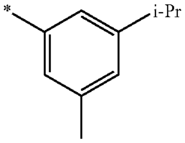
10-33
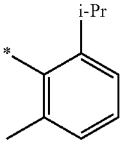
10-34
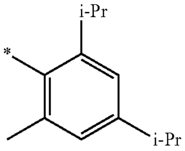
10-35
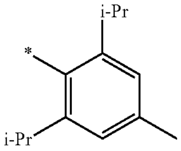

-continued
10-36
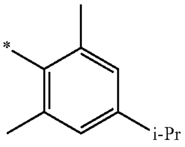
10-37
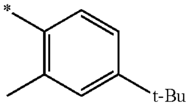
10-38
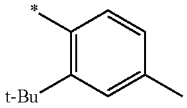
10-39
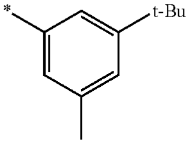
10-40
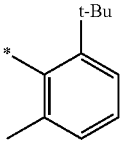
10-41
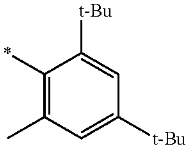
10-42
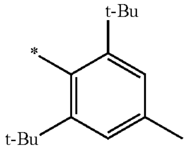
10-43
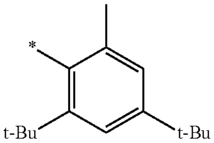
10-44
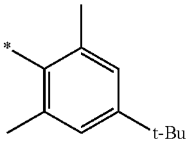
10-45
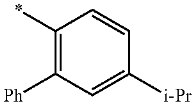
10-46
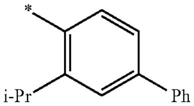
-continued
10-47
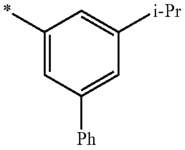
10-48
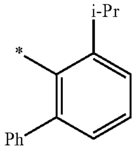
10-49
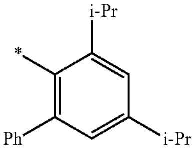
10-50
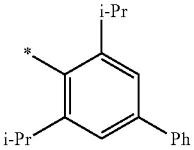
10-51
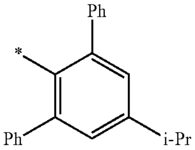
10-52
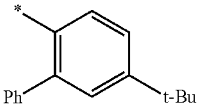
10-53
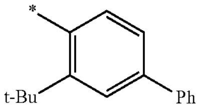
10-54
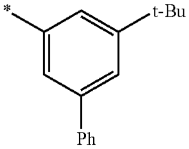
10-55
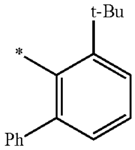
10-56
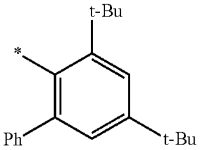

-continued 10-57

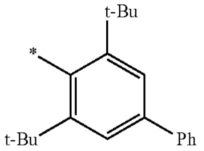

10-58

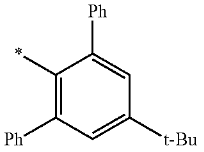

10-59

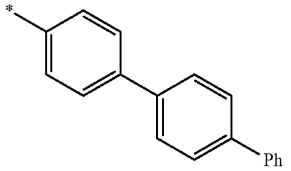

10-60

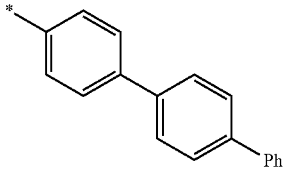

10-61

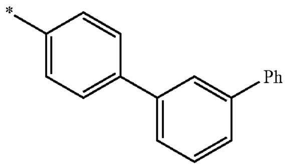

wherein, in Formulae 10-1 to 10-61,

"i-Pr" represents an iso-propyl group, "t-Bu" represents a t-butyl group,

"Ph" represents a phenyl group, and

* indicates a binding site to an adjacent atom.

In some embodiments, i) at least one selected from $R_1$ to $R_2$ in Formula 1A may be a substituent other than hydrogen, and/or $Y_1$ may be *—N($R_5$)—*', and $R_5$ may be a substituted $C_6$-$C_{60}$ aryl group, ii) at least one selected from $R_1$ to $R_3$ in Formula 1B may be a substituent other than hydrogen, and/or at least one selected from $Y_1$ and $Y_2$ may be *—N($R_5$)—*', and $R_5$ may be a substituted $C_6$-$C_{60}$ aryl group, and iii) at least one selected from $R_1$ to $R_4$ in Formula 1C may be a substituent other than hydrogen, and/or at least one selected from $Y_1$ to $Y_4$ may be *—N($R_5$)—*', and $R_5$ may be a substituted $C_6$-$C_{60}$ aryl group.

According to one or more embodiments, the third compound and the fourth compound may each independently be selected from compounds represented by Formulae 1-1 and 1-2:

Formula 1-1

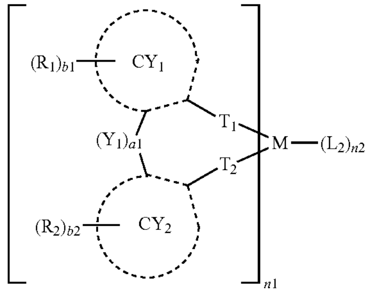

Formula 1-2

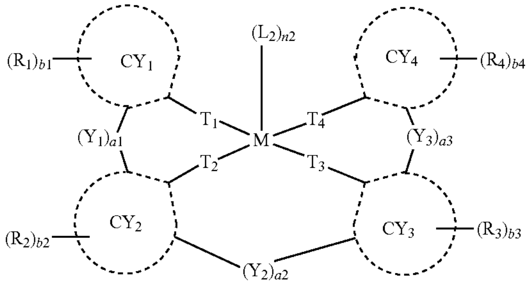

wherein, in Formulae 1-1 and 1-2,

M, $L_2$, n1, n2, $CY_1$ to $CY_4$, $Y_1$ to $Y_3$, a1 to a3, $T_1$ to $T_4$, $R_1$ to $R_4$, and b1 to b4 may respectively be understood by referring to the descriptions of M, $L_2$, n1, n2, $CY_1$ to $CY_4$, $Y_1$ to $Y_3$, a1 to a3, $T_1$ to $T_4$, $R_1$ to $R_4$, and b1 to b4 provided herein.

According to one or more embodiments, at least one selected from $CY_1$ and $CY_2$ in Formula 1-1 and at least one selected from $CY_1$ to $CY_4$ in Formula 1-2 may each be a carbene moiety-containing group.

In some embodiments, at least one selected from $CY_1$ and $CY_4$ in Formula 1-2 may be a carbene moiety-containing group.

In some embodiments, the third compound may be a compound represented by Formula 2-1, and the fourth compound may be a compound represented by Formula 2-2:

Formula 2-1

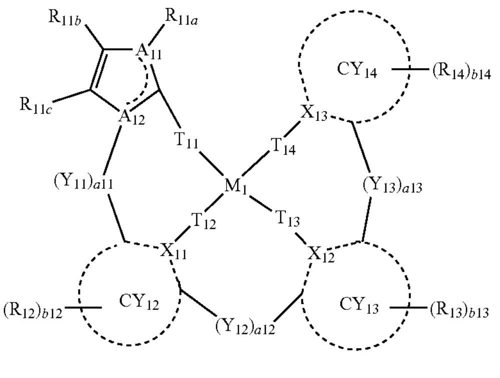

-continued

Formula 2-2

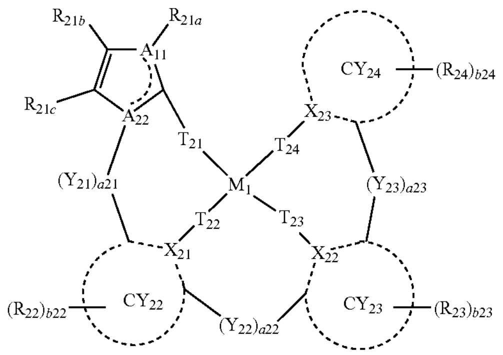

wherein, in Formulae 2-1 and 2-2, $M_1$ may be Pt, $M_2$ may be selected from a first-row transition metal, a second-row transition metal, and a third-row transition metal, $CY_{12}$ to $CY_{14}$ and $CY_{22}$ to $CY_{24}$ may each independently be selected from a $C_5$-$C_{30}$ carbocyclic group (or a $C_4$-$C_{30}$ carbocyclic group) and a $C_1$-$C_{30}$ heterocyclic group, $A_{11}$, $A_{12}$, $A_{21}$, and $A_{22}$ may each independently be N or P, $X_{11}$ to $X_{13}$ and $X_{21}$ to $X_{23}$ may each independently be N or C, $Y_{11}$ to $Y_{13}$ may each independently be selected from a single bond, a double bond, a substituted or unsubstituted $C_6$-$C_{60}$ arylene group, a substituted or unsubstituted $C_1$-$C_{30}$ heteroarylene group, *—O—*', *—S—*', *—C(=O)—*', *—S(=O)—*', *—C($R_{15}$)($R_{16}$)—*', *—C($R_{15}$)=C($R_{16}$)—*', *—C($R_{15}$)=*', *—Si($R_{15}$)($R_{16}$)—*', *—B($R_{15}$)—*', *—N($R_{15}$)—*', and *—P($R_{15}$)—*', $Y_{21}$ to $Y_{23}$ may each independently be selected from a single bond, a double bond, a substituted or unsubstituted $C_6$-$C_{60}$ arylene group, a substituted or unsubstituted $C_1$-$C_{30}$ heteroarylene group, *—O—*', *—S—*', *—C(=O)—*', *—S(=O)—*', *—C($R_{25}$)($R_{26}$)—*', *—C($R_{25}$)=C($R_{26}$)—*', *—C($R_{25}$)=*', *—Si($R_{25}$)($R_{26}$)—*', *—B($R_{25}$)—*', *—N($R_{25}$)—*', and *—P($R_{25}$)—*', a11 to a13 may each independently be selected from 1, 2, and 3, a21 to a23 may each independently be selected from 1, 2, and 3, $T_{11}$ to $T_{14}$ may each independently be selected from a chemical bond (e.g., a single bond), *—O—*', *—S—*', *—B($R_{17}$)—*', *—N($R_{17}$)—*', *—P($R_{17}$)—*', *—C($R_{17}$)($R_{18}$)—*', *—Si($R_{17}$)($R_{18}$)—*', *—Ge($R_{17}$)($R_{18}$)—*', *—C(=O)—*', and *—C(=S)—*', $T_{21}$ to $T_{24}$ may each independently be selected from a chemical bond (e.g., a single bond), *—O—*', *—S—*', *—B($R_{27}$)—*', *—N($R_{27}$)—*', *—P($R_{27}$)—*', *—C($R_{27}$)($R_{28}$)—*', *—Si($R_{27}$)($R_{28}$)—*', *—Ge($R_{27}$)($R_{28}$)—*', *—C(=O)—*', and *—C(=S)—*', $R_{11a}$ to $R_{11c}$, $R_{12}$ to $R_{18}$, $R_{21a}$ to $R_{21c}$, and $R_{22}$ to $R_{28}$ may each independently be selected from hydrogen, deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), wherein adjacent groups from among $R_{11a}$ to $R_{11c}$ and $R_{12}$ to $R_{18}$ may optionally be bound to form a substituted or unsubstituted $C_5$-$C_{60}$ carbocyclic group (or a substituted or unsubstituted $C_4$-$C_{30}$ carbocyclic group) or a substituted or unsubstituted $C_1$-$C_{60}$ heterocyclic group, and adjacent groups from among $R_{21a}$ to $R_{21c}$ and $R_{22}$ to $R_{28}$ may optionally be bound from a substituted or unsubstituted $C_5$-$C_{60}$ carbocyclic group (or a substituted or unsubstituted $C_4$-$C_{30}$ carbocyclic group) or a substituted or unsubstituted $C_1$-$C_{60}$ heterocyclic group, and b12 to b14 and b22 to b24 may each independently be an integer from 0 to 10.

According to one or more embodiments, $R_{11b}$ and $R_{11c}$ in Formula 2-1 and/or $R_{21b}$ and $R_{21c}$ in Formula 2-2 may be bound to each other to form a benzene ring, a naphthalene ring, a pyridine ring, a pyrimidine ring, and a pyrazine ring, each unsubstituted or substituted with at least one $R_a$, and $R_a$ may be understood by referring to the description of $R_{11a}$ provided herein.

According to one or more embodiments, at least one selected from $R_{11a}$ to $R_{11c}$ and $R_{14}$ in Formula 2-1 may be an electron-donating group.

In some embodiments, at least one selected from $R_{11a}$ and $R_{14}$ in Formula 2-1 may be an electron-donating group. According to one or more embodiments, at least one selected from $R_{11a}$ and $R_{14}$ in Formula 2-1 may be an electron-donating group selected from an iso-propyl group, a tert-butyl group, and groups represented by Formulae 10-1 to 10-61:

10-1

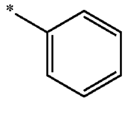

10-2

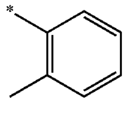

10-3

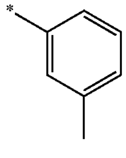

-continued
10-4
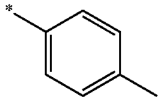
10-5
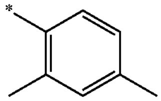
10-6
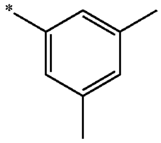
10-7
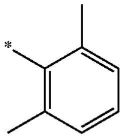
10-8
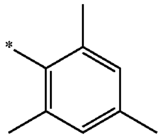
10-9
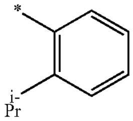
10-10
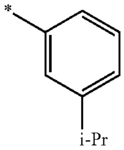
10-11
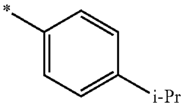
10-12
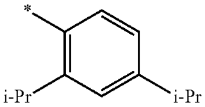
10-13
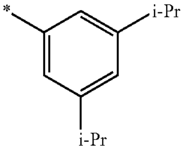
10-14
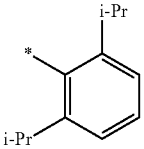
-continued
10-15
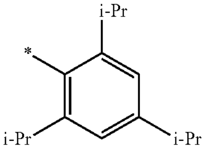
10-16
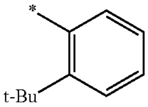
10-17
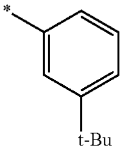
10-18
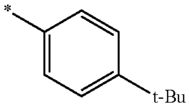
10-19
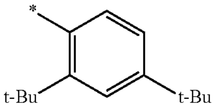
10-20
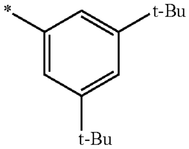
10-21
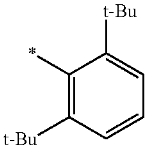
10-22
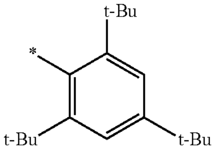
10-23
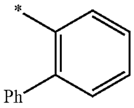
10-24
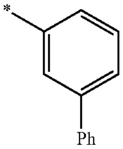
10-25
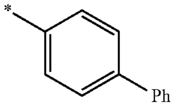

-continued
10-26
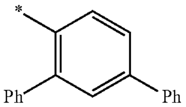
10-27
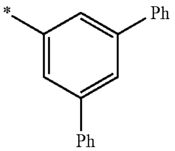
10-28
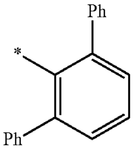
10-29
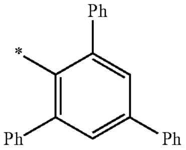
10-30
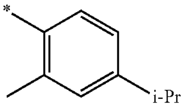
10-31
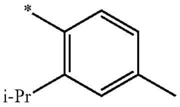
10-32
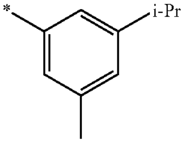
10-33
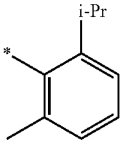
10-34
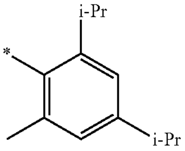
10-35
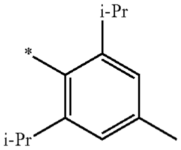
-continued
10-36
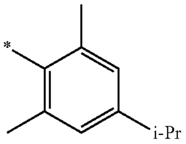
10-37
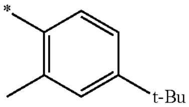
10-38
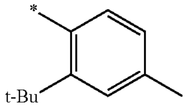
10-39
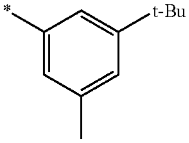
10-40
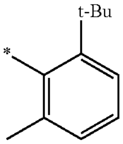
10-41
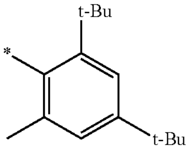
10-42
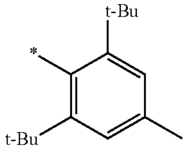
10-43
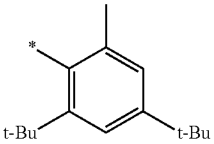
10-44
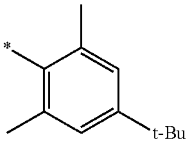
10-45
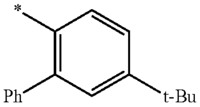
10-46
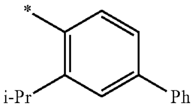

-continued 10-47

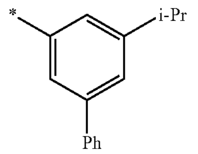

10-48

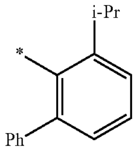

10-49

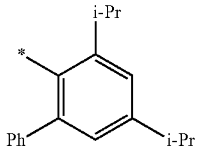

10-50

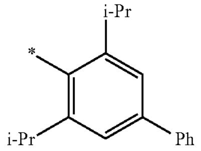

10-51

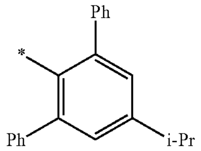

10-52

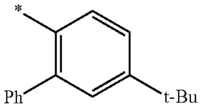

10-53

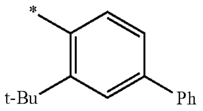

10-54

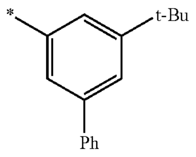

10-55

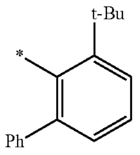

10-56

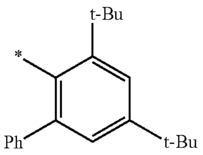

-continued 10-57

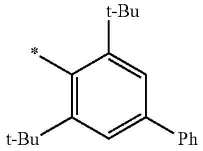

10-58

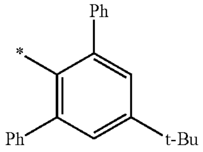

10-59

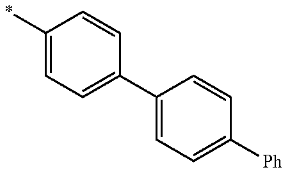

10-60

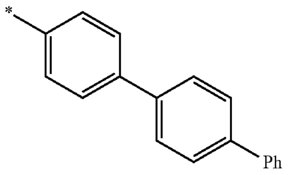

10-61

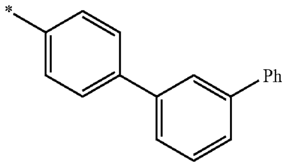

wherein, in Formulae 10-1 to 10-61,

"i-Pr" represents an iso-propyl group, "t-Bu" represents a t-butyl group,

"Ph" represents a phenyl group, and

* indicates a binding site to an adjacent atom.

According to one or more embodiments, at least one selected from $R_{22}$ and $R_{23}$ in Formula 2-2 may be a substituent other than hydrogen, and/or $Y_{23}$ may be *—N($R_{25}$)—*', and $R_{25}$ may be a substituted $C_6$-$C_{60}$ aryl group.

In some embodiments, at least one selected from $R_{22}$ and $R_{23}$ may be selected from a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and/or $Y_{23}$ may be *—N($R_{25}$)—*', and $R_{25}$ may be a substituted $C_6$-$C_{60}$ aryl group.

In some embodiments, at least one selected from $R_{22}$ and $R_{23}$ may be a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one deuterium, and/or $Y_{23}$ may be *—N($R_{25}$)—*', and $R_{25}$ may be a $C_6$-$C_{60}$ aryl group substituted with at least one deuterium.

In some embodiments, at least one selected from $R_{22}$ and $R_{23}$ may be selected from an iso-propyl group, a tert-butyl group, and an electron-donating group selected from groups represented by Formulae 10-1 to 10-61, and/or $Y_{23}$ may be *—N($R_{15}$)—*', and $R_{25}$ may be an iso-propyl group, a tert-butyl group, and an electron-donating group selected from groups represented by Formulae 10-1 to 10-61.

In some embodiments, at least one selected from $R_{11a}$ to $R_{11c}$ and $R_{14}$ in Formula 2-1 may be an electron-donating group, and at least one selected from $R_{22}$ and $R_{23}$ in Formula 2-2 may be a substituent other than hydrogen, and/or $Y_{23}$ may be *—N($R_{25}$)—*', and $R_{25}$ may be a substituted $C_6$-$C_{60}$ aryl group.

In some embodiments, the third compound may be a compound represented by Formula 2-1A or Formula 2-1B:

Formula 2-1A

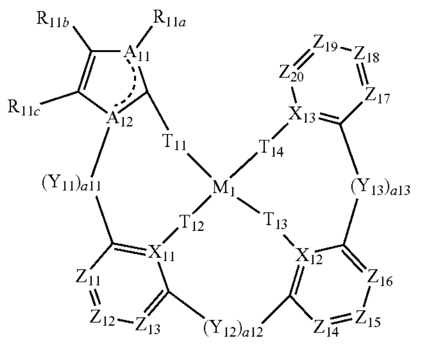

Formula 2-1B

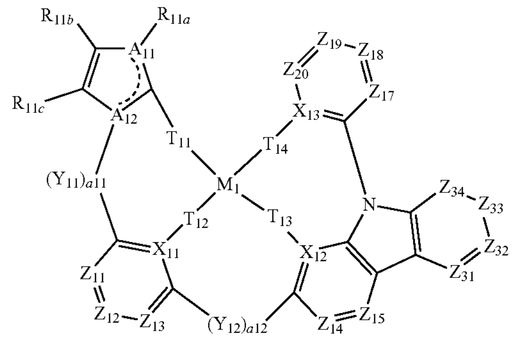

wherein, in Formulae 2-1A and 2-11B, $Z_{11}$ may be C($R_{12a}$) or N, $Z_{12}$ may be C($R_{12b}$) or N, $Z_{13}$ may be C($R_{12c}$) or N, $Z_{14}$ may be C($R_{13a}$) or N, $Z_{15}$ may be C($R_{13b}$) or N, $Z_{16}$ may be C($R_{13c}$) or N, $Z_{17}$ may be C($R_{14a}$) or N, $Z_{18}$ may be C($R_{14b}$) or N, $Z_{19}$ may be C($R_{14c}$) or N, and $Z_{20}$ may be C($R_{14d}$) or N, $Z_{31}$ may be C($R_{15a}$) or N, $Z_{32}$ may be C($R_{15b}$) or N, $Z_{33}$ may be C($R_{15c}$) or N, and $Z_{34}$ may be C($R_{15d}$) or N, $R_{12a}$ to $R_{12c}$ may each be understood by referring to the description of $R_{12}$ provided herein, $R_{13a}$ to $R_{13c}$ may each be understood by referring to the description of $R_{13}$ provided herein, $R_{14a}$ to $R_{14d}$ may each be understood by referring to the description of $R_{14}$ provided herein, $R_{15a}$ to $R_{15d}$ may each be understood by referring to the description of $R_{15}$ provided herein, and $M_1$, $CY_{12}$ to $CY_{14}$, $A_{11}$, $A_{12}$, $X_{11}$ to $X_{13}$, $Y_{11}$ to $Y_{13}$, a11 to a13, $T_{11}$ to $T_{14}$, and $R_{11a}$ to $R_{11c}$ may respectively be understood by referring to the descriptions of $M_1$, $CY_{12}$ to $CY_{14}$, $A_{11}$, $A_{12}$, $X_{11}$ to $X_{13}$, $Y_{11}$ to $Y_{13}$, a11 to a13, $T_{11}$ to $T_{14}$, and $R_{11a}$ to $R_{11c}$ provided herein.

According to one or more embodiments, in Formulae 2-1A and 2-1B, $Z_{18}$ may be C($R_{14b}$), and at least one selected from $R_{11a}$ to $R_{11c}$ and $R_{14b}$ may be an electron-donating group. In some embodiments, in Formulae 2-1A and 2-1B, $Z_{18}$ may be C($R_{14b}$), and at least one selected from $R_{11a}$ and $R_{14b}$ may be an electron-donating group.

According to one or more embodiments, in Formulae 2-1A and 2-11B, $Z_{18}$ may be C($R_{14b}$), and at least one selected from $R_{11a}$ and $R_{14b}$ may be an electron-donating group selected from an iso-propyl group, a tert-butyl group, and groups represented by Formulae 10-1 to 10-61.

According to one or more embodiments, the fourth compound may be a compound represented by Formula 2-2A:

Formula 2-2A

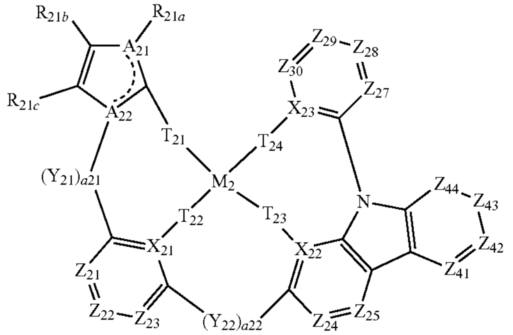

wherein in Formula 2-2A, $Z_{21}$ may be C($R_{22a}$) or N, $Z_{22}$ may be C($R_{22b}$) or N, $Z_{23}$ may be C($R_{22c}$) or N, $Z_{24}$ may be C($R_{23a}$) or N, $Z_{25}$ may be C($R_{23b}$) or N, $Z_{27}$ may be C($R_{24a}$) or N, $Z_{28}$ may be C($R_{24b}$) or N, $Z_{29}$ may be C($R_{24c}$) or N, $Z_{30}$ may be C($R_{24d}$) or N, $Z_{41}$ may be C($R_{25a}$) or N, $Z_{42}$ may be C($R_{25b}$) or N, $Z_{43}$ may be C($R_{25c}$) or N, and $Z_{44}$ may be C($R_{25d}$) or N, $R_{22a}$ to $R_{22c}$ may each be understood by referring to the description of $R_{22}$ provided herein, $R_{23a}$ to $R_{23c}$ may each be understood by referring to the description of $R_{23}$ provided herein, $R_{24a}$ to $R_{24a}$ may each be understood by referring to the description of $R_{24}$ provided herein, $R_{25a}$ to $R_{25a}$ may each be understood by referring to the description of $R_{25}$ provided herein, and $M_2$, $CY_{22}$ to $CY_{24}$, $A_{21}$, $A_{22}$, $X_{21}$ to $X_{23}$, $Y_{21}$ to $Y_{23}$, a21 to a23, $T_{21}$ to $T_{24}$, and $R_{21a}$ to $R_{21c}$ may respectively be understood by referring to the descriptions of $M_2$, $CY_{22}$ to $CY_{24}$, $A_{21}$, $A_{22}$, $X_{21}$ to $X_{23}$, $Y_{21}$ to $Y_{23}$, a21 to a23, $T_{21}$ to $T_{24}$, and $R_{21a}$ to $R_{21c}$ provided herein.

According to one or more embodiments, in Formula 2-2A, $M_2$ may be Pt.

According to one or more embodiments, in Formula 2-2A, $Z_{22}$ may be C($R_{22b}$), $Z_{42}$ may be C($R_{25b}$), and at least one selected from $R_{22b}$ and $R_{25b}$ may be a substituent other than hydrogen. In some embodiments, at least one selected from $R_{22b}$ and $R_{25b}$ may be a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, in Formula 2-2A, $Z_{22}$ may be $C(R_{22b})$, $Z_{42}$ may be $C(R_{25b})$, and at least one selected from $R_{22b}$ and $R_{25b}$ may be a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one deuterium.

In some embodiments, in Formula 2-2A, $Z_{22}$ may be $C(R_{22b})$, $Z_{42}$ may be $C(R_{25b})$, and at least one selected from $R_{22b}$ and $R_{25b}$ may be an electron-donating group selected from an iso-propyl group, a tert-butyl group, and groups represented by Formulae 10-1 to 10-61.

According to one or more embodiments, the third compound may be selected from Compounds BD1, BD2, and Pt-1 to Pt-24, but the present disclosure is not limited thereto:

BD1

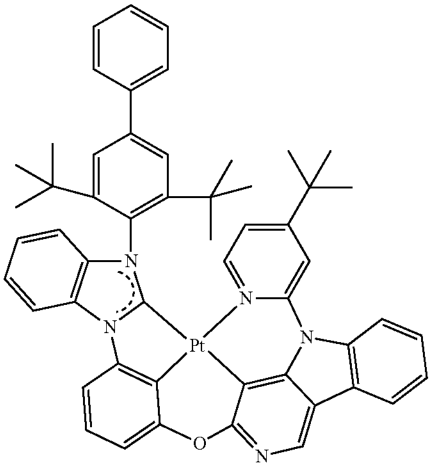

-continued

BD2

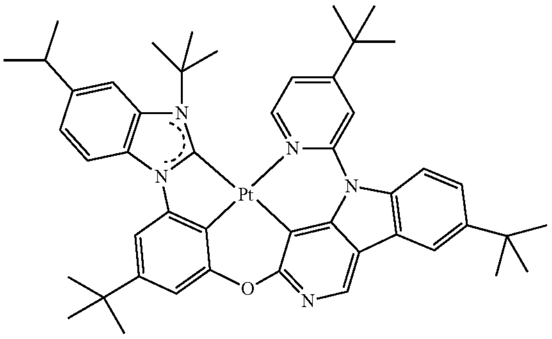

Pt-1

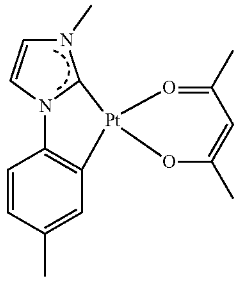

Pt-2

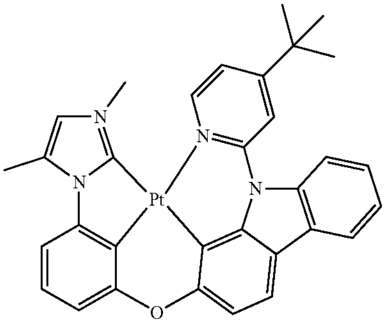

Pt-3

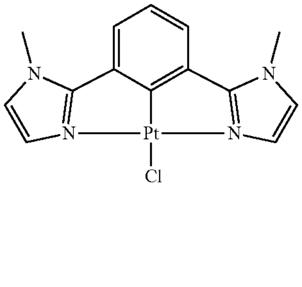

Pt-4

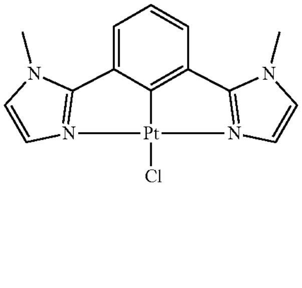

-continued
Pt-5
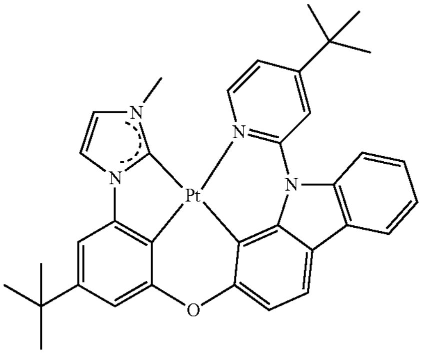
Pt-6
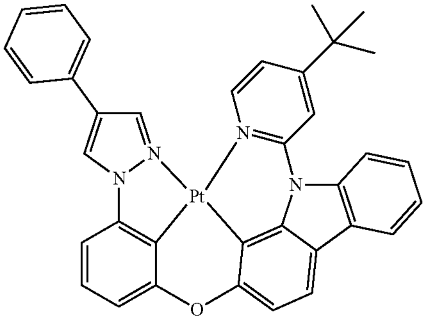
Pt-7
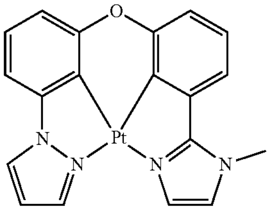
Pt-8
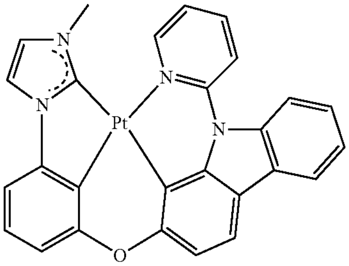
Pt-16
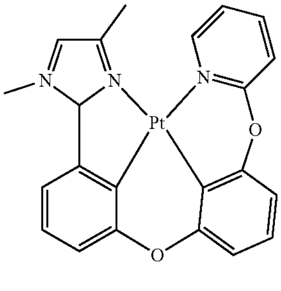
-continued
Pt-17
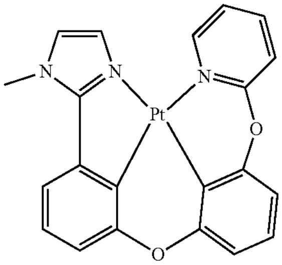
Pt-18
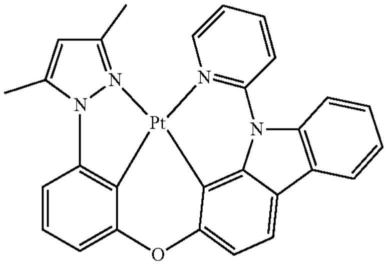
Pt-19
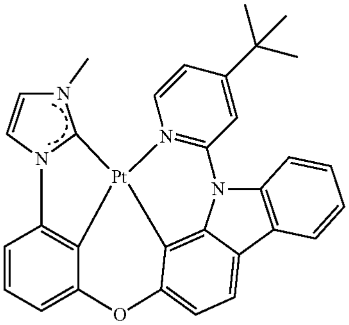
Pt-20
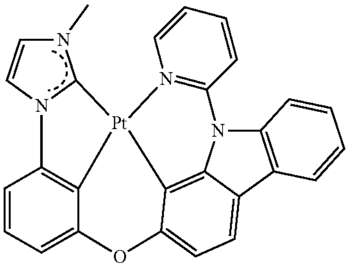
Pt-21
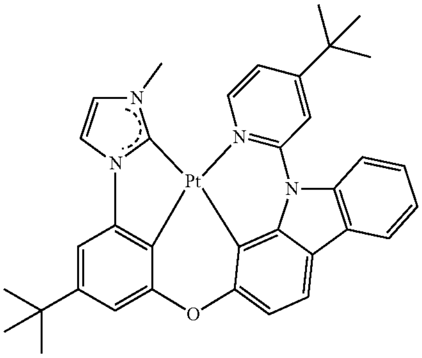

-continued
Pt-22
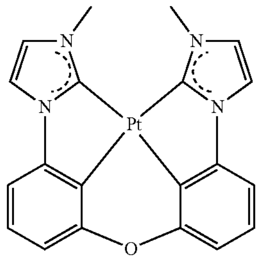
Pt-23
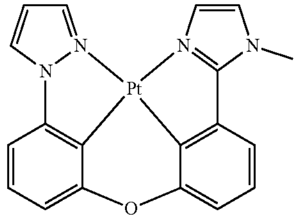
Pt-24
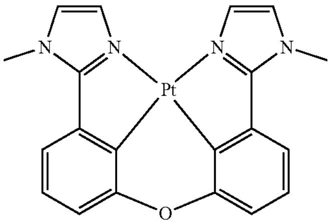
Pt-9
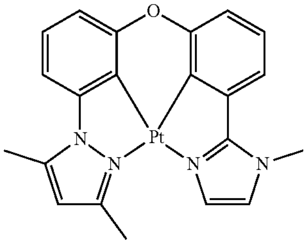
Pt-10
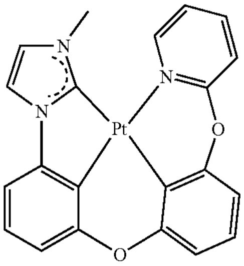
Pt-11
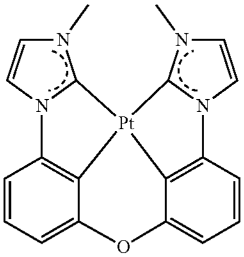
-continued
Pt-12
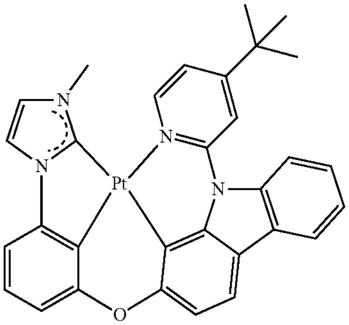
Pt-13
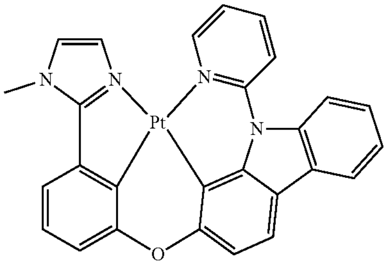
Pt-14
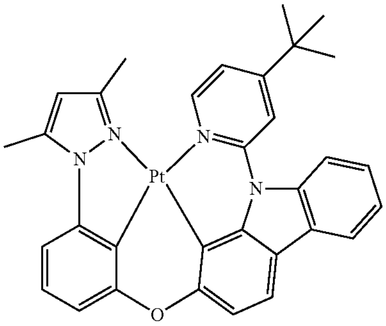
Pt-15
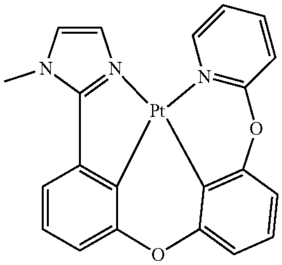
According to one or more embodiments, the fourth compound may be selected from the following compounds, but the present disclosure is not limited thereto:

BD1
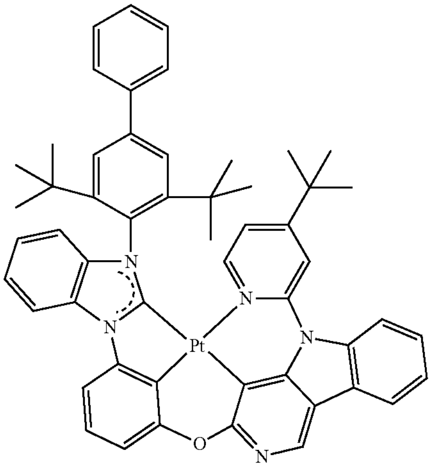
BD2
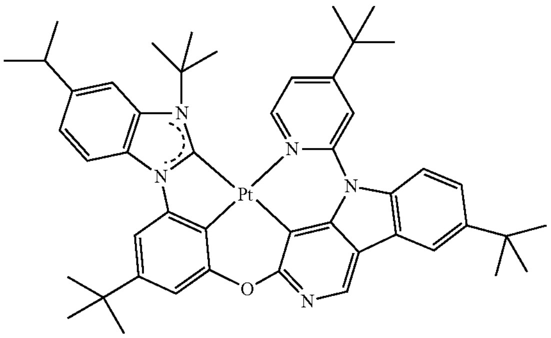
Pt-1
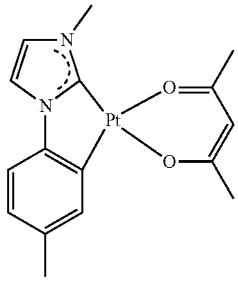
Pt-2
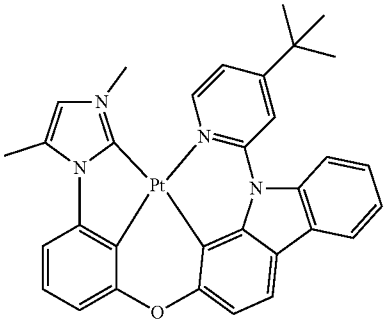
Pt-3
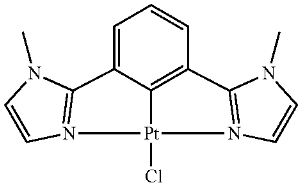
-continued
Pt-4
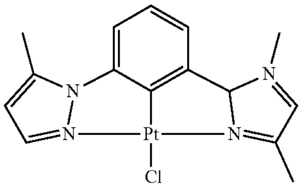
Pt-5
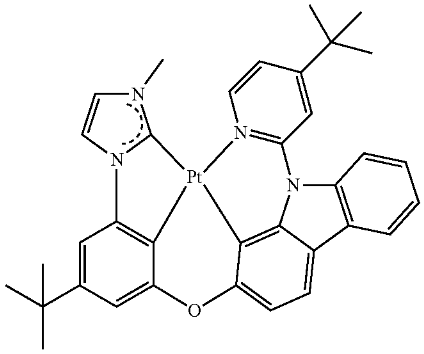
Pt-6
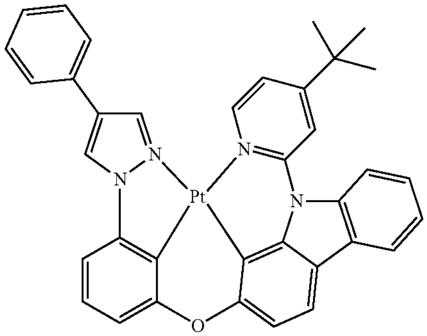
Pt-7
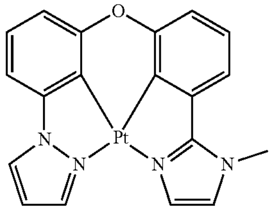
Pt-8
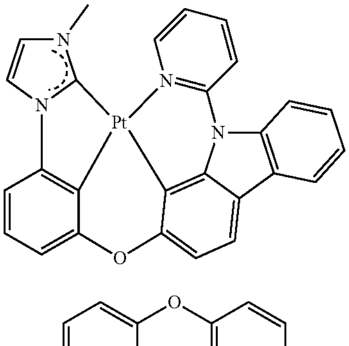
Pt-9
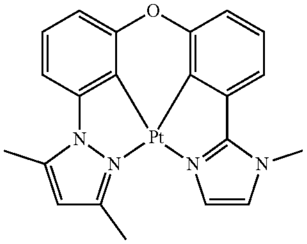

-continued
Pt-10
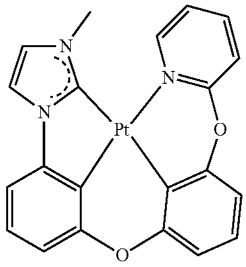
Pt-11
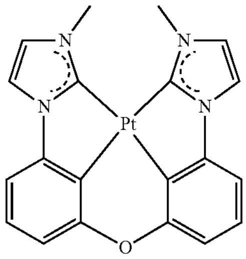
Pt-12
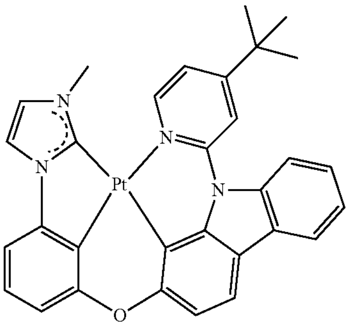
Pt-13
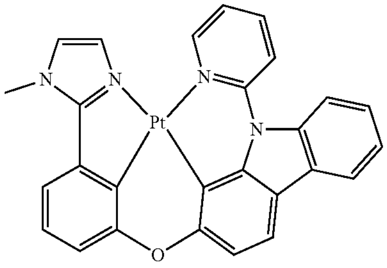
Pt-14
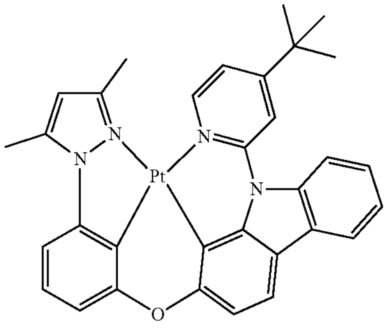
-continued
Pt-15
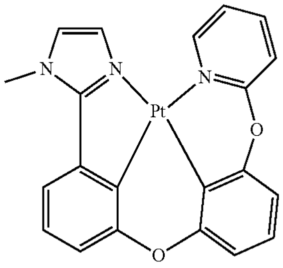
Pt-16
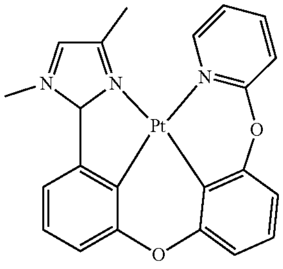
Pt-17
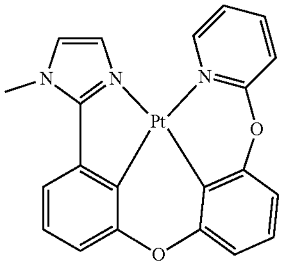
Pt-18
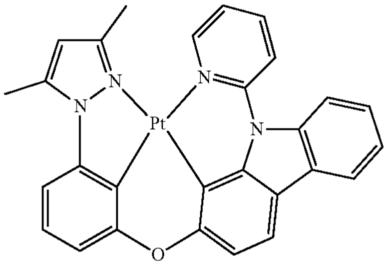
Pt-19
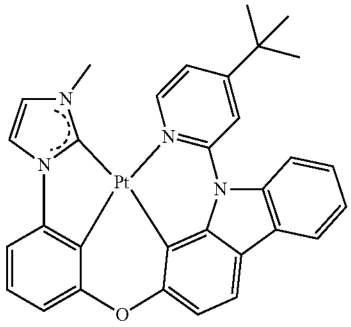

-continued
Pt-20
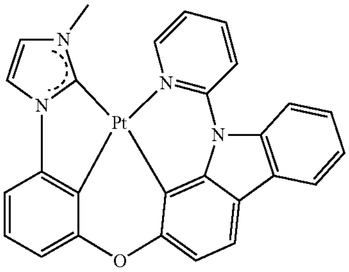
Pt-21
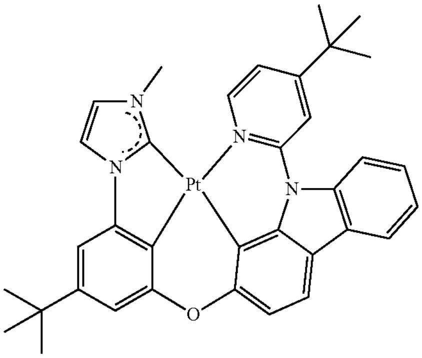
Pt-22
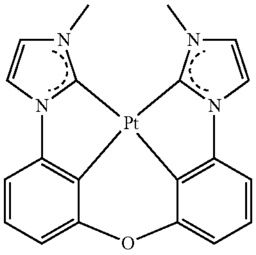
Pt-23
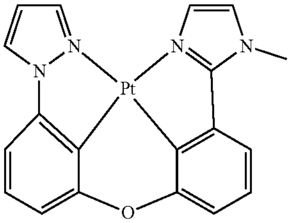
Pt-24
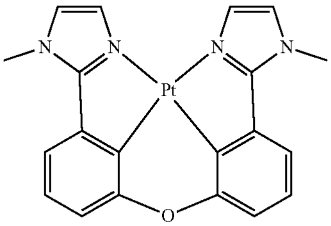
-continued
Ir-1
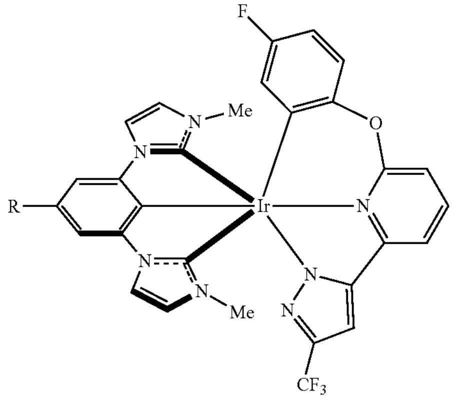
Ir-2
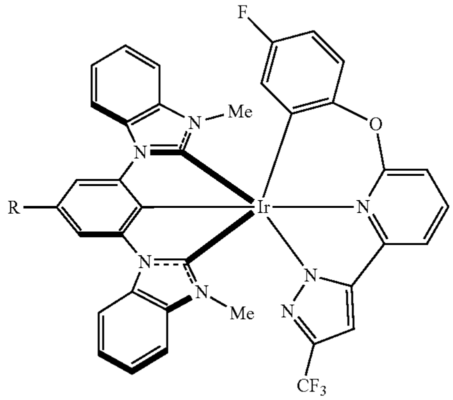
Ir-3
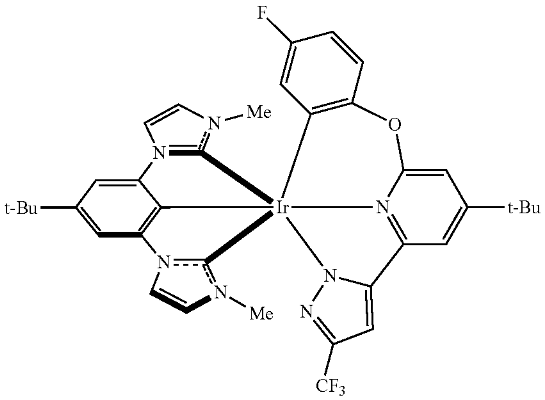
Ir-4
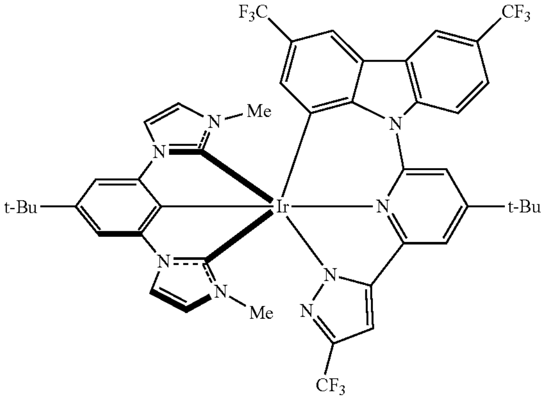

-continued
Ir-5
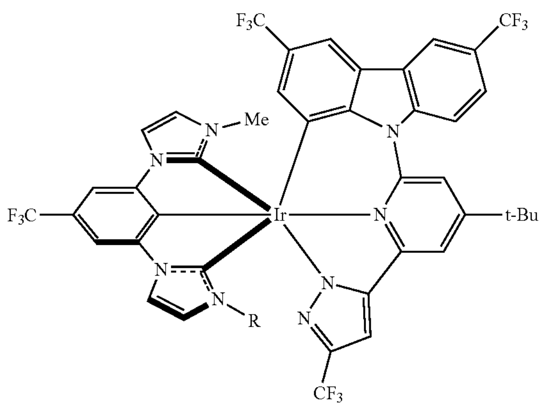
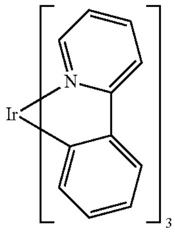
Ir(ppy)$_3$
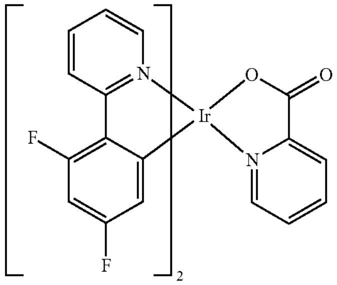
FIrpic
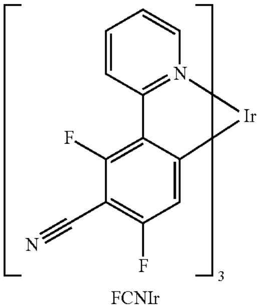
FCNIr
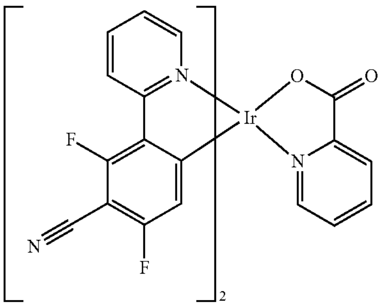
FCNIrpic
-continued
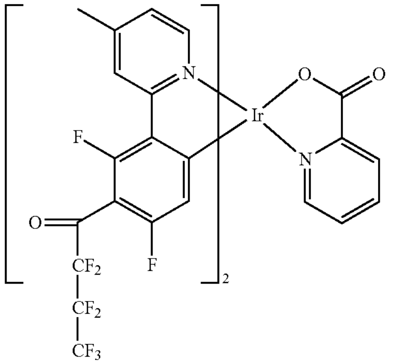
(HF)$_2$Ir(pic)
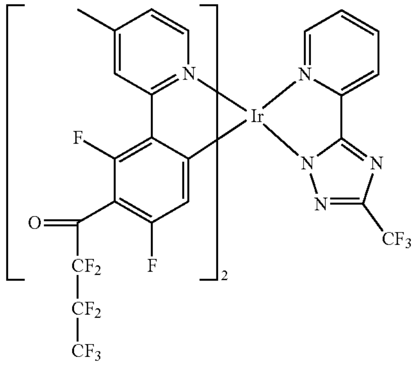
(HF)$_2$Ir(fptc)
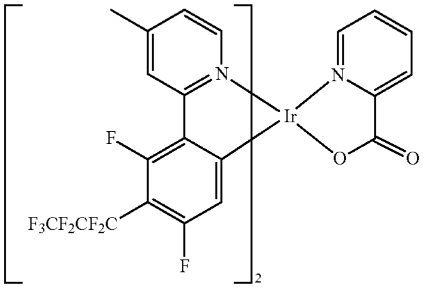
(HFP)$_2$Ir(pic)
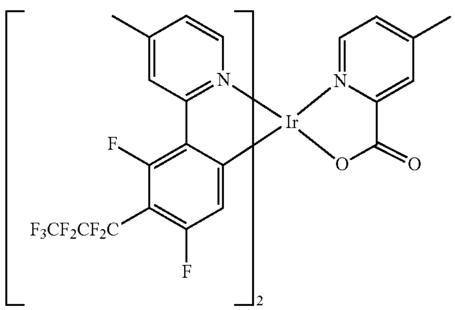
(HFP)$_2$Ir(mpic)

-continued
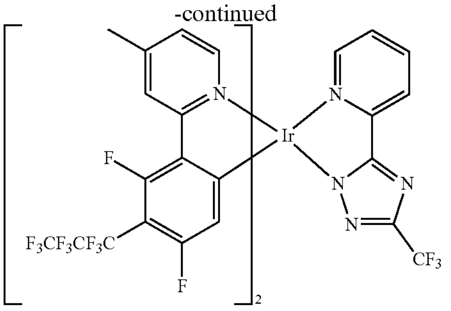
$(HFP)_2Ir(fptz)$
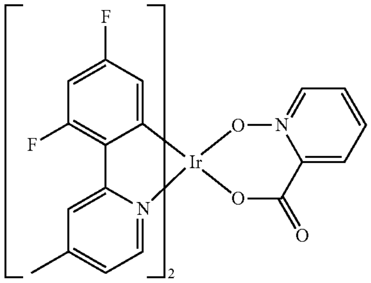
$(F_2CH_3ppy)_2Ir$(pic-N-oxide)
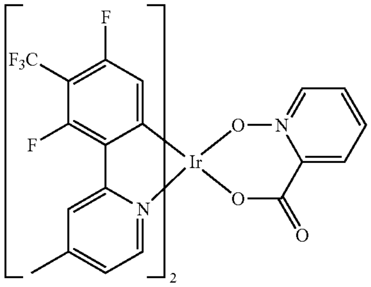
$(F_2CF_3CH_3ppy)_2Ir$(pic-N-oxide)
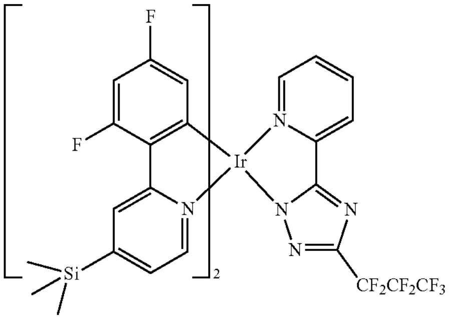
$Ir(F_2$-p-trimethylsilyl$)_2$(fptp)
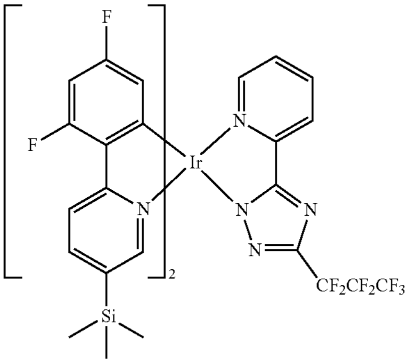
$Ir(F_2$-m-trimethylsilyl$)_2$(fptp)
-continued
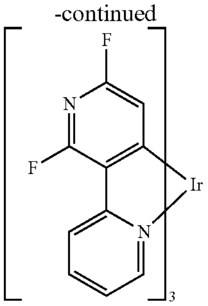
$Ir(dfpypy)_3$
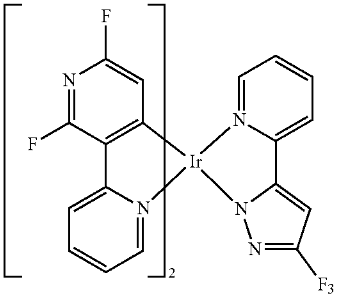
$Ir(dfpypy)_2(fppz)$
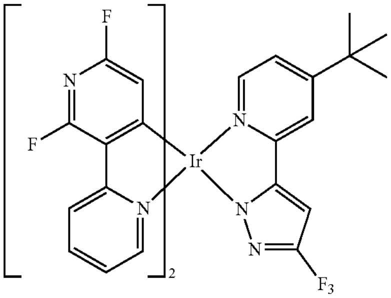
$Ir(dfpypy)_2(fpbpz)$
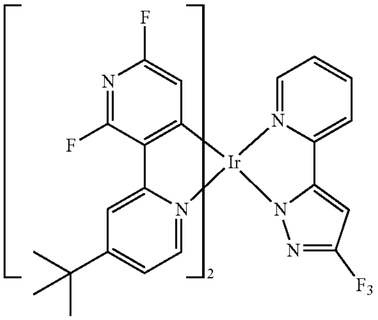
$Ir(dfpybpy)_2(fppz)$
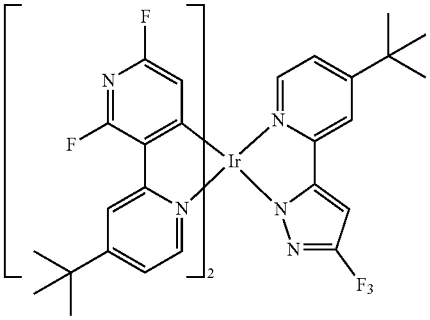
$Ir(dfpybpy)_2(fpbpz)$ -continued
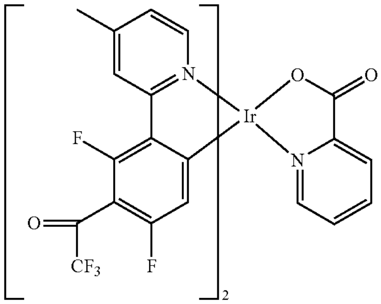
$(TF)_2Ir(pic)$
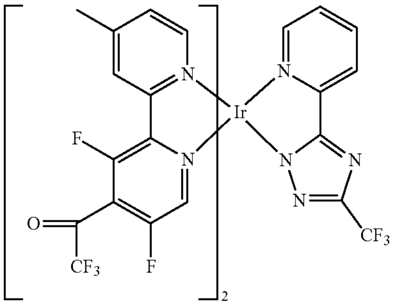
(TF)-2-Ir(fptc)
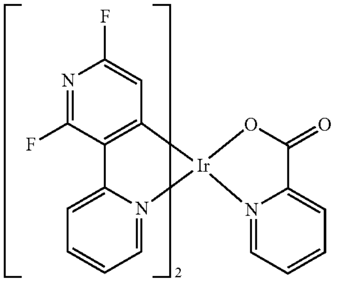
$(dfpypy)_2Ir(pic)$
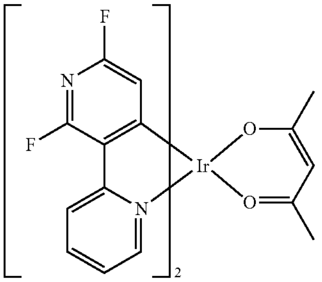
$(dfpypy)_2Ir(acae)$
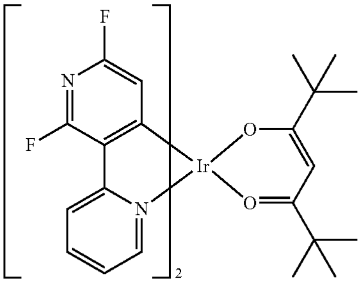
$(dfpypy)_2Ir(dpm)$
-continued
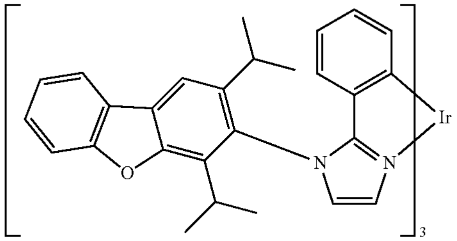
$Ir(dpi)_3$
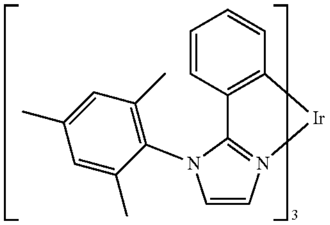
fac-$Ir(mpim)_3$
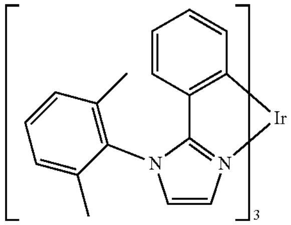
1
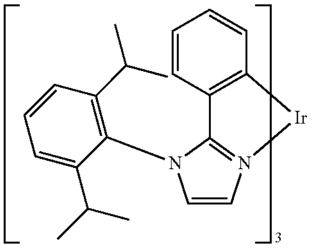
2
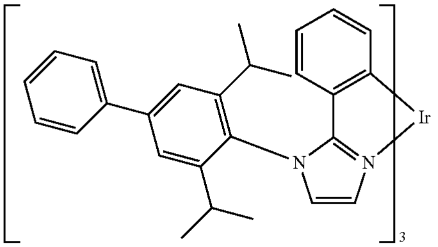
3

-continued

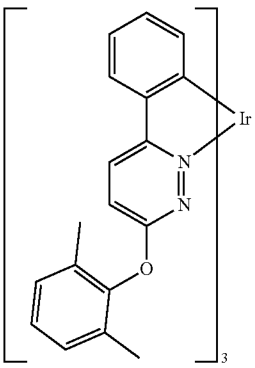

Ir(dmp)₃

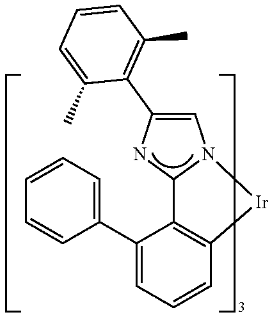

Ir(pmb)₃

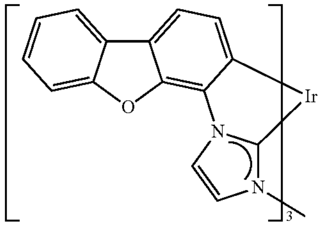

Ir(dbfmi)₃

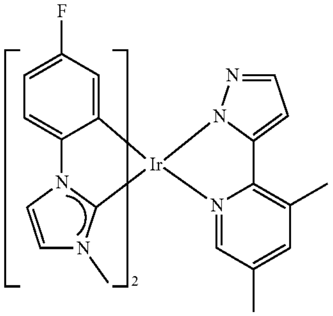

(fpmi)₂Ir(dmpypz)

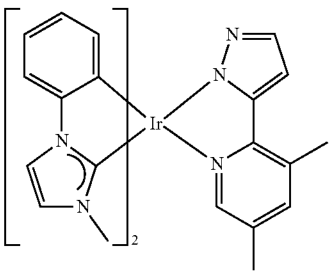

(mpmi)₂Ir(dmpypz)

-continued

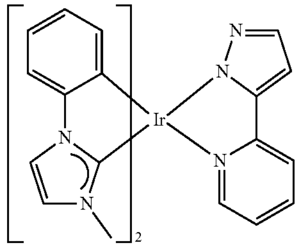

Ir(pmi)₂Ir(pypz)

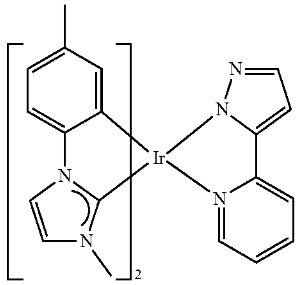

Ir(mpmi)₂Ir(pypz)

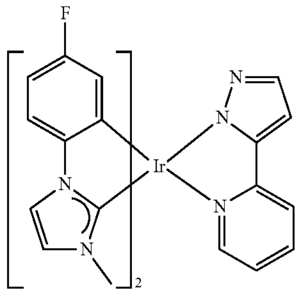

Ir(fpmi)₂Ir(pypz)

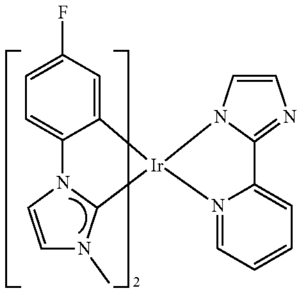

Ir(fpmi)₂Ir(pyim)

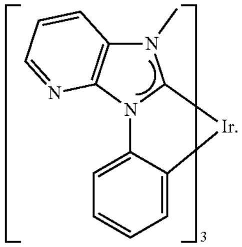

Ir(pmp)₃

According to one or more embodiments, a weight ratio of the third compound to the fourth compound may be in a range of about 100:1 to about 1:100, but the present disclosure is not limited thereto.

In some embodiments, a difference between a maximum emission wavelength of light emitted from the third compound and a maximum emission wavelength of light emitted from the fourth compound may be in a range of about 0 nanometer (nm) to about 35 nm, for example, about 0 nm to about 20 nm, or for example, about 0 nm to about 10 nm.

According to one or more embodiments, the third compound and the fourth compound may each emit blue light. In some embodiments, the third compound may emit light having a maximum emission wavelength in a range of about 445 nm to about 470 nm, and the fourth compound may emit light having a maximum emission wavelength in a range of about 450 nm to about 480 nm. In some embodiments, a difference between a maximum emission wavelength of light emitted from the third compound and a maximum emission wavelength of light emitted from the fourth compound may be in a range of about 0 nm to about 35 nm.

As the organic light-emitting device includes the third compound as a dopant, the color purity of blue light emitted from the emission layer may improve.

In some embodiments, a y coordinate among CIE color-coordinates of light emitted from the emission layer may be in a range of about 0.045 to about 0.06. Accordingly, the organic light-emitting device may emit blue light with high color purity.

The term "CIE color-coordinates," as used herein, refers to x, y, z coordinates of light according to CIE 1931 color space.

When the fourth compound is included as a co-dopant with the third compound in the emission layer, the organic light-emitting device may have long lifespan. In some embodiments, when driven by the same luminance under the same condition of thickness and composition of organic layers, an organic light-emitting device including the fourth compound as an emission layer dopant (hereinafter, referred to as a "first device") may have a longer T95 lifespan than an organic light-emitting device including the third compound (or only the third compound) as an emission layer dopant (hereinafter, referred to as a "second device").

Accordingly, according to one or more embodiments, the organic light-emitting device 10 may satisfy Equation 1:

$$T95(C4) > T95(C3) \quad \text{Equation 1}$$

wherein, in Equation 1,

T95(C3) indicates a T95 lifespan of the organic light-emitting device including the third compound as a single dopant in the emission layer (the second device), and T95(C4) indicates a T95 lifespan of the organic light-emitting device including the fourth compound as a single dopant in the emission layer (the first device).

In Equation 1, T95(C4) and T95(C3) may each be a T95 lifespan when driven by the same initial luminance.

A content ratio (e.g., weight ratio or mole ratio) of the third compound to the fourth compound in the emission layer may differ depending on the lifespan ratio of the second device to the first device.

In some embodiments, when the T95 lifespan of the second device is smaller than the T95 lifespan of the first device and greater than or equal to 80% of the T95 lifespan of the first device, the content ratio (e.g., weight ratio or mole ratio) of the third compound to the fourth compound may be in a range of about 1:0.01 to about 1:1, or for example, about 1:0.1 to about 1:0.5.

In some embodiments, when the T95 lifespan of the second device is smaller than 80% of the T95 lifespan of the first device and greater than or equal to 50% of the T95 lifespan of the first device, the content ratio (e.g., weight ratio or mole ratio) of the third compound to the fourth compound may be in a range of about 1:0.01 to about 0.01:1, for example, about 1:0.5 to about 1:0.8, or for example, about 0.5:1 to about 0.8:1.

In some embodiments, when the T95 lifespan of the second device is smaller than 50% of the T95 lifespan of the first device, a weight ratio of the third compound to the fourth compound may be in a range of about 1:0.01 to about 0.01:1, or for example, about 0.3:1 to about 0.5:1.

The organic light-emitting device according to one or more embodiments includes both the third compound and the fourth compound as emission layer dopants, thus having color purity improvement by the third compound and lifespan improvement by the fourth compound.

According to one or more embodiments, the organic light-emitting device may have a T95 lifespan of 30 hours or longer, based on the initial luminance of 1,000 nit.

According to one or more embodiments, the total content (e.g., amount or volume) of the third compound and the fourth compound in the emission layer may be generally in a range of about 1 percent by volume (vol %) to about 50 vol %, for example, about 5 vol % to about 50 vol %, or for example, about 10 vol % to about 25 vol %, based on the total volume of the first compound and the second compound, but the present disclosure is not limited thereto.

According to one or more embodiments, the emission layer may include at least one selected from a fluorescent dopant and delayed fluorescent dopant.

According to one or more embodiments, the fluorescent dopant may include a compound represented by Formula 501:

Formula 501

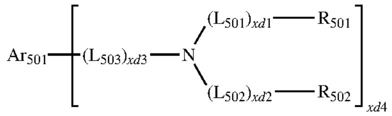

wherein, in Formula 501, $Ar_{501}$ may be selected from a substituted or unsubstituted $C_5$-$C_{60}$ carbocyclic group (or a substituted or unsubstituted $C_4$-$C_{60}$ carbocyclic group) and a substituted or unsubstituted $C_1$-$C_{60}$ heterocyclic group, $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer from 0 to 3, $R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer from 1 to 6.

In some embodiments, in Formula 501, $Ar_{501}$ may be selected from:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In an embodiment, in Formula 501, $L_{501}$ and $L_{503}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In an embodiment, in Formula 501, $R_{501}$ and $R_{502}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —$Si(Q_{31})(Q_{32})(Q_{33})$, wherein $Q_{31}$ to $Q_{33}$ may be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xd4 in Formula 501 may be 2, but the present disclosure is not limited thereto.

In some embodiments, the fluorescent dopant may be selected from Compounds FD1 to FD22:
FD1
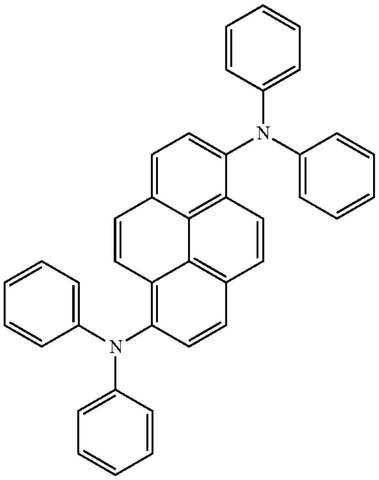
FD2
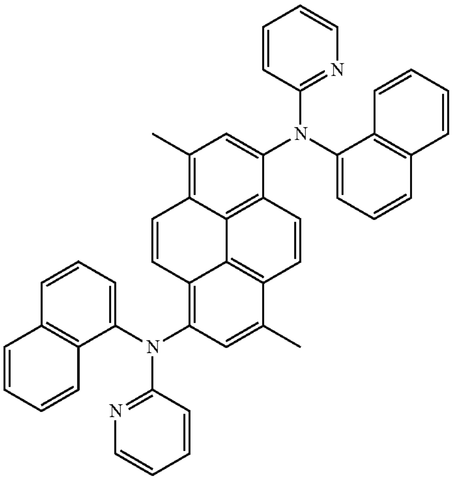
FD3
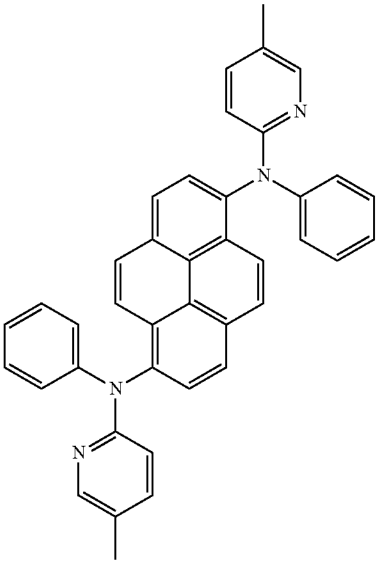
-continued
FD4
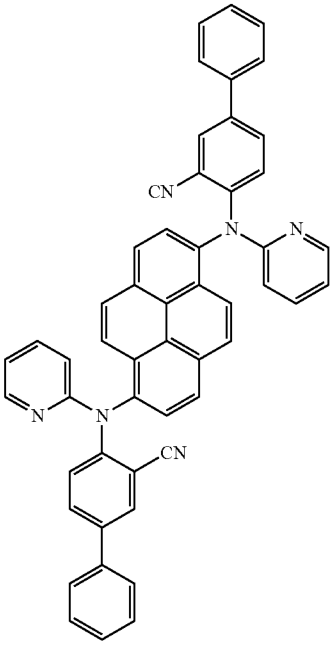
FD5
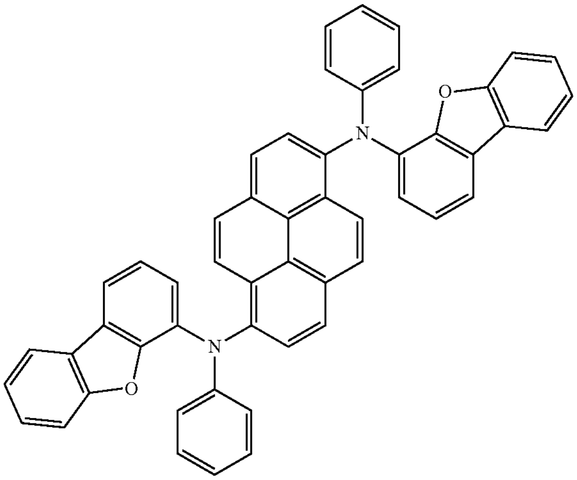
FD6
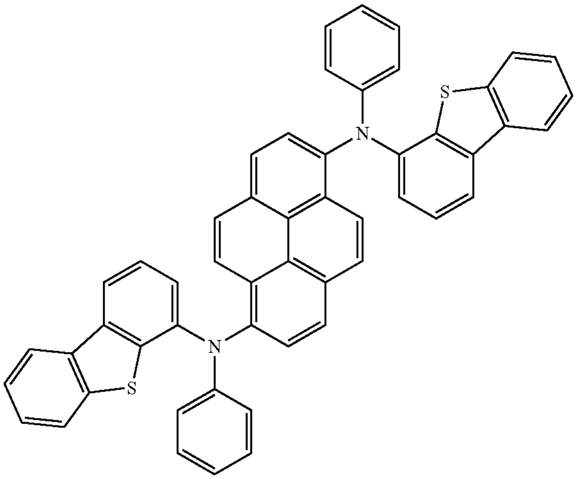

-continued
FD7
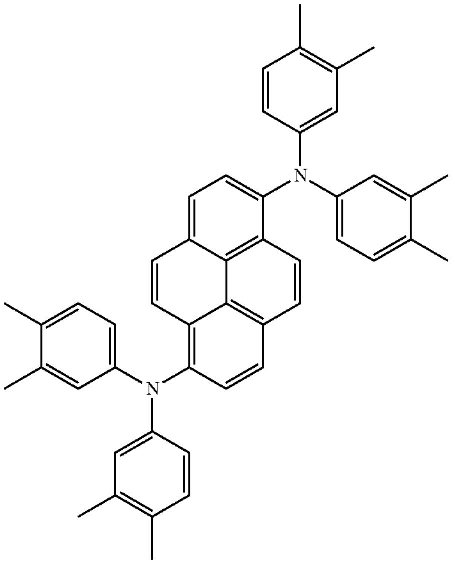
FD8
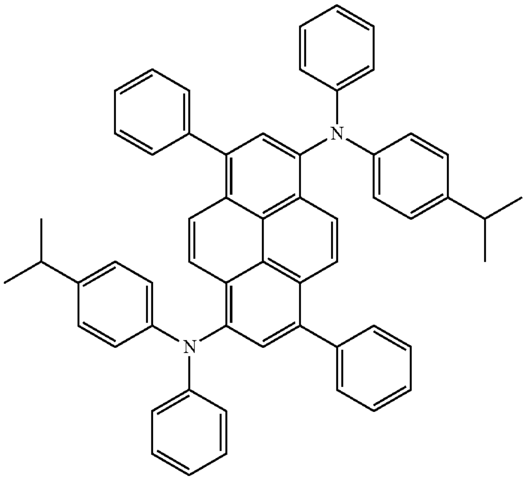
FD9
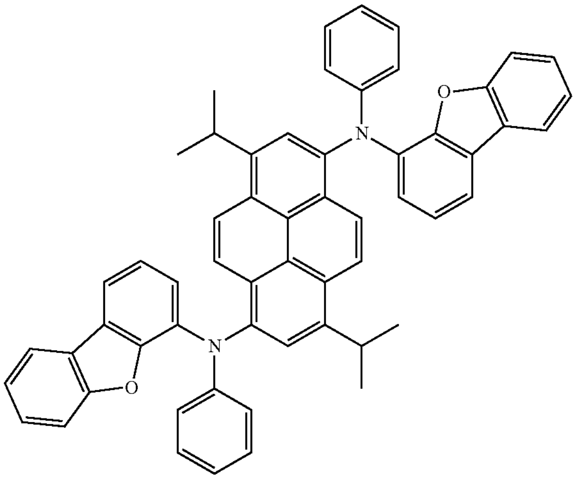
-continued
FD10
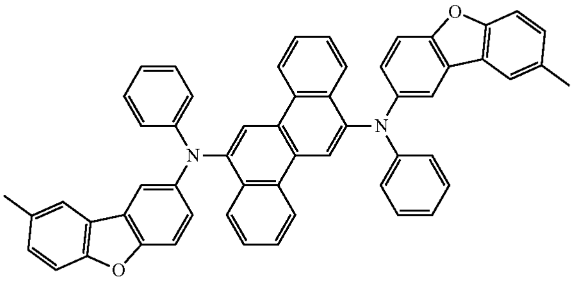
FD11
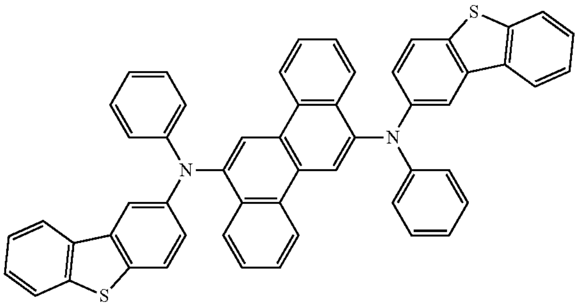
FD12
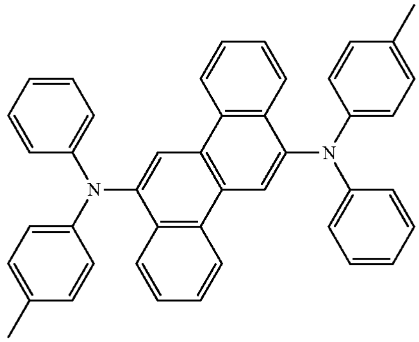
FD13
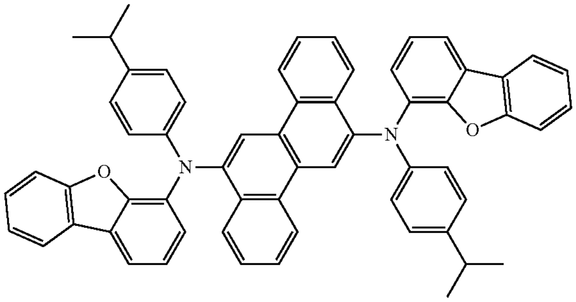
FD14
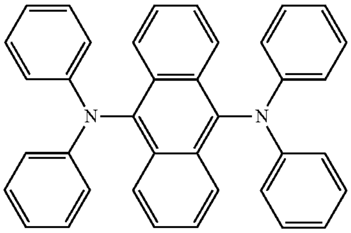

-continued
FD15
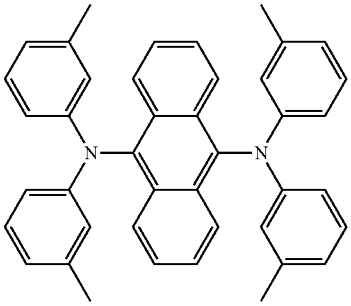
FD16
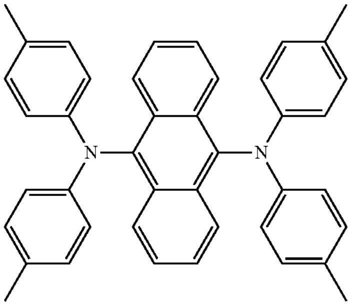
FD17
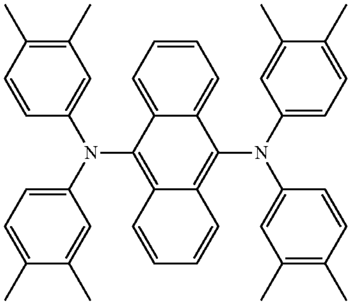
FD18
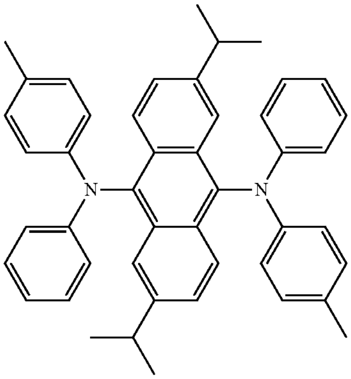
-continued
FD19
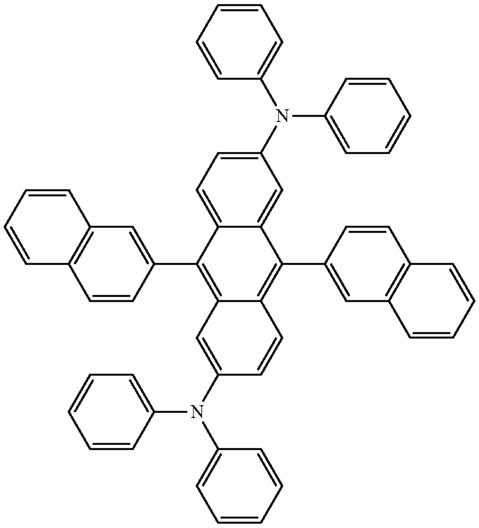
FD20
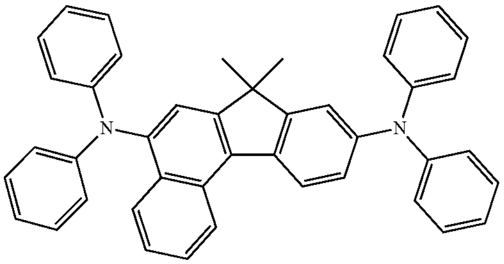
FD21
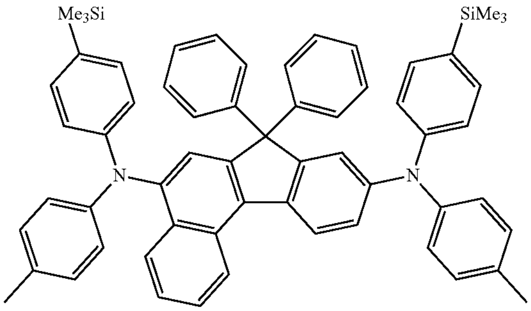
FD22
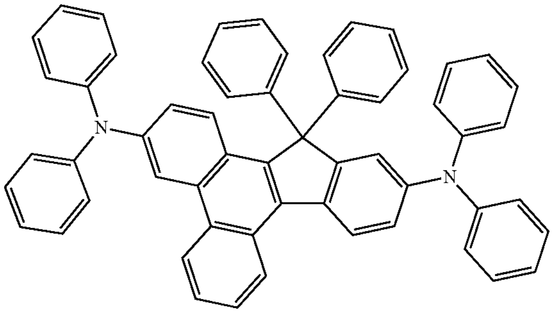
.
In some embodiments, the fluorescent dopant may be selected from the following compounds, but the present disclosure is not limited thereto:

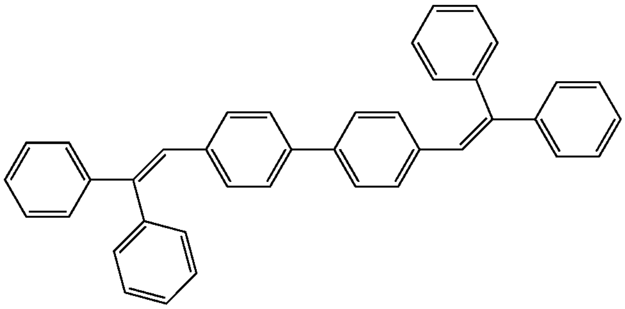
DPVBi
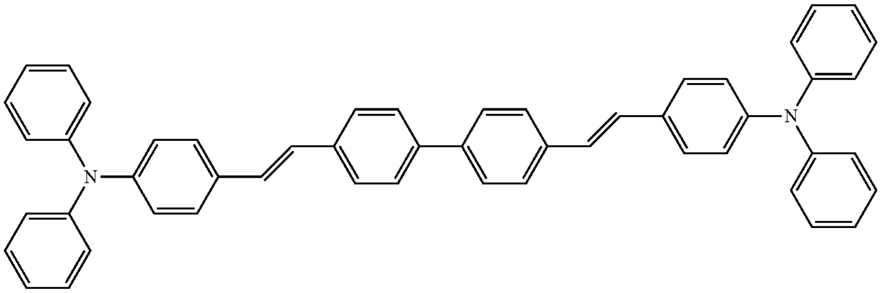
DPAVBi
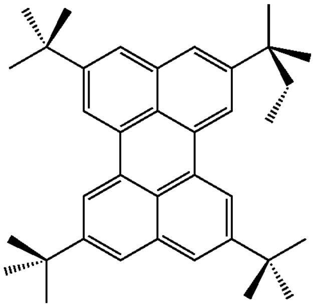
TBPe
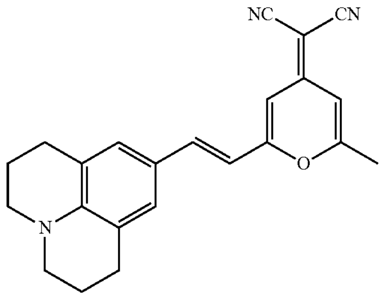
DCM
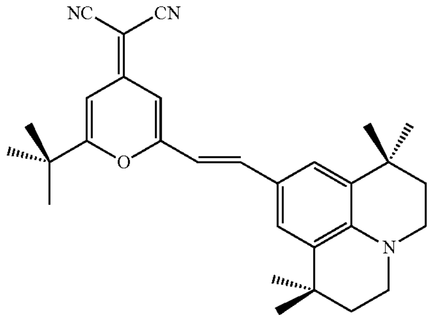
DCJTB
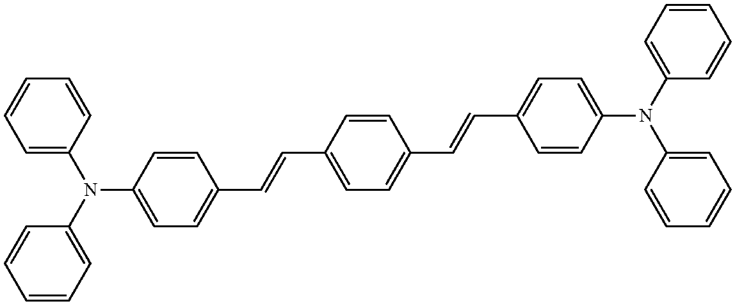
DSA-Ph
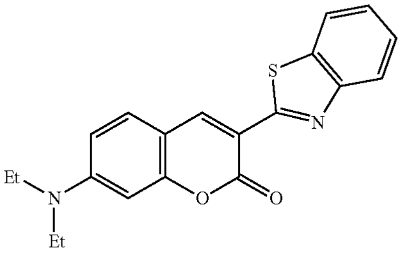
Coumarin 6
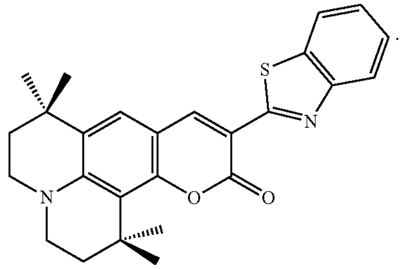
C545T The delayed fluorescent dopant may satisfy Equation 3:

$$\Delta E_{ST} = |S1(D) - T1(D)| \leq 0.5 \text{ eV} \quad \text{Equation 3}$$

wherein, in Equation 3,

S1(D) indicates a lowest excited singlet energy level of the dopant, and

T1 (D) indicates a lowest excited triplet energy level of the dopant.

A delayed fluorescent dopant that satisfy Equation 3 may emit thermal activated delayed fluorescence (TADF) even at room temperature. In some embodiments, the delayed fluorescent dopant may satisfy $|S1(D)-T1(D)|\leq 0.2$ eV, but the present disclosure is not limited thereto.

In addition, the delayed fluorescent dopant may not include a metal atom. For example, the delayed fluorescent dopant is distinguished from a phosphorescent dopant including a metal atom. In some embodiments, the delayed fluorescent dopant may not include iridium (Ir), platinum (Pt), palladium (Pd), osmium (Os), titanium (Ti), zirconium (Zr), hafnium (Hf), europium (Eu), terbium (Tb), rhodium (Rh), and thulium (Tm) and be distinguished from the phosphorescent dopant.

In some embodiments, the emission layer may include a first emission layer and a second emission layer, and the first emission layer may be between the first electrode and the second emission layer. In this embodiment, the first emission layer may include the first compound, the second compound, and a first dopant, and the second emission layer may include the first compound, the second compound, and a second dopant, wherein the first dopant may be any one selected from the third compound and the fourth compound, the second dopant may be different from the first dopant and may be the other one of the third compound and the fourth compound.

As described above, the third compound and the fourth compound may each be included in different emission layers.

In some embodiments, the third compound may be included in a first emission layer, and the fourth compound may be included in a second emission layer, or the fourth compound may be included in a first emission layer, and the third compound may be included in a second emission layer.

The first emission layer and the second emission layer may be in direct contact (e.g., physical contact) with each other, or another organic layer may be between the first emission layer and the second emission layer.

According to one or more embodiments, the first emission layer and the second emission layer may be in direct contact (e.g., physical contact) with each other.

According to one or more embodiments, the organic light-emitting device may further include a charge-generation layer between the first emission layer and the second emission layer and including an n-type charge-generation layer and a p-type charge-generation layer.

One emission layer of the first emission layer and the second emission layer may be physically in contact with the charge-generation layer, and another layer may be between the one emission layer and the charge-generation layer. In some embodiments, an electron transport region may be between a first emission layer, from among the two emission layers, and the charge-generation layer, the first emission layer being adjacent to a first electrode. In some embodiments, a hole transport region may be between a second emission layer, from among the two emission layers, and a charge-generation layer, the second emission layer being adjacent to a second electrode.

The charge-generation layer may generate charge or separate holes and electrons to serve as a cathode for an emission unit of two adjacent emission units by injecting electrons and as an anode for the other emission unit by injecting holes. The charge-generation layer may serve to separate adjacent emission units while not being directly coupled to an electrode.

The term "n-type," as used herein, refers to n-type semiconductor properties, e.g., properties capable of injection and transport of electrons. The term "p-type," as used herein, refers to p-type semiconductor properties, e.g., properties capable of injection and transport of holes.

According to one or more embodiments, the first dopant may be included in a range of about 1 vol % to about 30 vol %, based on the total volume of the first emission layer, and the second dopant may be included in a range of about 1 vol % to about 30 vol %, based on the total volume of the second emission layer, but the present disclosure is not limited thereto.

The thicknesses of the first emission layer and the second emission layer may each be in a range of about 10 Å to about 1,000 Å, and in some embodiments, about 150 Å to about 500 Å. When the thicknesses of the first emission layer and the second emission layer are within any of the foregoing ranges, luminescence characteristics may be improved without a substantial increase in driving voltage.

According to one or more embodiments, a thickness ratio of the first emission layer to the second emission layer may be in a range of about 1:9 to about 9:1. In some embodiments, the thickness ratio may be in a range of about 2:8 to about 8:2, or for example, about 7:3 to about 3:7.

In some embodiments, a difference between a maximum emission wavelength of light emitted from the first emission layer and a maximum emission wavelength of light emitted from the second emission layer may be in a range of about 0 nm to about 35 nm, for example, about 0 nm to about 20 nm, or for example, about 0 nm to about 10 nm.

According to one or more embodiments, the first emission layer and the second emission layer may each emit blue light. In this embodiment, a difference between a maximum emission wavelength of light emitted from the first emission layer and a maximum emission wavelength of light emitted from the second emission layer may be in a range of about 0 nm to about 35 nm, for example, about 0 nm to about 20 nm, or for example, about 0 nm to about 10 nm.

In some embodiments, the emission layer may include a first emission layer, a second emission layer and a third emission layer, and the first emission layer may be between the first electrode and the second emission layer, and the second emission layer may be between the first electrode and the third emission layer. In this embodiment, the first emission layer may include the first compound, the second compound, and a first dopant, the second emission layer may include the first compound, the second compound, and a second dopant, and the third emission layer may include the first compound, the second compound, and a third dopant, wherein the first dopant and the third dopant may be any one selected from the third compound and the fourth compound, the second dopant may be different from the first dopant and the third dopant and be the other one of the third compound and the fourth compound.

As described above, the third compound and the fourth compound may each be included in different emission layers. In some embodiments, the third compound may be included in a first emission layer and a third emission layer, and the fourth compound may be included in a second emission layer, or the fourth compound may be included in a first emission layer and a third emission layer, and the third compound may be included in a second emission layer.

When the first emission layer and the third emission layer includes the third compound, the third compound included in the first emission layer may be identical to or different from the third compound included in the third emission layer. For example, the first dopant and the third dopant may each independently be an organometallic compound represented by Formula 1, and the first dopant and the third dopant may be identical to or different from each other.

When the first emission layer and the third emission layer includes the fourth compound, the fourth compound included in the first emission layer may be identical to or different from the fourth compound included in the third emission layer.

The first emission layer, the second emission layer, and the third emission layer may be in direct contact (e.g., physical contact) with each other, or another organic layer may be between the first emission layer and the second emission layer and/or the second emission layer and the third emission layer.

According to one or more embodiments, the first emission layer, the second emission layer, and the third emission layer may be in direct contact (e.g., physical contact) with one another. For example, the second emission layer may be at an interface between the first emission layer and the third emission layer.

According to one or more embodiments, the organic light-emitting device may further include a charge-generation layer between two adjacent emission layers from among the first emission layer, the second emission layer, and the third emission layer and including an n-type charge-generation layer and a p-type charge-generation layer. The term "adjacent," as used herein, refers to an arrangement relationship of layers arranged to be closest to each other from among the described layers. In some embodiments, the term "two adjacent emission layers," as used herein, refers to an arrangement relationship of two emission layers arranged to be closest to each other from among a plurality of emission layers.

One emission layer of the two emission layers closest to each other may be physically in contact with the charge-generation layer, and another layer may be between the one emission layer and the charge-generation layer. In some embodiments, an electron transport region may be between an emission layer, from among the two adjacent emission layers, adjacent to a first electrode and the charge-generation layer. In some embodiments, a hole transport region may be between an emission layer, from among the two adjacent emission layers, adjacent to a second electrode and a charge-generation layer.

According to one or more embodiments, the first dopant may be included in a range of about 1 vol % to about 30 vol %, based on the total volume of the first emission layer, the second dopant may be included in a range of about 1 vol % to about 30 vol %, based on the total volume of the second emission layer, and the third dopant may be included in a range of about 1 vol % to about 30 vol %, based on the total volume of the third emission layer, but the present disclosure is not limited thereto.

The thicknesses of the first emission layer, the second emission layer, and the third emission layer may each independently be in a range of about 10 Å to about 1,000 Å, and in some embodiments, about 150 Å to about 500 Å. When the thicknesses of the first emission layer, the second emission layer, and the third emission layer are within any of the foregoing ranges, luminescence characteristics may be improved without a substantial increase in driving voltage.

According to one or more embodiments, the first emission layer, the second emission layer, and the third emission layer may each emit blue light. In this embodiment, a difference between a maximum emission wavelength of light emitted from the first emission layer, a maximum emission wavelength of light emitted from the second emission layer, and a maximum emission wavelength of light emitted from the third emission layer may be in a range of about 0 nm to about 35 nm, for example, about 0 nm to about 20 nm, or for example, about 0 nm to about 10 nm.

When the organic light-emitting device 10 is a full color organic light-emitting device, the emission layer may be patterned into a red emission layer, a green emission layer, or a blue emission layer, according to a sub-pixel. In one or more embodiments, the emission layer may have a stacked structure. The stacked structure may include two or more layers selected from a red emission layer, a green emission layer, and a blue emission layer. The two or more layers may be in direct contact (e.g., physical contact) with each other. In some embodiments, the two or more layers may be separated from each other. In one or more embodiments, the emission layer may include two or more materials. The two or more materials may include a red light-emitting material, a green light-emitting material, or a blue light-emitting material. The two or more materials may be mixed with each other in a single layer. The two or more materials mixed with each other in the single layer may emit white light.

The total thickness of the emission layer may be in a range of about 20 Å to about 1,000 Å, for example, about 200 Å to about 600 Å, or for example, about 150 Å to about 500 Å. When the thickness of the emission layer is within any of the foregoing ranges, improved luminescence characteristics may be obtained without a substantial increase in driving voltage.

The organic layer 150 may further include a hole transport region between the first electrode 110 and the emission layer and an electron transport region between the emission layer and the second electrode 190.

Hole Transport Region in Organic Layer 150

The hole transport region may have i) a single-layered structure including (or consisting of) a single layer including (or consisting of) a single material, ii) a single-layered structure including (or consisting of) a single layer including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

For example, the hole transport region may have a single-layered structure including a single layer including a plurality of different materials or a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers of each structure are sequentially stacked on the first electrode 110 in each stated order, but the present disclosure is not limited thereto.

The hole transport region may include at least one selected from m-MTDATA, TDATA, 2-TNATA, NPB (NPD), β-NPB, TPD, a spiro-TPD, a spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), (polyaniline)/poly(4-styrenesulfonate) (PANI/PSS), a compound represented by Formula 201, and a compound represented by Formula 202:

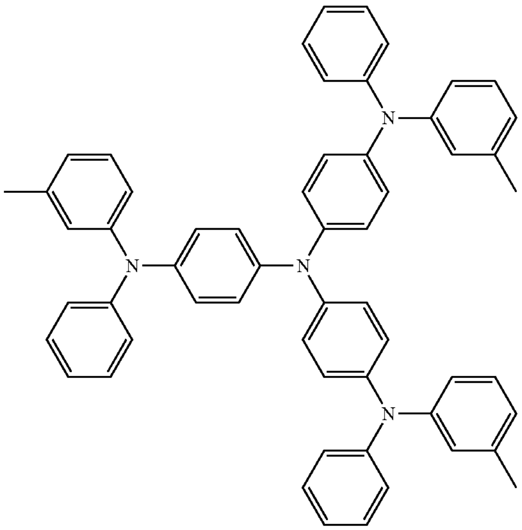

m-MTDATA

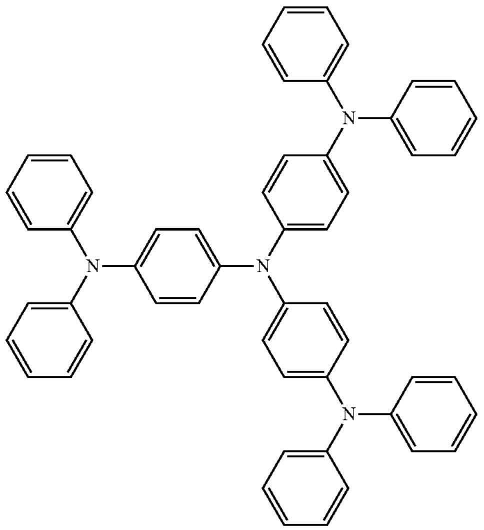

TDATA

-continued

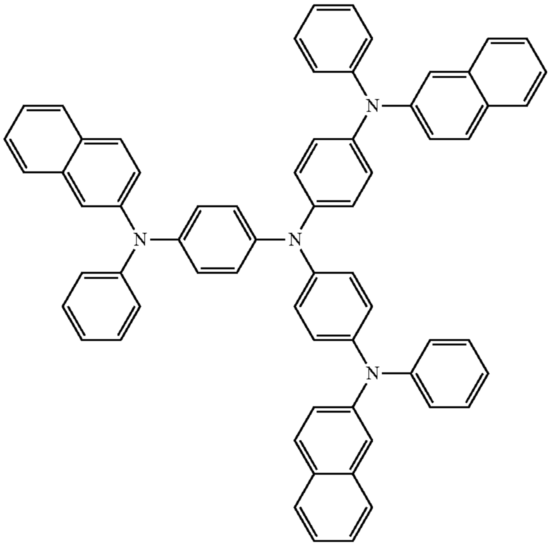

2-TNATA

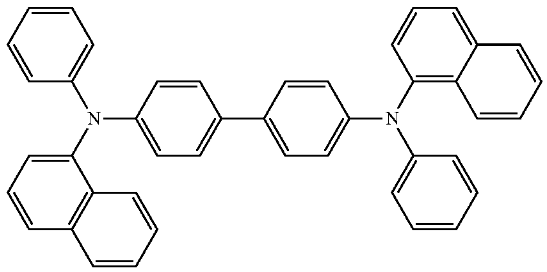

NPB

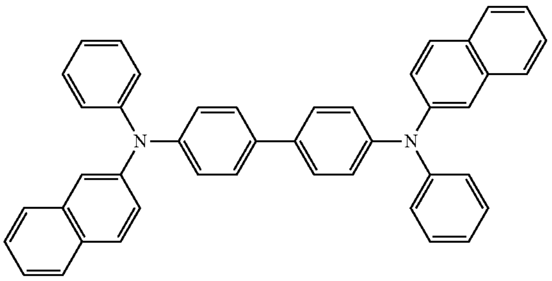

β-NPB

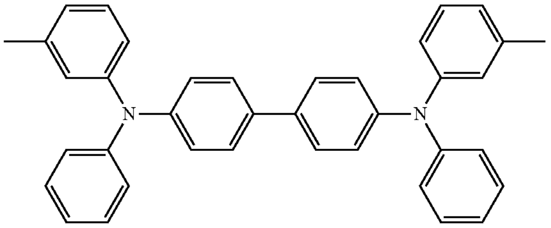

TPD

-continued

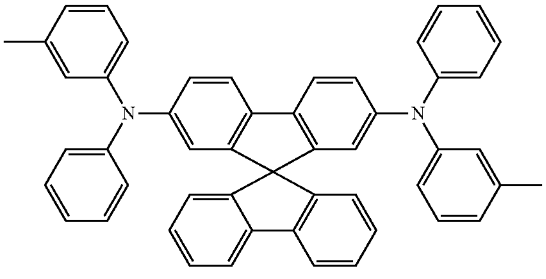

Spiro-TPD

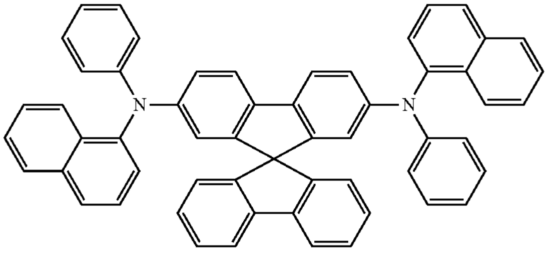

Spiro-NPB

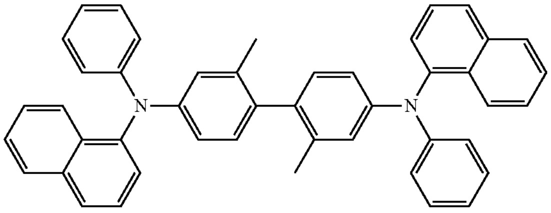

methylated NPB

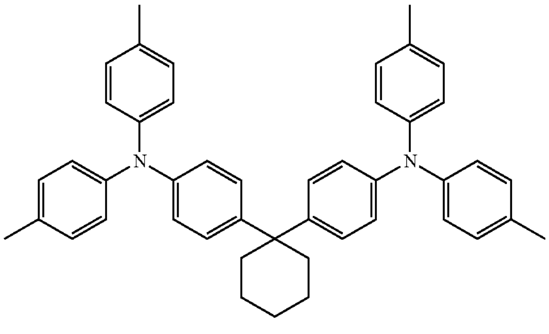

TAPC

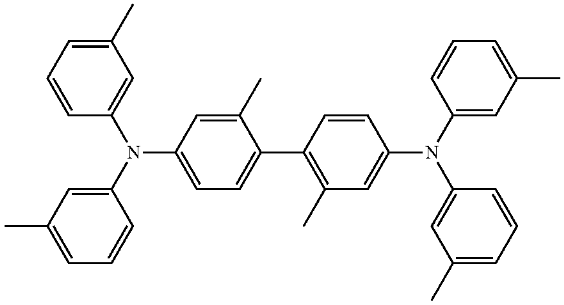

HMTPD

Formula 201

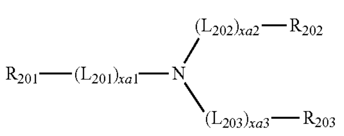

-continued

Formula 202

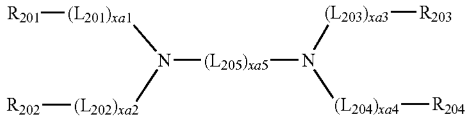

wherein, in Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, in Formula 202, $R_{201}$ and $R_{202}$ may optionally be bound via a single bond, a dimethyl-methylene group, or a diphenyl-methylene group, and $R_{203}$ and $R_{204}$ may optionally be bound via a single bond, a dimethyl-methylene group, or a diphenyl-methylene group.

In some embodiments, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may each independently be 0, 1, or 2.

In one or more embodiments, xa5 may be 1, 2, 3, or 4.

In one or more embodiments, $R_{201}$ to $R_{204}$ and $Q_{201}$ may each independently be selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, wherein $Q_{31}$ to $Q_{33}$ may respectively be understood by referring to the descriptions of $Q_{31}$ to $Q_{33}$ provided herein.

In one or more embodiments, in Formula 201, at least one selected from $R_{201}$ to $R_{203}$ may be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but the present disclosure is not limited thereto.

In one or more embodiments, in Formula 202, i) $R_{201}$ and $R_{202}$ may be bound via a single bond, and/or ii) $R_{203}$ and $R_{204}$ may be bound via a single bond.

In one or more embodiments, in Formula 202, at least one selected from $R_{201}$ to $R_{204}$ may be selected from:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but the present disclosure is not limited thereto.

The compound represented by Formula 201 may be represented by Formula 201-1:

Formula 201-1

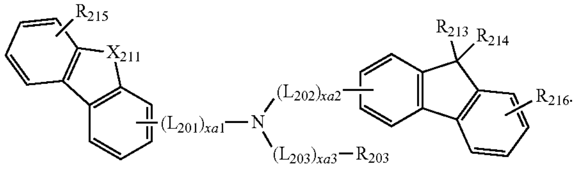

In some embodiments, the compound represented by Formula 201 may be represented by Formula 201-2, but the present disclosure is not limited thereto:

Formula 201-2

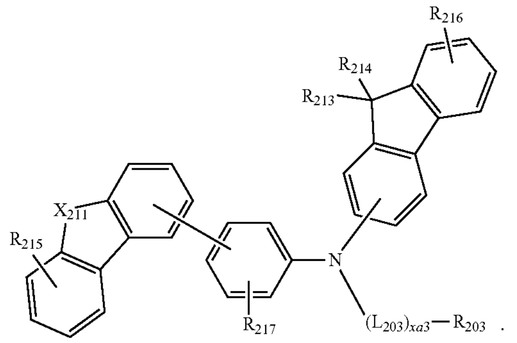

In some embodiments, the compound represented by Formula 201 may be represented by Formula 201-2(1), but the present disclosure is not limited thereto:

Formula 201-2(1)

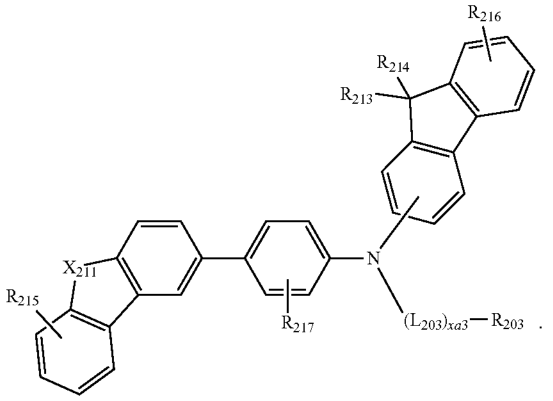

The compound represented by Formula 201 may be represented by Formula 201A:

Formula 201A

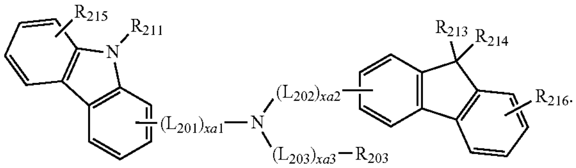

In some embodiments, the compound represented by Formula 201 may be represented by Formula 201A (1), but the present disclosure is not limited thereto:

Formula 201A(1)

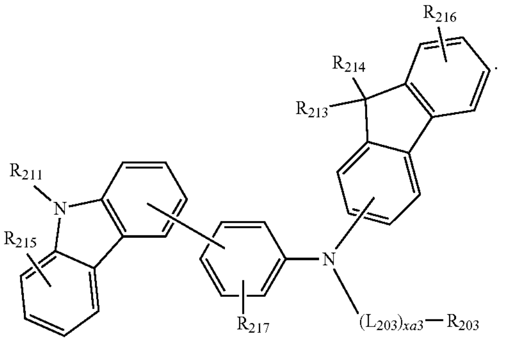

In some embodiments, the compound represented by Formula 201 may be represented by Formula 201A-1, but the present disclosure is not limited thereto:

Formula 201A-1

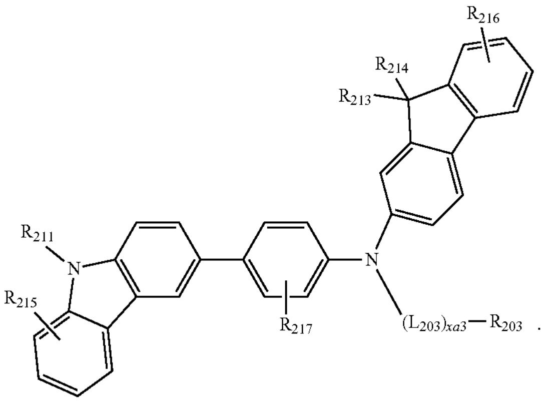

The compound represented by Formula 202 may be represented by Formula 202-1:

Formula 202-1

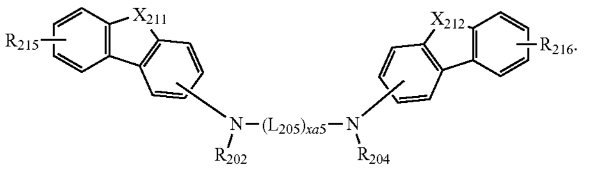

In one or more embodiments, the compound represented by Formula 202 may be represented by Formula 202-1(1):

Formula 202-1(1)

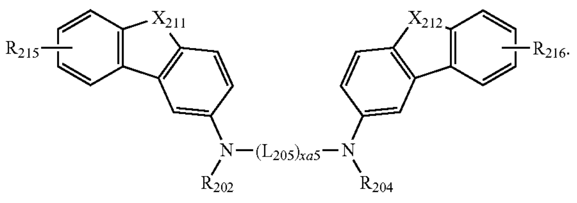

In some embodiments, the compound represented by Formula 202 may be represented by Formula 202A:

Formula 202A

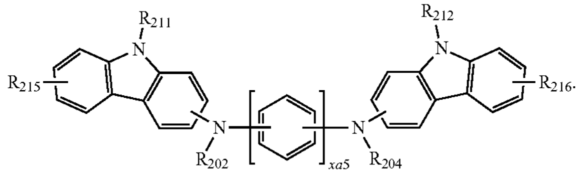

In some embodiments, the compound represented by Formula 202 may be represented by Formula 202A-1:

Formula 202A-1

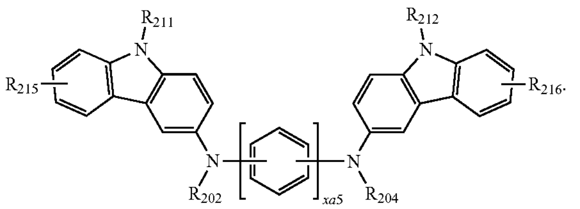

In Formulae 201-1, 201-2, 201-2(1), 201A, 201A(1), 201A-1, 202-1, 202-1(1), 202A, and 202A-1, $L_{201}$ to $L_{203}$, xa1 to xa3, xa5, and $R_{202}$ to $R_{204}$ may respectively be understood by referring to the descriptions of $L_{201}$ to $L_{203}$, xa1 to xa3, xa5, and $R_{202}$ to $R_{204}$ provided herein, $L_{205}$ may be selected from a phenylene group and a fluorenylene group, $X_{211}$ may be selected from O, S, and $N(R_{211})$, $X_{212}$ may be selected from O, S, and $N(R_{212})$, $R_{211}$ and $R_{212}$ may each be understood by referring to the description of $R_{203}$ provided herein, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT48, but the present disclosure is not limited thereto:
HT1
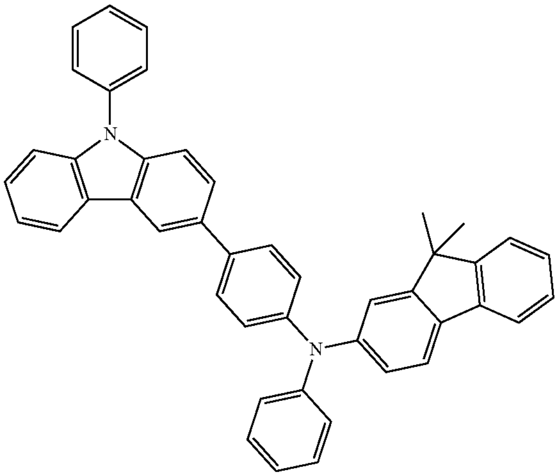
HT2
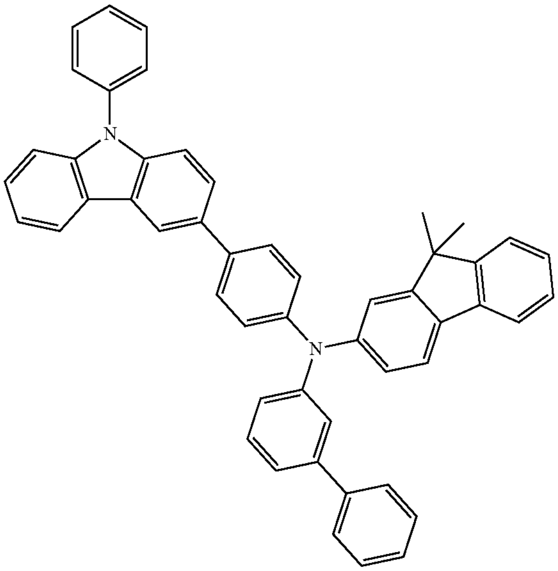
HT3
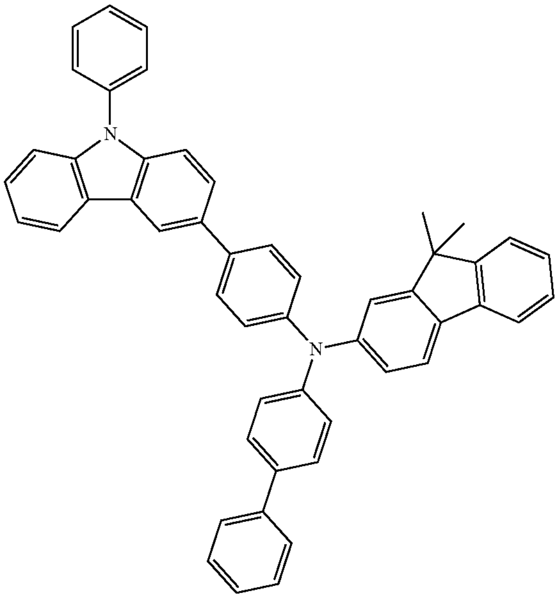
HT4
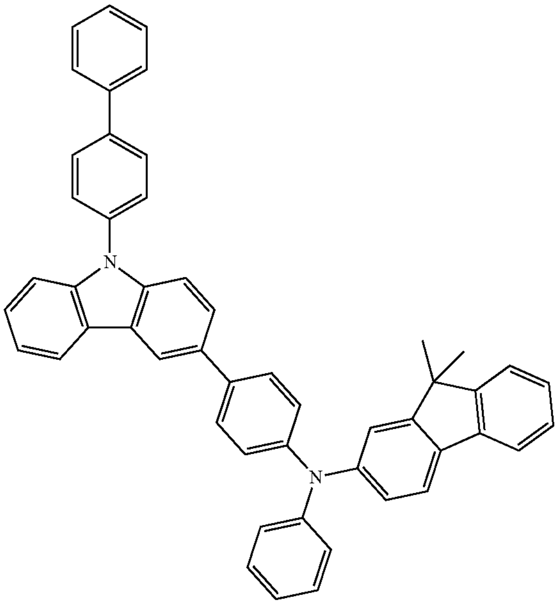

-continued
HT5
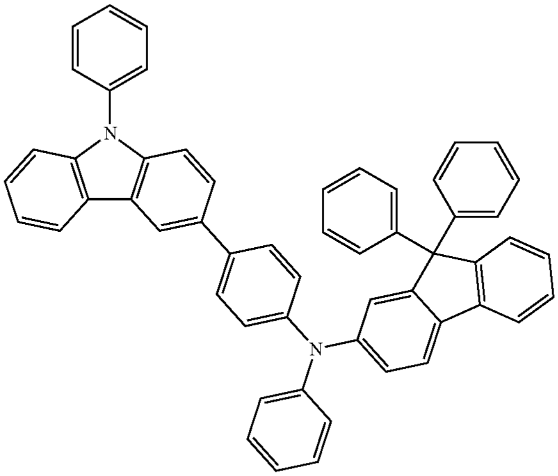
HT6
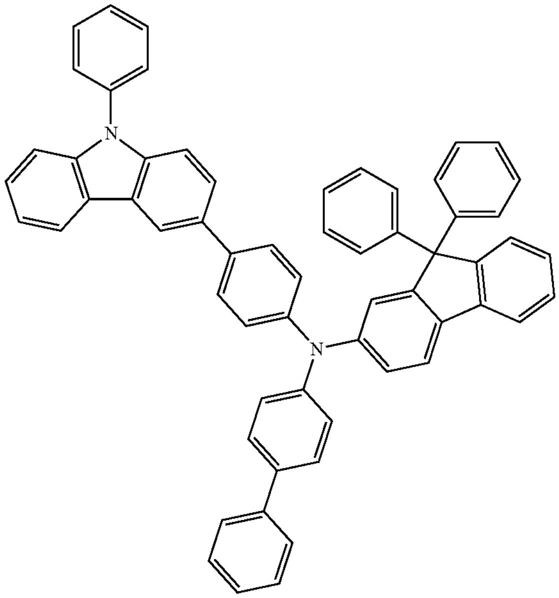
HT7
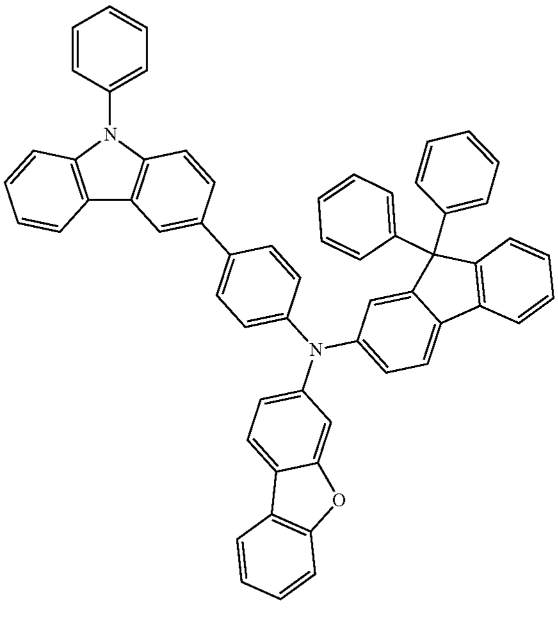
HT8
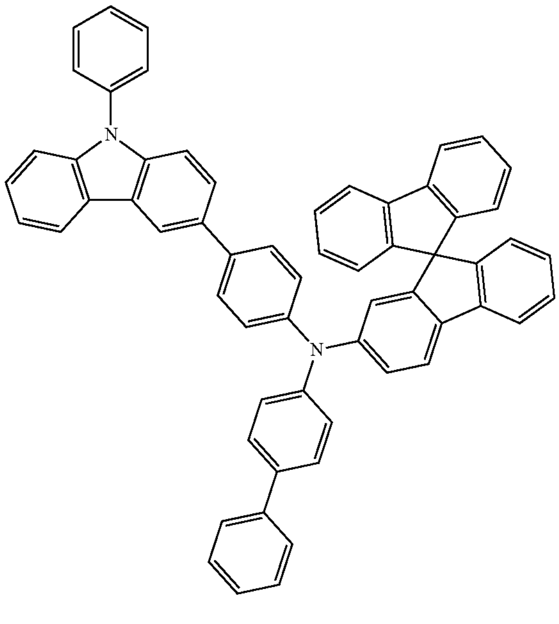

-continued
HT9
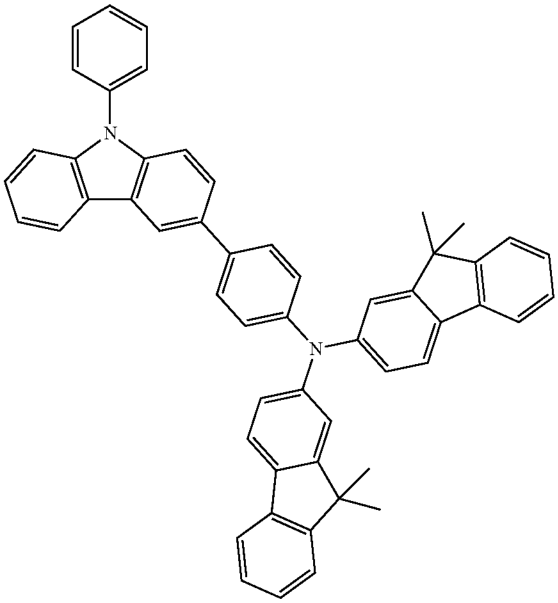
HT10
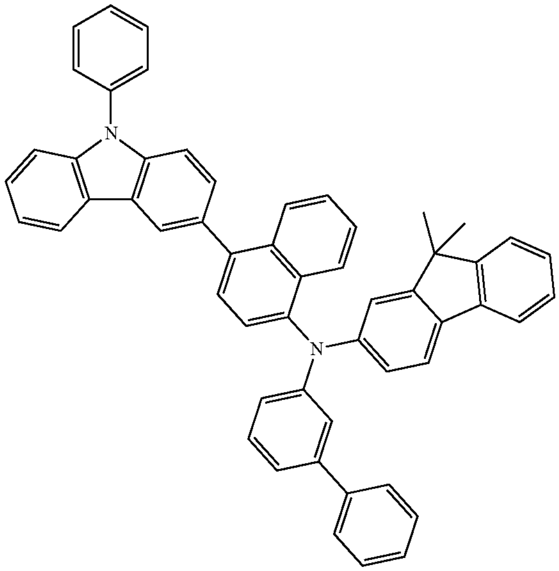
HT11
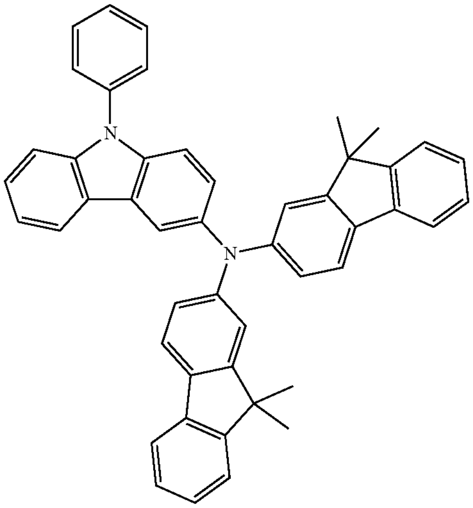
HT12
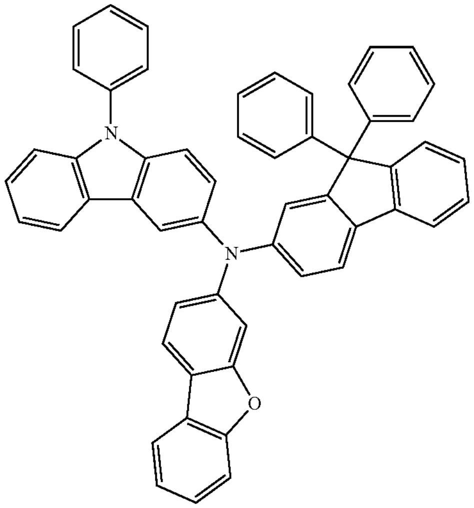

-continued
HT13
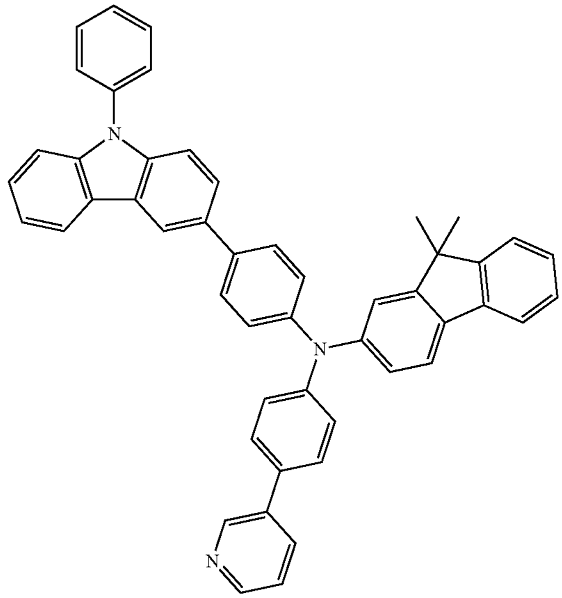
HT14
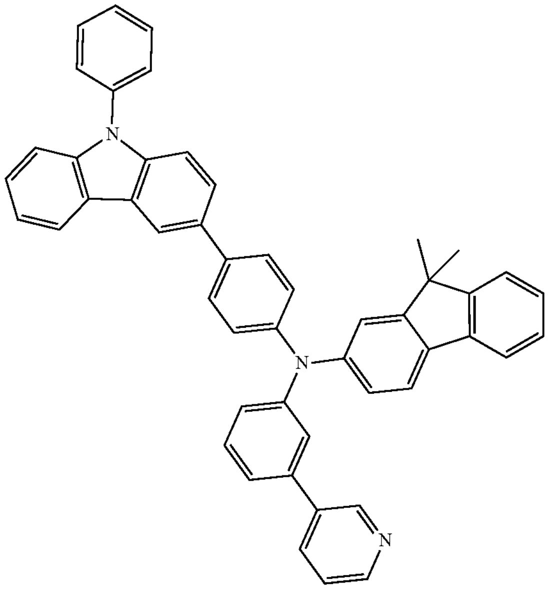
HT15
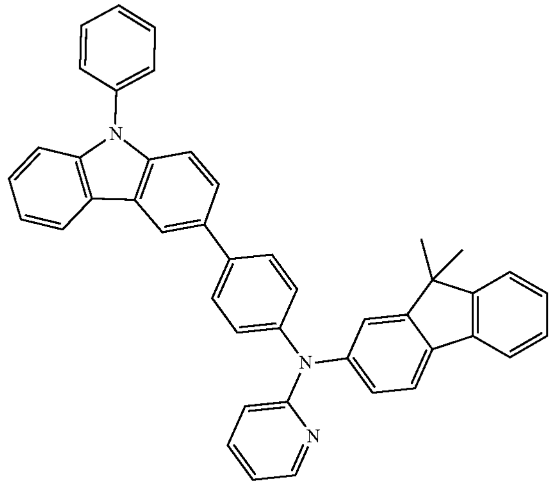
HT16
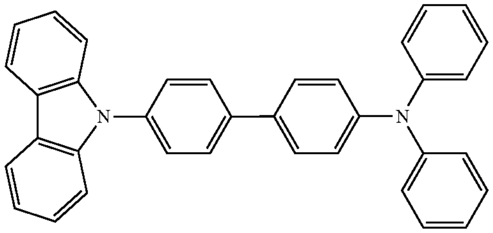
HT17
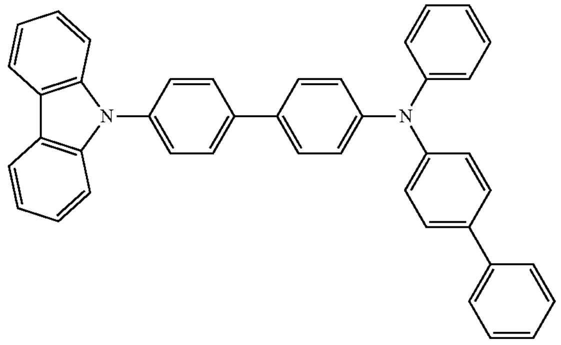
HT18
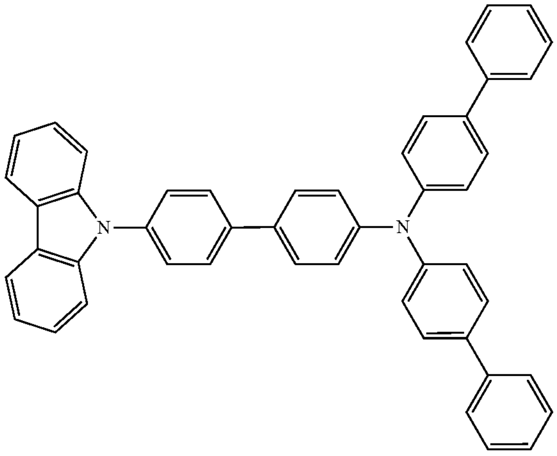

-continued
HT19
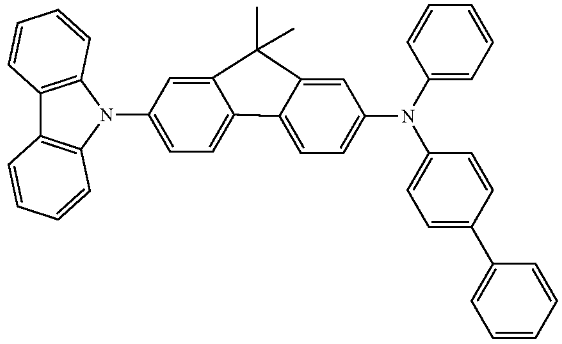
HT20
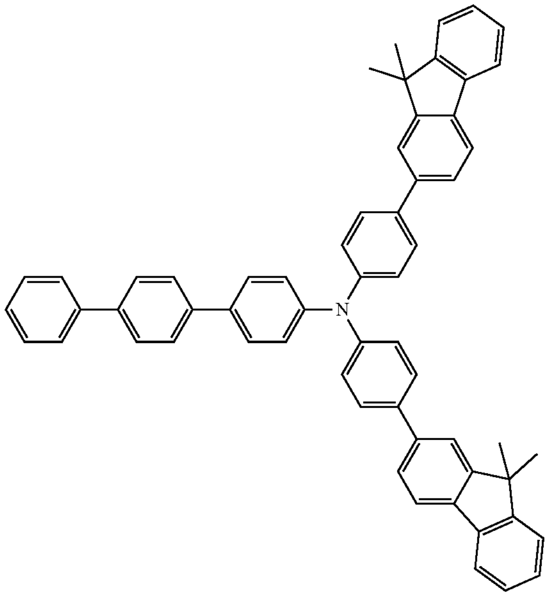
HT21
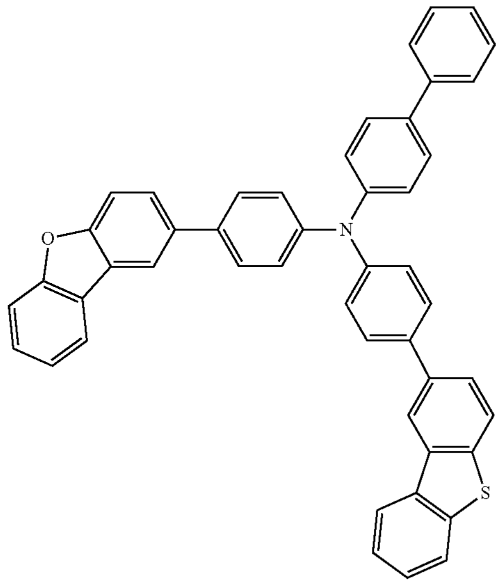
HT22
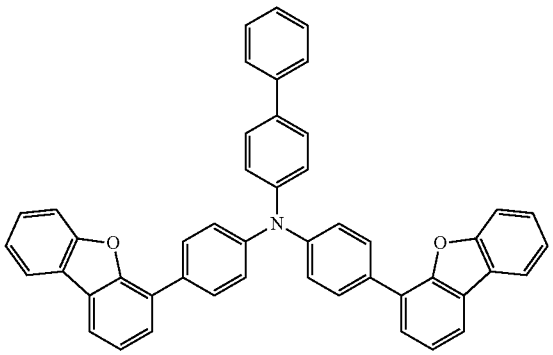

-continued
HT23
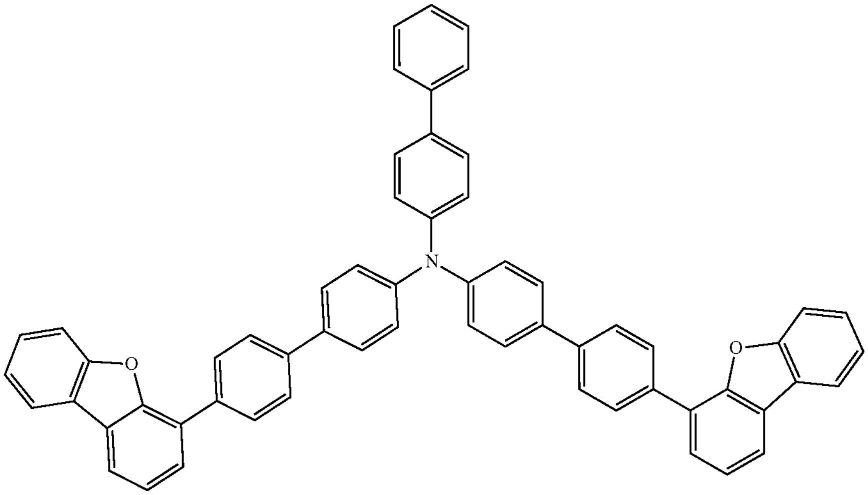
HT24
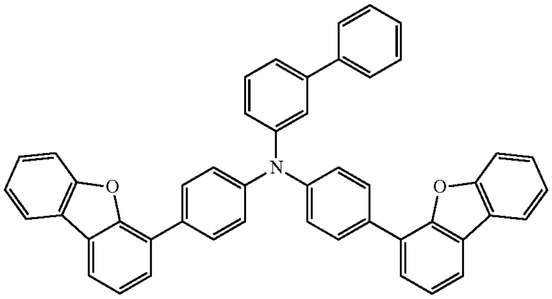
HT25
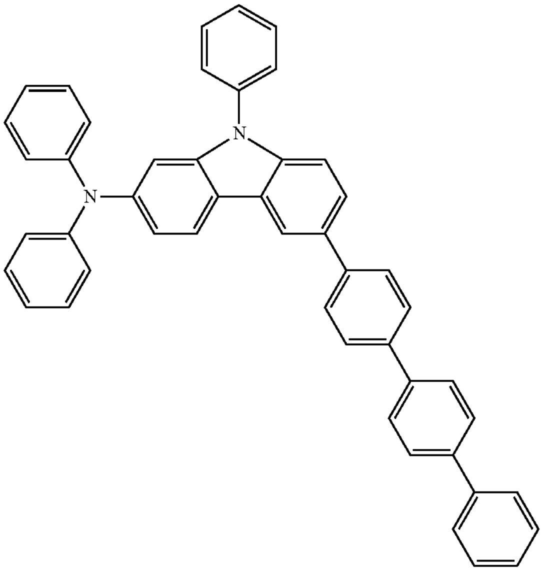
HT26
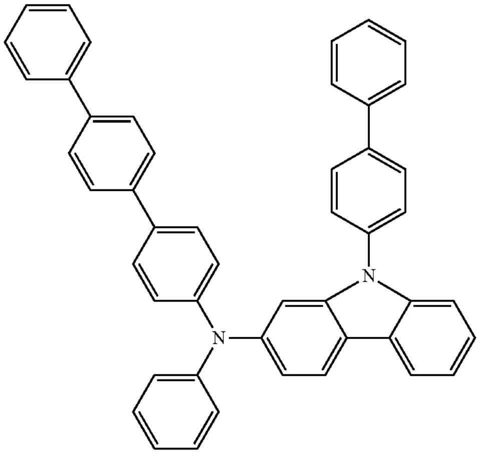
HT27
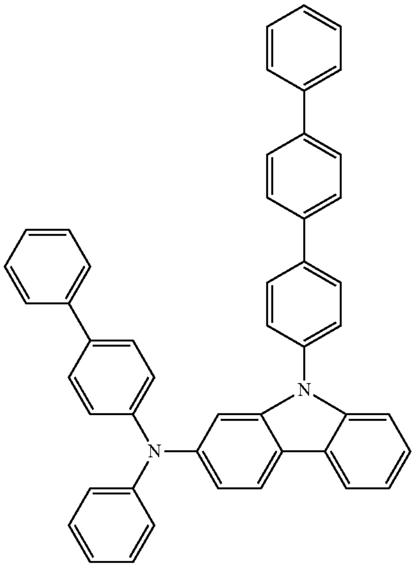

-continued
HT28
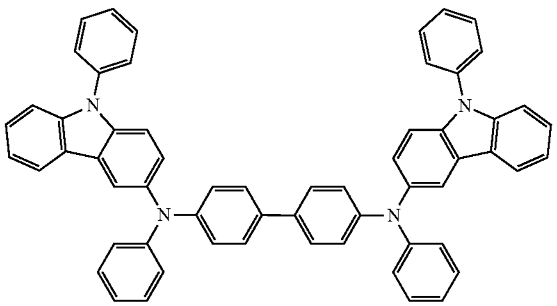
HT29
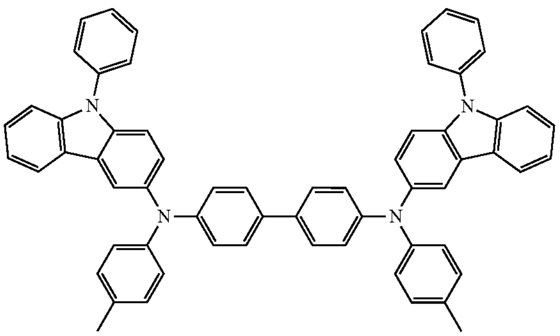
HT30
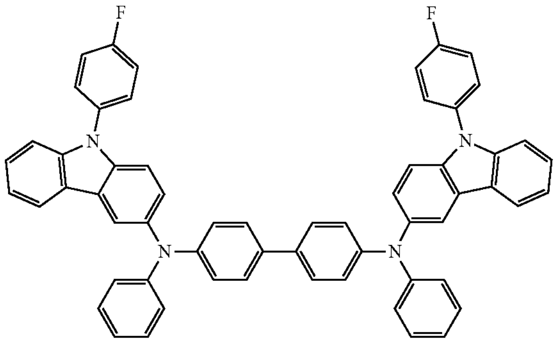
HT31
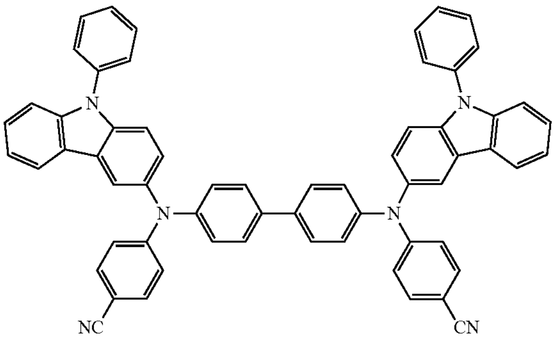
HT32
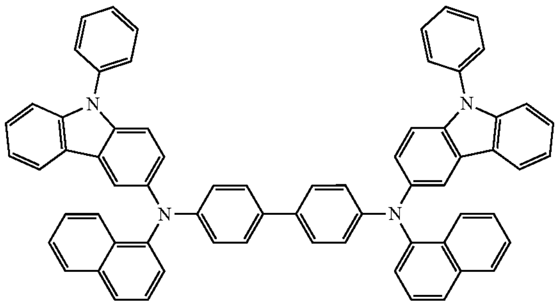
HT33
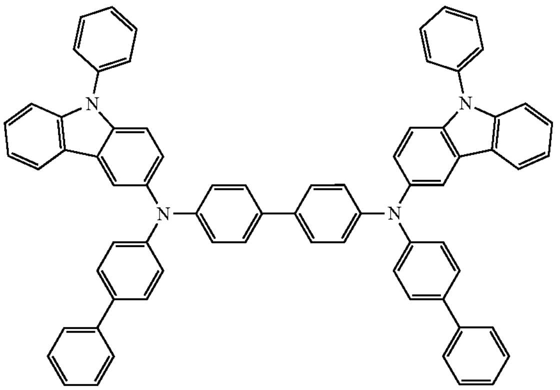
HT34
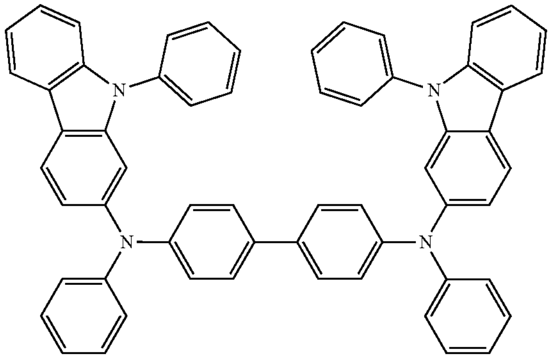
HT35
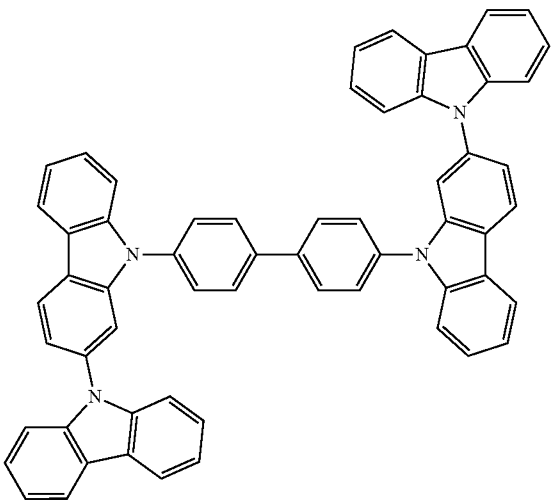

-continued
HT36
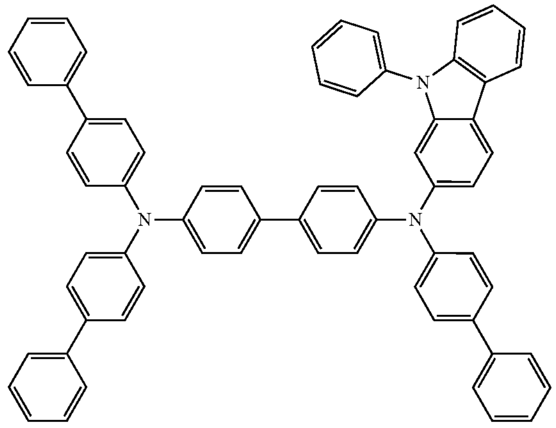
HT37
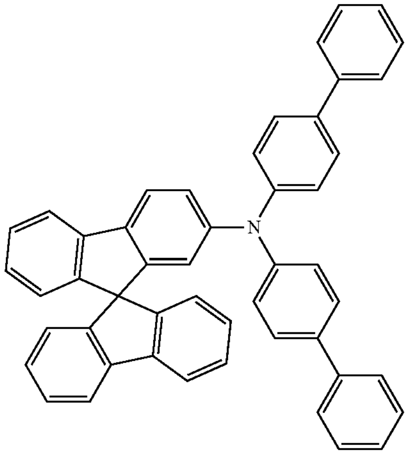
HT38
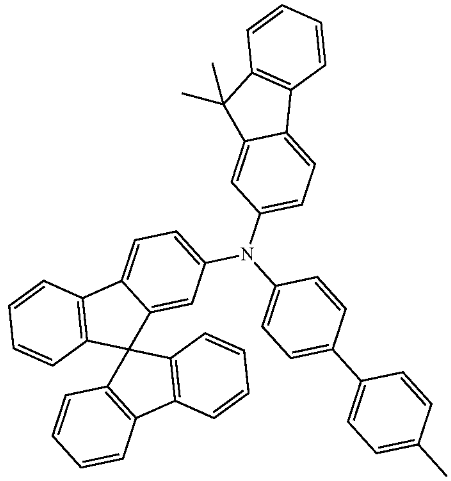
HT39
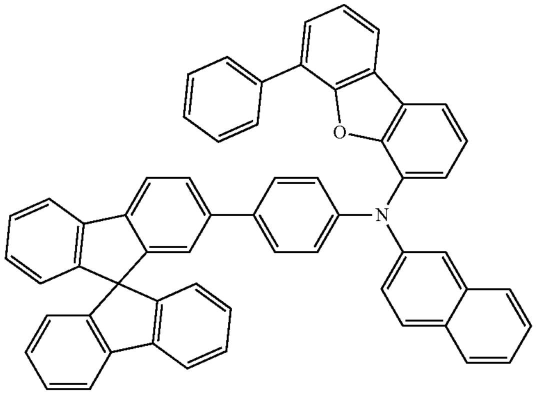
HT40
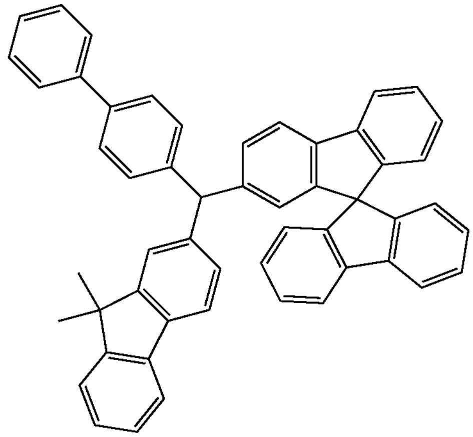
HT41
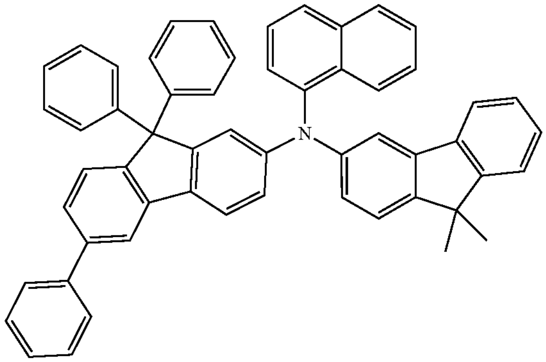

-continued
HT42
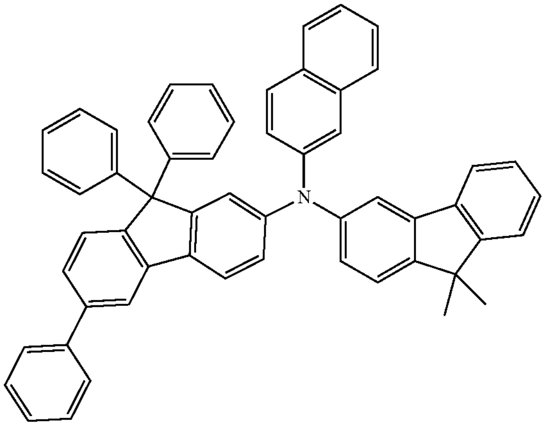
HT43
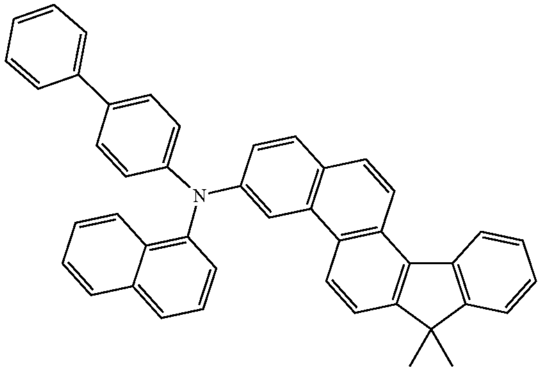
HT44
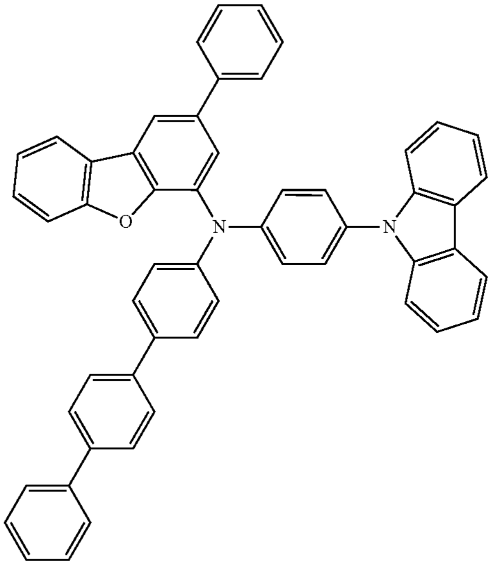
HT45
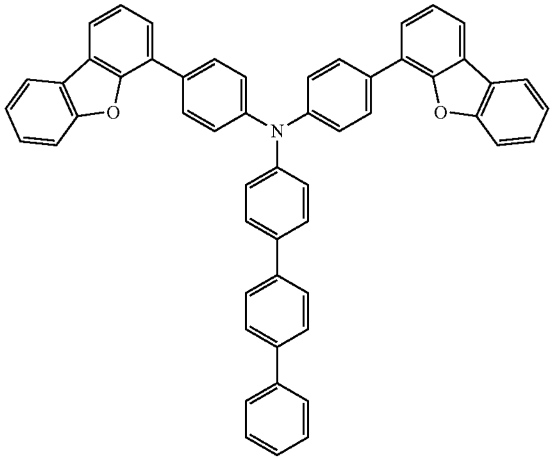
HT46
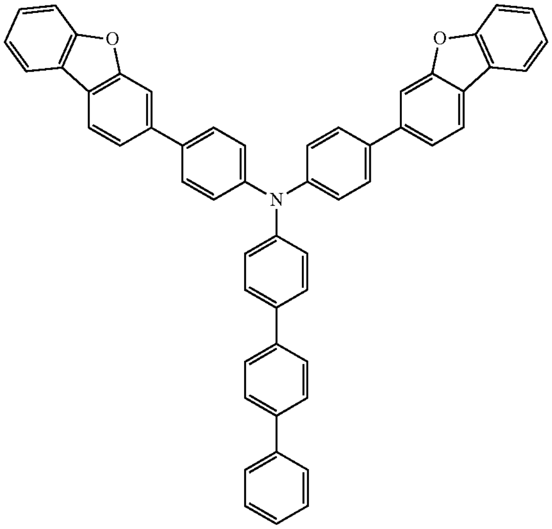
HT47
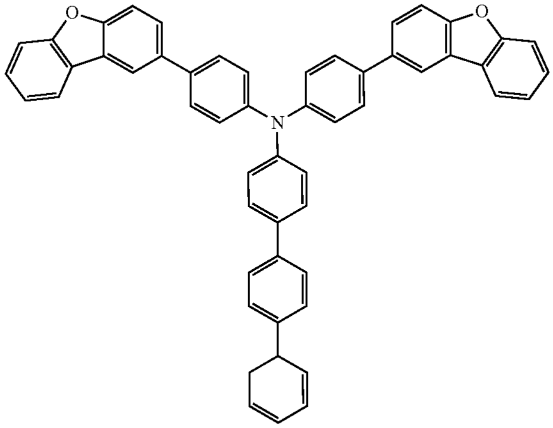

-continued

HT48

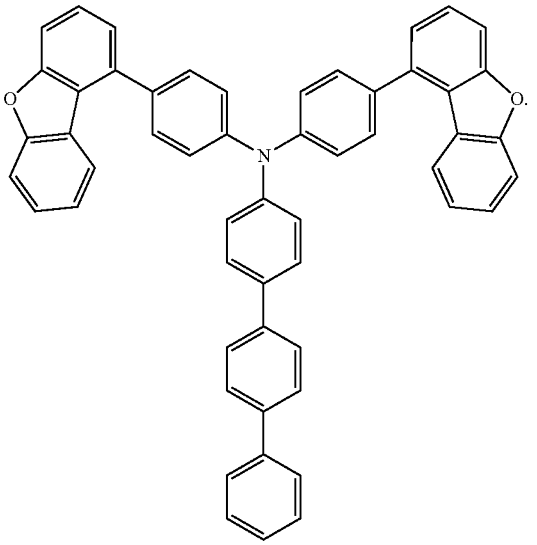

The thickness of the hole transport region may be in a range of about 100 (Angstroms) Å to about 10,000 Å, and in some embodiments, about 100 Å to about 1,000 Å. When the hole transport region includes at least one selected from a hole injection layer and a hole transport layer, the thickness of the hole injection layer may be in a range of about 100 Å to about 9,000 Å, and in some embodiments, about 100 Å to about 1,000 Å, and the thickness of the hole transport layer may be in a range of about 50 Å to about 3,000 Å, and in some embodiments, about 100 Å to about 1,500 Å. When the thicknesses of the hole transport region, the hole injection layer, and the hole transport layer are within any of the foregoing ranges, excellent hole transport characteristics may be obtained without a substantial increase in driving voltage.

The emission auxiliary layer may increase light emission efficiency by compensating for an optical resonance distance according to the wavelength of light emitted by an emission layer. The electron blocking layer may reduce or eliminate the flow of electrons from an electron transport region. The emission auxiliary layer and the electron blocking layer may include the aforementioned materials.

p-Dopant

The hole transport region may include a charge generating material as well as the aforementioned materials, to improve conductive properties of the hole transport region. The charge generating material may be substantially homogeneously or non-homogeneously dispersed in the hole transport region.

The charge generating material may include, for example, a p-dopant.

In some embodiments, the lowest unoccupied molecular orbital (LUMO) energy level of the p-dopant may be −3.5 eV or less.

The p-dopant may include at least one selected from a quinone derivative, a metal oxide, and a cyano group-containing compound, but the present disclosure is not limited thereto.

In some embodiments, the p-dopant may include:

a quinone derivative, such as tetracyanoquinodimethane (TCNQ) or 2,3,5,6-tetrafluoro-7,7,8,8-tetracyanoquinodimethane (F4-TCNQ);

a metal oxide, such as tungsten oxide or molybdenum oxide;

1,4,5,8,9,12-hexaazatriphenylene-hexacarbonitrile (HAT-CN);

F6-TNAP, Compound 201, and Compound 202; and a compound represented by Formula 221, but the present disclosure is not limited thereto:

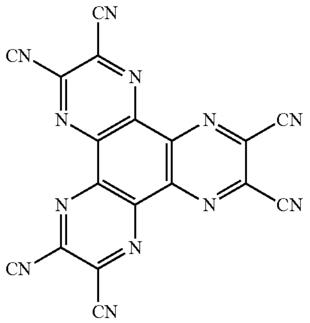

HAT-CN

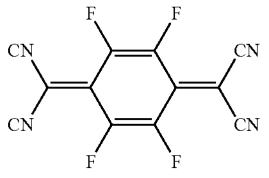

F4-TCNQ

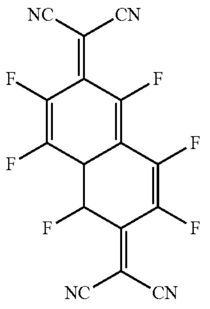

F6-TNAP

-continued

Compound 201

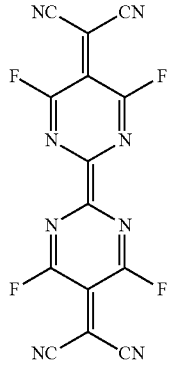

Compound 202

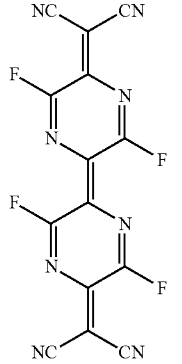

Formula 221

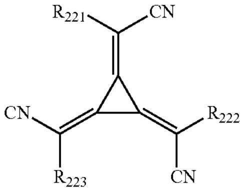

wherein, in Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may include at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Electron Transport Region in Organic Layer 150

The electron transport region may have i) a single-layered structure including (or consisting of) a single layer including (or consisting of) a single material, ii) a single-layered structure including (or consisting of) a single layer including a plurality of different materials, or iii) a multi-layered structure each having a plurality of layers, each having a plurality of different materials.

The electron transport region may include at least one selected from a buffer layer, a hole blocking layer, an electron control layer, an electron transport layer, and an electron injection layer, but the present disclosure is not limited thereto.

In some embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein layers of each structure are sequentially stacked on the emission layer in each stated order, but the present disclosure is not limited thereto.

The electron transport region (for example, the buffer layer, the hole blocking layer, the electron control layer, or the electron transport layer in the electron transport region) may include a metal-free compound including at least one π electron-depleted nitrogen-containing ring.

The term "π electron-depleted nitrogen-containing ring," as used herein, refers to a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which at least two 5-membered to 7-membered heteromonocyclic groups, each having at least one *—N=*' moiety, are condensed (e.g., combined together), or iii) a heteropolycyclic group in which at least one selected from a 5-membered to 7-membered heteromonocyclic group, each having at least one *—N=*' moiety, is condensed with (e.g., combined with) at least one $C_5$-$C_{60}$ carbocyclic group (or at least one $C_4$-$C_{30}$ carbocyclic group).

Examples of the π electron-depleted nitrogen-containing ring may include imidazole, pyrazole, thiazole, isothiazole, oxazole, isoxazole, pyridine, pyrazine, pyrimidine, pyridazine, indazole, purine, quinoline, isoquinoline, benzoquinoline, phthalazine, naphthyridine, quinoxaline, quinazoline, cinnoline, phenanthridine, acridine, phenanthroline, phenazine, benzimidazole, isobenzothiazole, benzoxazole, isobenzoxazole, triazole, tetrazole, oxadiazole, triazine, thiadiazole, imidazopyridine, imidazopyrimidine, and azacarbazole, but the present disclosure is not limited thereto.

In some embodiments, the electron transport region may include a compound represented by Formula 601:

$$[Ar_{601}]_{xe11}\text{-}[(L_{601})_{xe1}\text{-}R_{601}]_{xe21} \qquad \text{Formula 601}$$

wherein, in Formula 601, $Ar_{601}$ may be selected from a substituted or unsubstituted $C_5$-$C_{60}$ carbocyclic group and a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(═O)($Q_{601}$), —S(═O)$_2$($Q_{601}$), and —P(═O)($Q_{601}$)($Q_{602}$), wherein $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In some embodiments, at least one selected from $Ar_{601}$(s) in the number of xe11 and $R_{601}$(s) in the number of xe21 may include the π electron-depleted nitrogen-containing ring.

In some embodiments, in Formula 601, ring $Ar_{601}$ may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(═O)$_2$($Q_{31}$), and —P(═O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or greater, at least two $Ar_{601}$(s) may be bound via a single bond.

In one or more embodiments, $Ar_{601}$ in Formula 601 may be an anthracene group.

In some embodiments, the compound represented by Formula 601 may be represented by Formula 601-1:

Formula 601-1

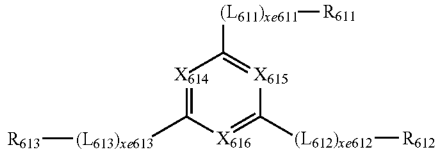

wherein, in Formula 601-1, $X_{614}$ may be N or C($R_{614}$), $X_{615}$ may be N or C($R_{615}$), $X_{616}$ may be N or C($R_{616}$), at least one selected from $X_{614}$ to $X_{616}$ may be N, $L_{611}$ to $L_{613}$ may each independently be understood by referring to the description of $L_{601}$ provided herein, xe611 to xe613 may each independently be understood by referring to the description of xe1 provided herein, $R_{611}$ to $R_{613}$ may each independently be understood by referring to the description of $R_{601}$ provided herein, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In some embodiments, in Formulae 601 and 601-1, $L_{601}$ and $L_{611}$ to $L_{613}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but the present disclosure is not limited thereto.

In one or more embodiments, in Formulae 601 and 601-1, xe1 and xe611 to xe613 may each independently be 0, 1, or 2.

In one or more embodiments, in Formulae 601 and 601-1, $R_{601}$ and $R_{611}$ to $R_{613}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(═O)$_2$($Q_{601}$) and —P(═O)($Q_{601}$)($Q_{602}$), wherein $Q_{601}$ and $Q_{602}$ may respectively be understood by referring to the descriptions of $Q_{601}$ and $Q_{602}$ provided herein.

The electron transport region may include at least one compound selected from Compounds ET1 to ET39, but the present disclosure is not limited thereto:

ET1

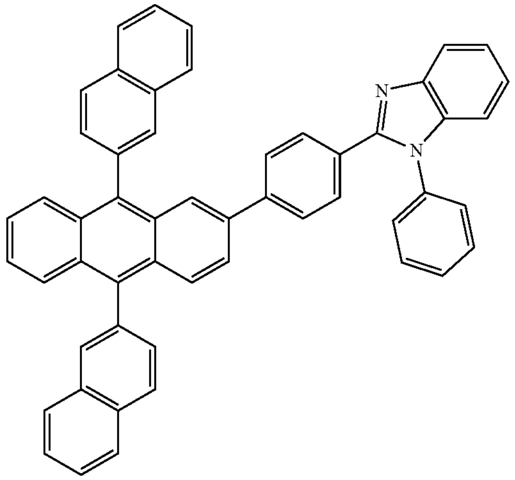

-continued

ET2

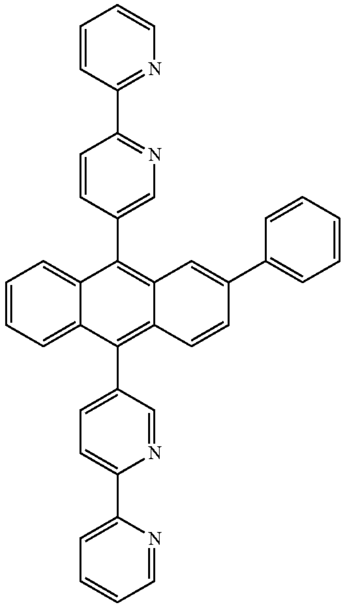

ET3

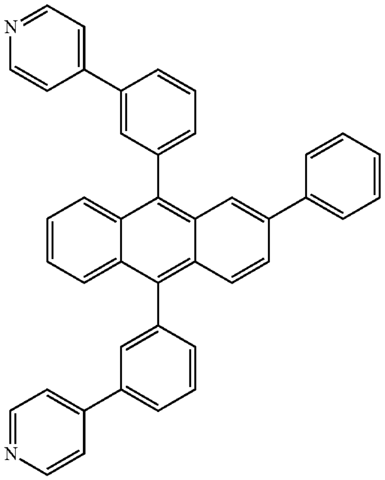

ET4

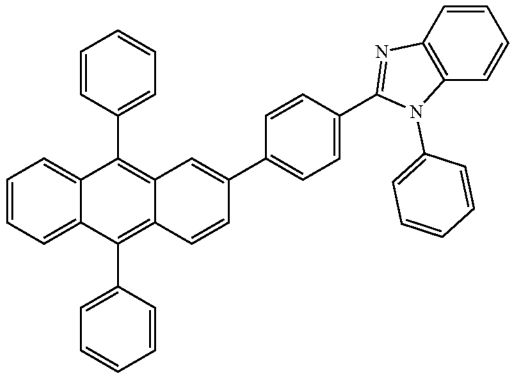

-continued
ET5
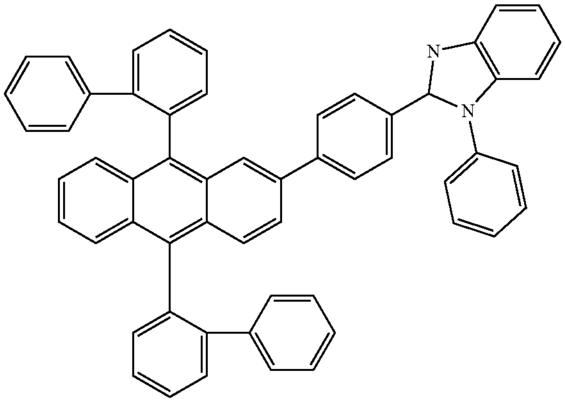
ET6
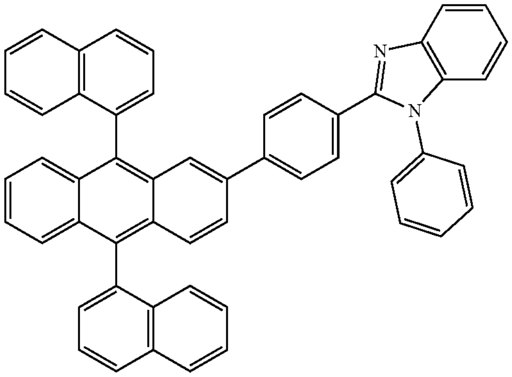
ET7
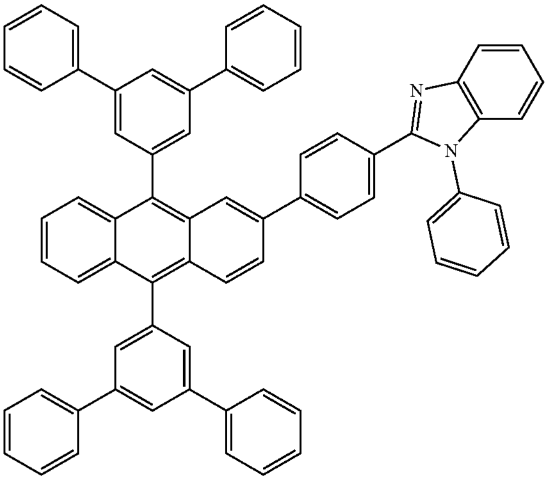
-continued
ET8
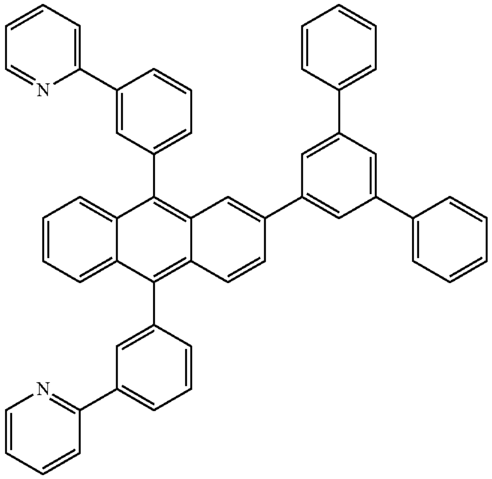
ET9
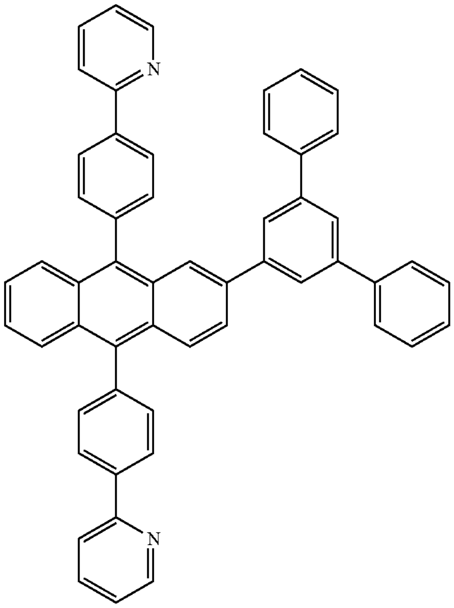

-continued
ET10
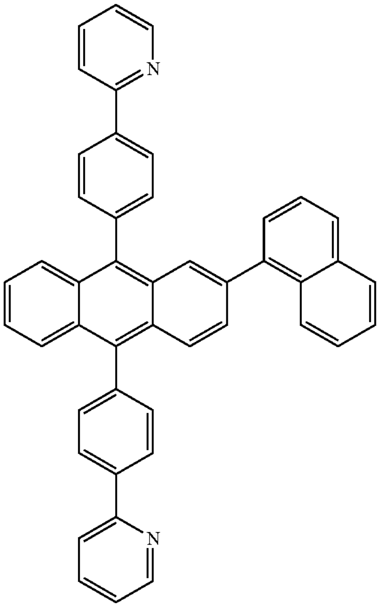
ET11
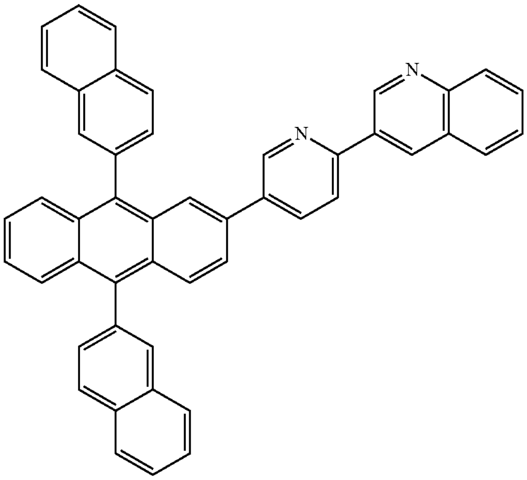
ET12
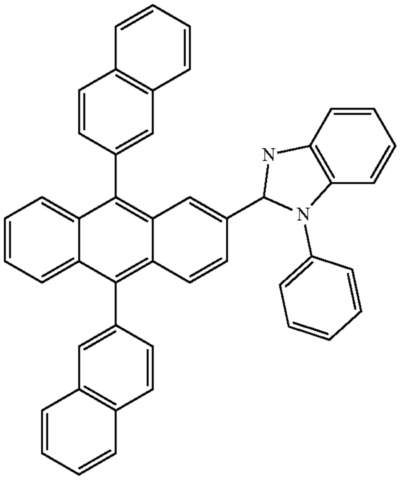
-continued
ET13
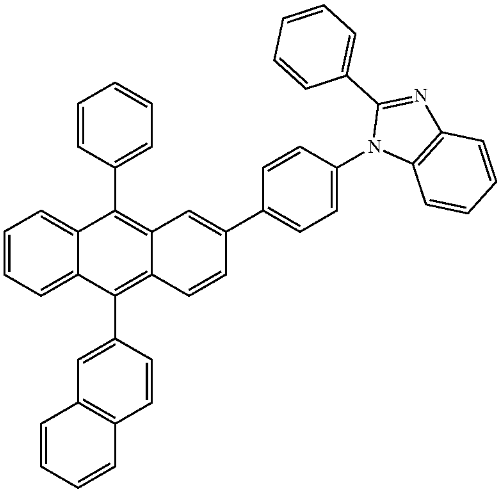
ET14
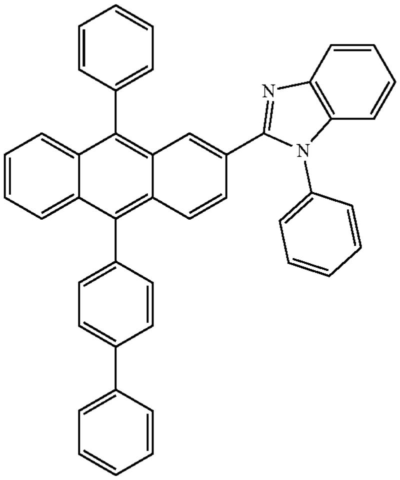
ET15
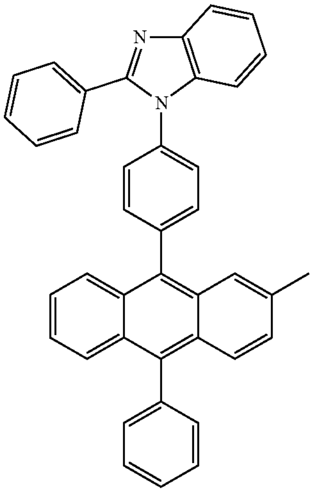

-continued
ET16
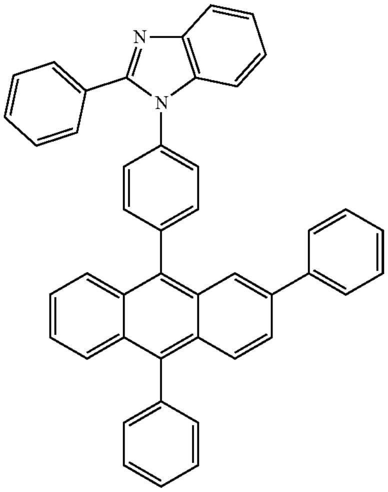
ET17
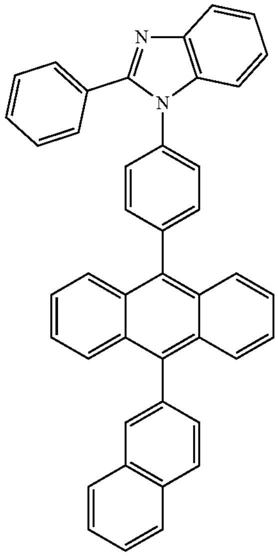
ET18
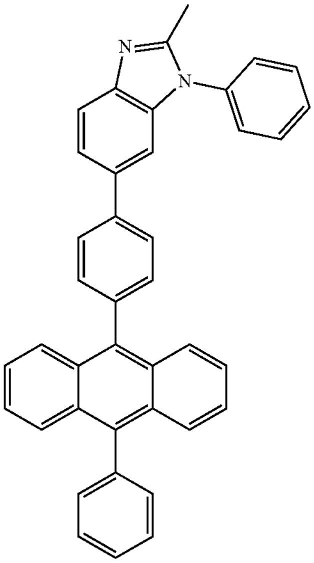
-continued
ET19
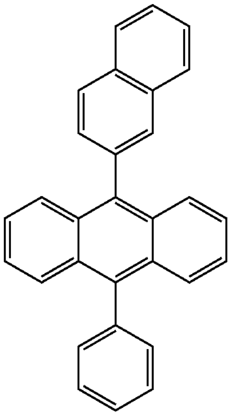
ET20
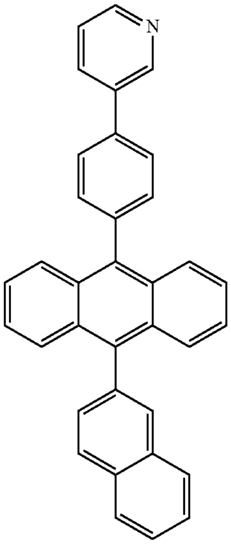
ET21
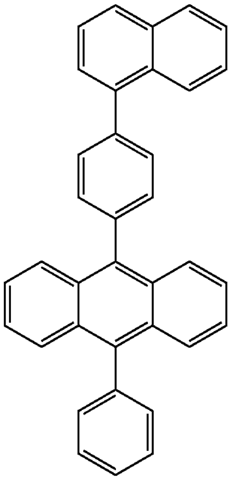

ET22
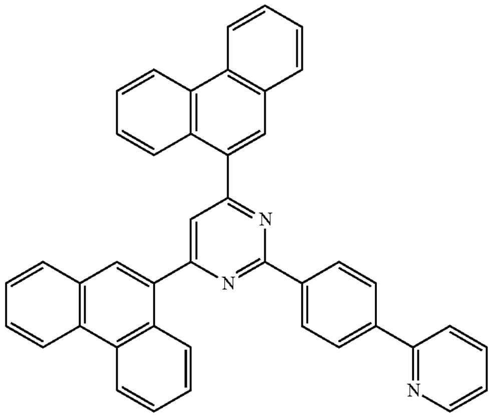
ET23
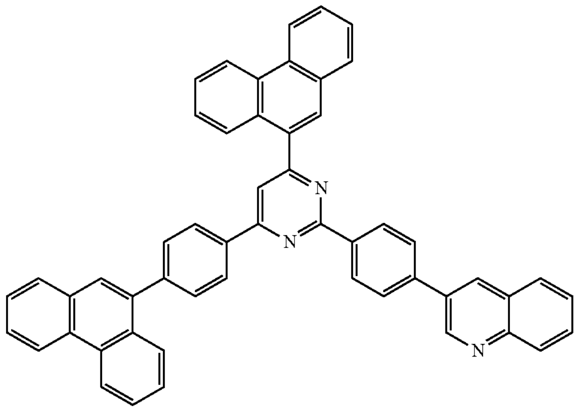
ET24
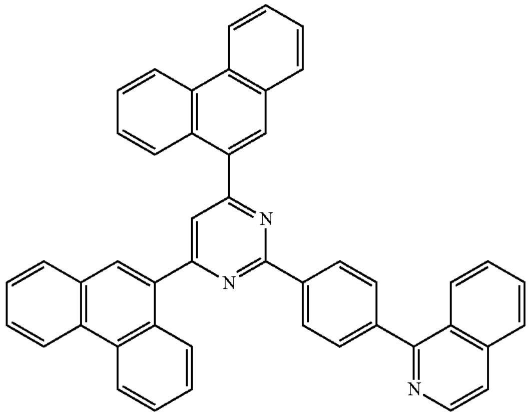
ET25
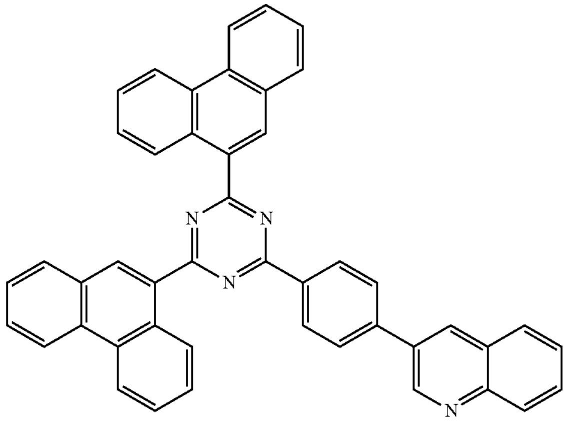
ET26
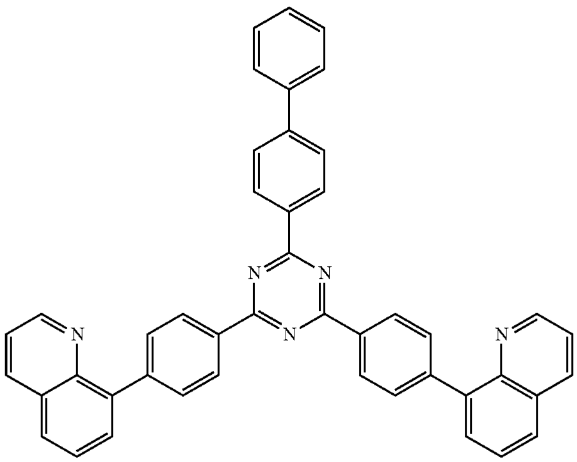
ET27
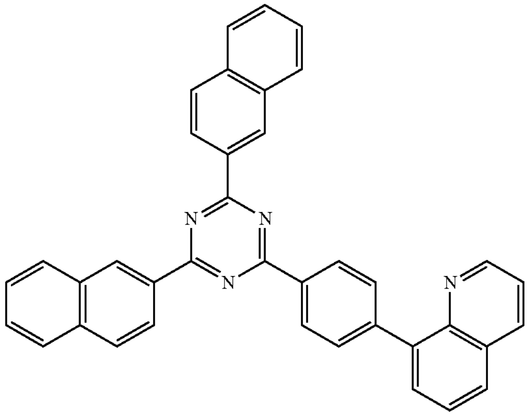

ET28
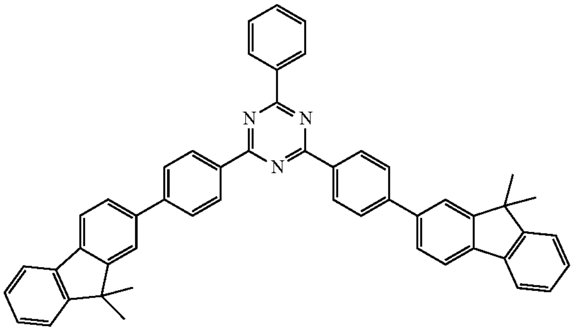
ET29
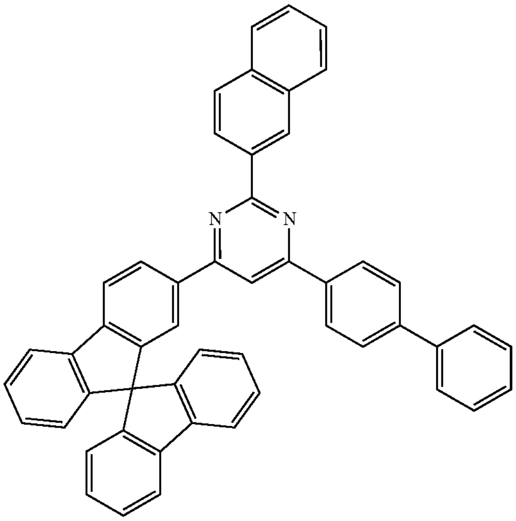
ET30
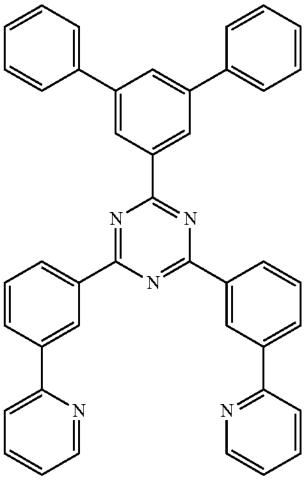
ET31
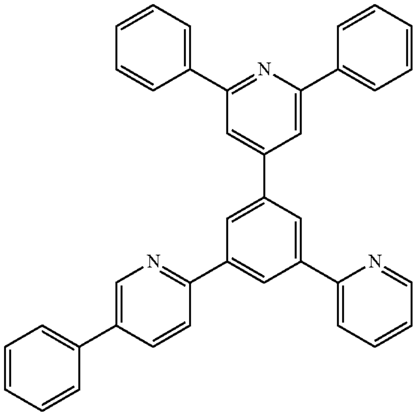
ET32
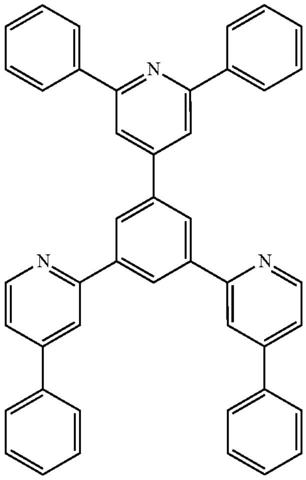
ET33
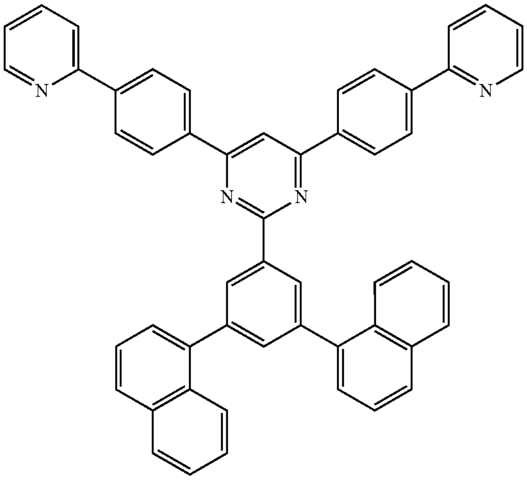

-continued

ET34

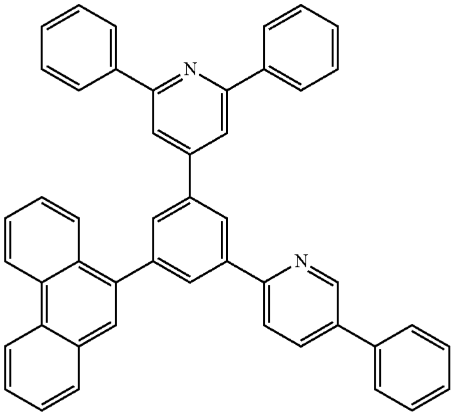

ET35

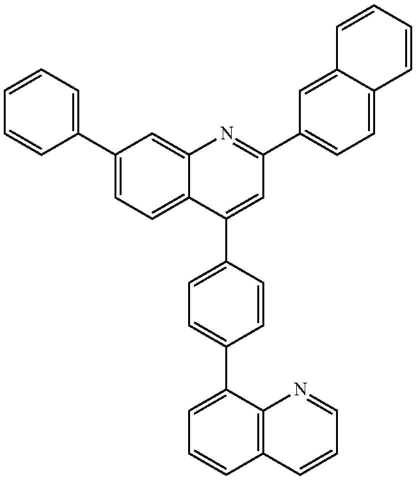

ET36

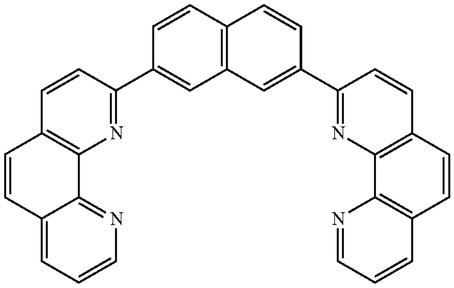

ET37

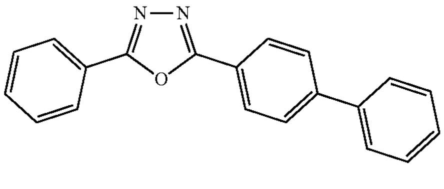

ET38

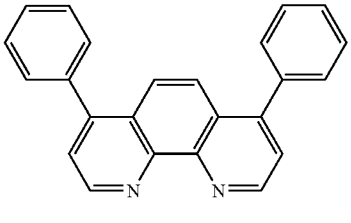

-continued

ET39

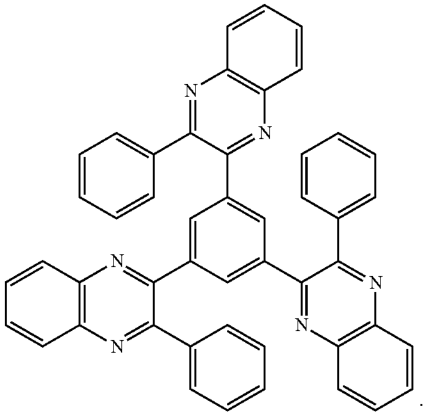

In some embodiments, the electron transport region may include at least one compound selected from 2,9-dimethyl-4,7-diphenyl-1,10-phenanthroline (BCP), 4,7-diphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), NTAZ, 2,2',2"-(1,3,5-benzinetriyl)-tris(1-phenyl-1-H-benzimidazole) (TPBi), 4,4'-bis(4,6-diphenyl-1,3,5-triazin-2-yl) biphenyl (BTB), and 1,3,5-tris(3-pyridyl-3-phenyl) benzene (TmPyPB):

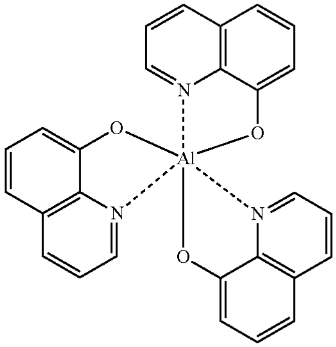

$Alq_3$

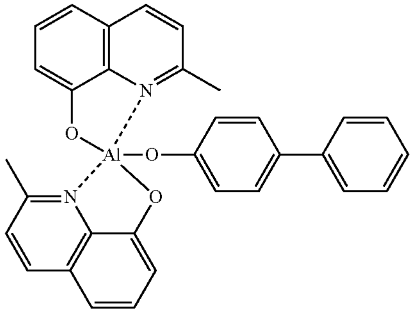

BAlq

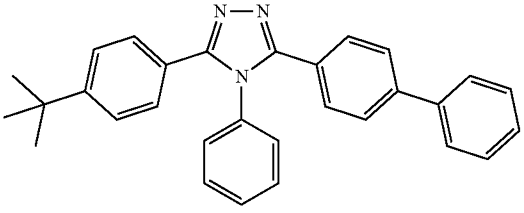

TAZ

-continued

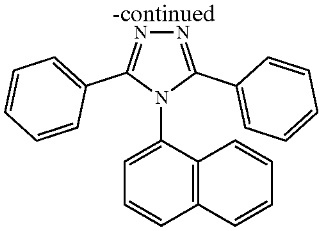

NTAZ

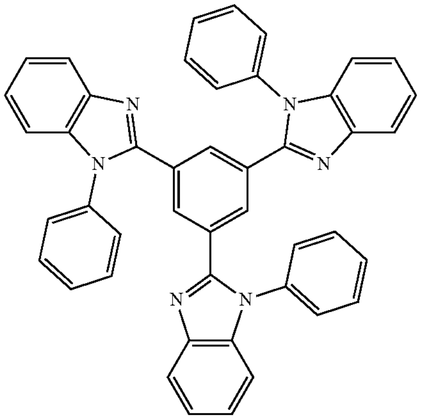

TPBi

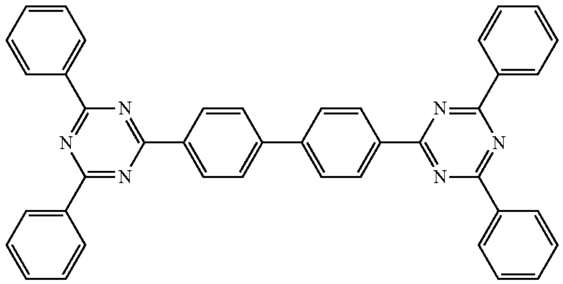

BTB

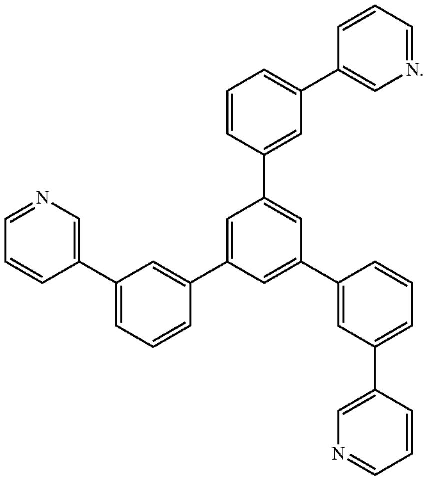

TmPyPB

The thicknesses of the buffer layer, the hole blocking layer, or the electron control layer may each independently be in a range of about 10 Å to about 1,000 Å, and in some embodiments, about 30 Å to about 300 Å. When the thicknesses of the buffer layer, the hole blocking layer or the electron control layer are within any of the foregoing ranges, excellent hole blocking characteristics or excellent electron controlling characteristics may be obtained without a substantial increase in driving voltage.

The thickness of the electron transport layer may be in a range of about 100 Å to about 3,000 Å, and in some embodiments, about 150 Å to about 500 Å. When the thickness of the electron transport layer is within any of the foregoing ranges, excellent electron transport characteristics may be obtained without a substantial increase in driving voltage.

The electron transport region (for example, the electron transport layer in the electron transport region) may further include, in addition to the materials described above, a metal-containing material.

The metal-containing material may include at least one selected from an alkali metal complex and an alkaline earth metal complex. The alkali metal complex may include a metal ion selected from a lithium (Li) ion, a sodium (Na) ion, a potassium (K) ion, a rubidium (Rb) ion, and a cesium (Cs) ion. The alkaline earth metal complex may include a metal ion selected from a beryllium (Be) ion, a magnesium (Mg) ion, a calcium (Ca) ion, a strontium (Sr) ion, and a barium (Ba) ion. Each ligand coordinated with the metal ion of the alkali metal complex and the alkaline earth metal complex may independently be selected from hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, and cyclopentadiene, but the present disclosure is not limited thereto.

For example, the metal-containing material may include a Li complex. The Li complex may include, e.g., Compound ET-D1 (LiQ) or Compound ET-D2:

ET-D1

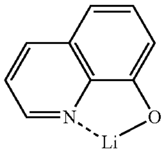

ET-D2

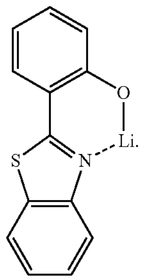

The electron transport region may include an electron injection layer that facilitates injection of electrons from the second electrode 190. The electron injection layer may be in direct contact (e.g., physical contact) with the second electrode 190.

The electron injection layer may have i) a single-layered structure including (or consisting of) a single layer including (or consisting of) a single material, ii) a single-layered structure including (or consisting of) a single layer including a plurality of different materials, or iii) a multi-layered structure having a plurality of layers, each including a plurality of different materials.

The electron injection layer may include an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof.

The alkali metal may be selected from Li, Na, K, Rb, and Cs. In some embodiments, the alkali metal may be Li, Na, or Cs. In one or more embodiments, the alkali metal may be Li or Cs, but the present disclosure is not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth metal compound, and the rare earth metal compound may each independently be selected from oxides and halides (e.g., fluorides, chlorides, bromides, or iodines) of the alkali metal, the alkaline earth metal, and the rare earth metal, respectively.

The alkali metal compound may be selected from alkali metal oxides, such as $Li_2O$, $Cs_2O$, or $K_2O$, and alkali metal halides, such as LiF, NaF, CsF, KF, LiI, NaI, CsI, or KI. In some embodiments, the alkali metal compound may be selected from LiF, $Li_2O$, NaF, LiI, NaI, CsI, and KI, but the present disclosure is not limited thereto.

The alkaline earth-metal compound may be selected from alkaline earth-metal compounds, such as BaO, SrO, CaO, $Ba_xSr_{1-x}O$ (wherein $0<x<1$), and $Ba_xCa_{1-x}O$ (wherein $0<x<1$). In some embodiments, the alkaline earth metal compound may be selected from BaO, SrO, and CaO, but the present disclosure is not limited thereto.

The rare earth metal compound may be selected from $YbF_3$, $ScF_3$, $Sc_2O_3$, $Y_2O_3$, $Ce_2O_3$, $GdF_3$, and $TbF_3$. In some embodiments, the rare earth metal compound may be selected from $YbF_3$, $ScF_3$, $TbF_3$, $YbI_3$, $ScI_3$, and $TbI_3$, but the present disclosure is not limited thereto.

The alkali metal complex, the alkaline earth metal complex, and the rare earth metal complex may each include ions of the above-described alkali metal, alkaline earth metal, and rare earth metal. Each ligand coordinated with the metal ion of the alkali metal complex, the alkaline earth metal complex, and the rare earth metal complex may independently be selected from hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, and cyclopentadiene, but the present disclosure is not limited thereto.

The electron injection layer may include (or consist of) an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof, as described above. In some embodiments, the electron injection layer may further include an organic material. When the electron injection layer further includes an organic material, the alkali metal, the alkaline earth metal, the rare earth metal, the alkali metal compound, the alkaline earth metal compound, the rare earth metal compound, the alkali metal complex, the alkaline earth metal complex, the rare earth metal complex, or a combination thereof may be homogeneously or non-homogeneously dispersed in a matrix including the organic material.

The thickness of the electron injection layer may be in a range of about 1 Å to about 100 Å, and in some embodiments, about 3 Å to about 90 Å. When the thickness of the electron injection layer is within any of the foregoing ranges, excellent electron injection characteristics may be obtained without a substantial increase in driving voltage.

n-Dopant

The electron transport region may include a charge generating material such as an n-dopant as well as the aforementioned materials, to improve conductive properties of the hole transport region. The charge generating material may be substantially homogeneously or non-homogeneously dispersed in the electron transport region.

The n-dopant may be a molecule and/or a neutral radical having a highest occupied molecular orbital (HOMO) of −3.3 eV or higher, or for example, −2.8 eV or higher (higher positive number). The HOMO of the n-dopant may be determined by cyclic voltammetry measurement of the oxidation potential.

In some embodiments, the n-dopant may include at least one selected from Compounds 701 to 706, but the present disclosure is not limited thereto:

701

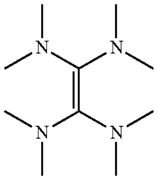

702

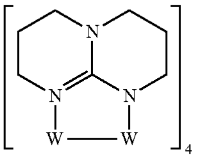

703

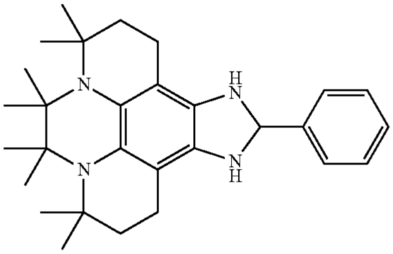

704

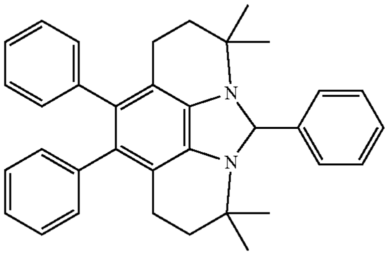

-continued

705

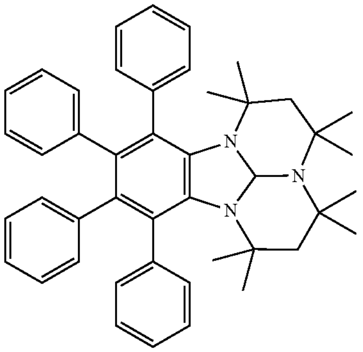

706

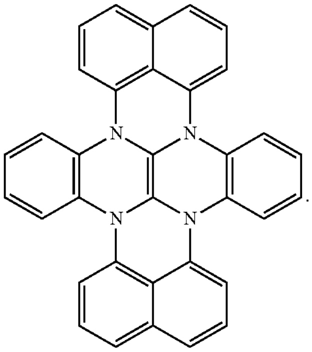

Second Electrode 190

The second electrode 190 may be on the organic layer 150. In an embodiment, the second electrode 190 may be a cathode that is an electron injection electrode. In this embodiment, a material for forming the second electrode 190 may be a material having a low work function, for example, a metal, an alloy, an electrically conductive compound, or a combination thereof.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but the present disclosure is not limited thereto. The second electrode 190 may be a transmissive electrode, a semi-transmissive electrode, or a reflective electrode.

The second electrode 190 may have a single-layered structure, or a multi-layered structure including two or more layers.

Figure 2:
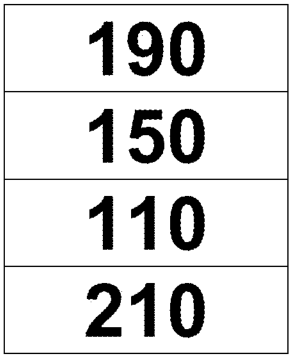
FIG. 2 is a schematic cross-sectional view of an embodiment of an organic light-emitting device.
Figure 3:
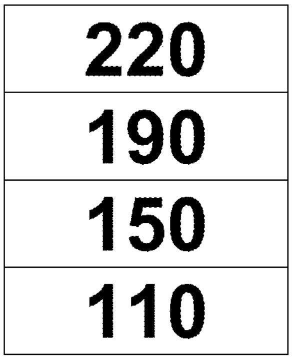
FIG. 3 is a schematic cross-sectional view of an embodiment of an organic light-emitting device.
Figure 4:
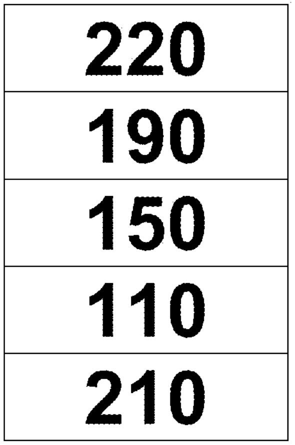
FIG. 4 is a schematic cross-sectional view of an embodiment of an organic light-emitting device.

Description of FIGS. 2 to 4

Referring to FIG. 2, an organic light-emitting device 20 has a first capping layer 210, the first electrode 110, the organic layer 150, and the second electrode 190 structure, wherein the layers are sequentially stacked in this stated order. Referring to FIG. 3, an organic light-emitting device 30 has the first electrode 110, the organic layer 150, the second electrode 190, and a second capping layer 220 structure, wherein the layers are sequentially stacked in this stated order. Referring to FIG. 4, an organic light-emitting device 40 has the first capping layer 210, the first electrode 110, the organic layer 150, the second electrode 190, and the second capping layer 220 structure, wherein the layers are stacked in this stated order.

The first electrode 110, the organic layer 150, and the second electrode 190 illustrated in FIGS. 2 to 4 may be substantially the same as those illustrated in FIG. 1.

In the organic light-emitting devices 20 and 40, light emitted from the emission layer in the organic layer 150 may pass through the first electrode 110 (which may be a semi-transmissive electrode or a transmissive electrode) and through the first capping layer 210 to the outside. In the organic light-emitting devices 30 and 40, light emitted from the emission layer in the organic layer 150 may pass through the second electrode 190 (which may be a semi-transmissive electrode or a transmissive electrode) and through the second capping layer 220 to the outside.

The first capping layer 210 and the second capping layer 220 may improve the external luminescence efficiency based on the principle of constructive interference.

The first capping layer 210 and the second capping layer 220 may each independently have a refractive index of 1.6 or greater at a wavelength of 589 nm.

The first capping layer 210 and the second capping layer 220 may each independently be a capping layer including an organic material, an inorganic capping layer including an inorganic material, or a composite capping layer including an organic material and an inorganic material.

At least one selected from the first capping layer 210 and the second capping layer 220 may each independently include at least one material selected from carbocyclic compounds, heterocyclic compounds, amine-based compounds, porphine derivatives, phthalocyanine derivatives, naphthalocyanine derivatives, alkali metal complexes, and alkaline earth metal complexes. The carbocyclic compound, the heterocyclic compound, and the amine group-containing compound may optionally be substituted with a substituent containing at least one element selected from O, N, S, Se, Si, F, Cl, Br, and I. In some embodiments, at least one selected from the first capping layer 210 and the second capping layer 220 may each independently include an amine-based compound.

In one or more embodiments, at least one selected from the first capping layer 210 and the second capping layer 220 may each independently include a compound represented by Formula 201 or a compound represented by 202.

In one or more embodiments, at least one selected from the first capping layer 210 and the second capping layer 220 may each independently include a compound selected from Compounds HT28 to HT33 and Compound CP1 to CP5, but the present disclosure is not limited thereto:

CP1

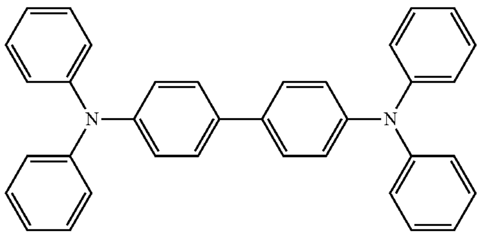

CP2

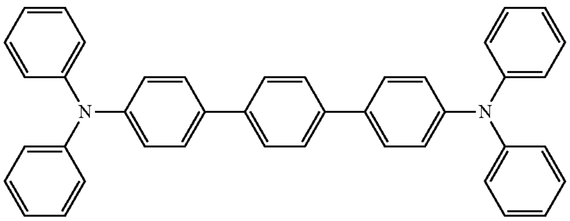

-continued

CP3

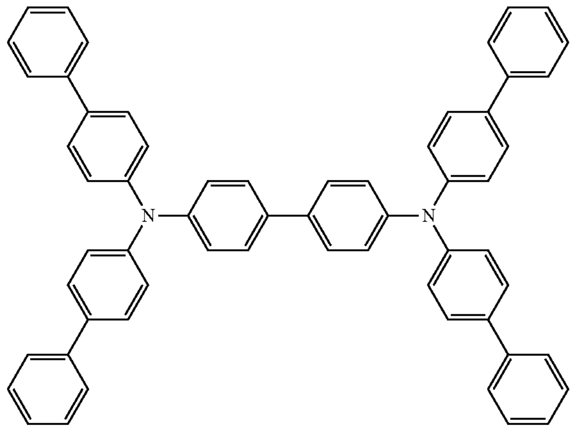

CP4

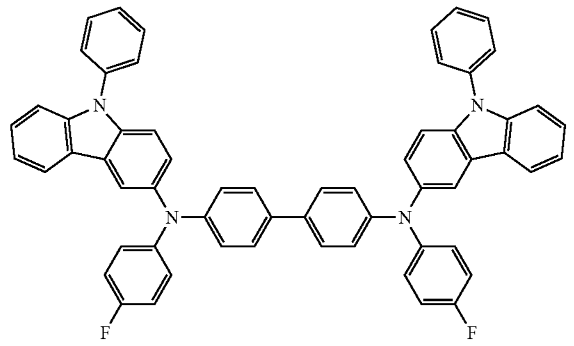

CP5

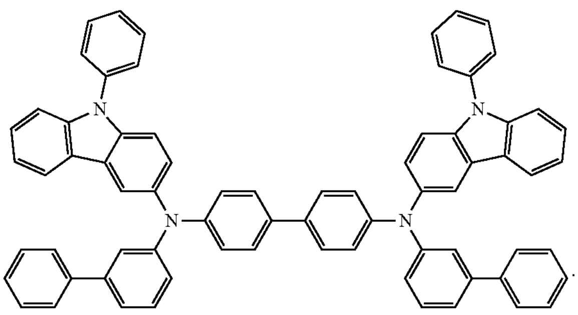

Hereinbefore, the organic light-emitting device has been described with reference to FIGS. 1 to 4, but the present disclosure is not limited thereto.

The layers constituting the hole transport region, the emission layer, and the layers constituting the electron transport region may be formed in a set or specific region by using one or more suitable methods such as vacuum deposition, spin coating, casting, Langmuir-Blodgett (LB) deposition, ink-jet printing, laser printing, and/or laser-induced thermal imaging.

When the layers constituting the hole transport region, the emission layer, and the layers constituting the electron transport region are each formed by vacuum deposition, the vacuum deposition may be performed at a deposition temperature in a range of about 100° C. to about 500° C. at a vacuum degree in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

When the layers constituting the hole transport region, the emission layer, and the layers constituting the electron transport region are each formed by spin coating, the spin coating may be performed at a coating rate of about 2,000 revolutions per minute (rpm) to about 5,000 rpm and at a heat treatment temperature of about 80° C.° C. to about 200° C., depending on the material to be included in each layer and the structure of each layer to be formed.

Electronic Apparatus

The organic light-emitting device may be included in various suitable electronic apparatuses. In some embodiments, an electronic apparatus including the organic light-emitting device may be an emission apparatus or an authentication apparatus.

The electronic apparatus (e.g., an emission apparatus) may further include, in addition to the organic light-emitting device, i) a color filter, ii) a color-conversion layer, or iii) a color filter and a color-conversion layer. The color filter and/or the color-conversion layer may be on at least one traveling direction of light emitted from the organic light-emitting device. For example, light emitted from the organic light-emitting device may be blue light or white light. The organic light-emitting device may be understood by referring to the description of the organic light-emitting device provided herein. In some embodiments, the color-conversion layer may include a quantum dot. The quantum dot may be, for example, the quantum dot described herein.

The electronic apparatus may include a first substrate. The first substrate may include a plurality of sub-pixel areas, the color filter may include a plurality of color filter areas respectively corresponding to the plurality of sub-pixel areas, and the color-conversion layer may include a plurality of color-conversion areas respectively corresponding to the plurality of sub-pixel areas.

A pixel defining film may be located between the plurality of sub-pixel areas to define each sub-pixel area.

The color filter may further include a plurality of color filter areas and light-blocking patterns between the plurality of color filter areas, and the color-conversion layer may further include a plurality of color-conversion areas and light-blocking patterns between the plurality of color-conversion areas.

The plurality of color filter areas (or a plurality of color-conversion areas) may include: a first area emitting first color light; a second area emitting second color light; and/or a third area emitting third color light, and the first color light, the second color light, and/or the third color light may have different maximum emission wavelengths. In some embodiments, the first color light may be red light, the second color light may be green light, and the third color light may be blue light. In some embodiments, the plurality of color filter areas (or the plurality of color-conversion areas) may each include a quantum dot. In some embodiments, the first area may include a red quantum dot, the second area may include a green quantum dot, and the third area may not include a quantum dot. The quantum dot may be understood by referring to the description of the quantum dot provided herein. The first area, the second area, and/or the third area may each further include an emitter.

In some embodiments, the organic light-emitting device may emit first light, the first area may absorb the first light to emit 1-1 color light, the second area may absorb the first light to emit 2-1 color light, and the third area may absorb the first light to emit 3-1 color light. In this embodiment, the 1-1 color light, the 2-1 color light, and the 3-1 color light may each have a different maximum emission wavelength. In some embodiments, the first light may be blue light, the 1-1 color light may be red light, the 2-1 color light may be green light, and the 3-1 light may be blue light.

The electronic apparatus may further include a thin-film transistor, in addition to the organic light-emitting device. The thin-film transistor may include a source electrode, a drain electrode, and an activation layer, wherein one selected from the source electrode and the drain electrode may be electrically coupled to one of the first electrode and the second electrode of the organic light-emitting device.

The thin-film transistor may further include a gate electrode, a gate insulating film, and/or the like.

The activation layer may include a crystalline silicon, an amorphous silicon, an organic semiconductor, and/or an oxide semiconductor.

The electronic apparatus may further include a sealing portion for sealing the organic light-emitting device. The sealing portion may be located between the color filter and/or the color-conversion layer and the organic light-emitting device. The sealing portion may allow light to pass to the outside from the organic light-emitting device and prevent or reduce the permeation of the air and moisture into the organic light-emitting device at the same time. The sealing portion may be a sealing substrate including a transparent glass and/or a plastic substrate. The sealing portion may be a thin-film encapsulating layer including at least one selected from an organic layer and an inorganic layer. When the sealing portion is a thin film encapsulating layer, the electronic apparatus may be flexible.

In addition to the color filter and/or the color-conversion layer, various suitable functional layers may be on the sealing portion depending on the use of an electronic apparatus. Examples of the functional layer may include a touch screen layer, a polarization layer, and/or the like. The touch screen layer may be a resistive touch screen layer, a capacitive touch screen layer, and/or an infrared beam touch screen layer. The authentication apparatus may be, for example, a biometric authentication apparatus that identifies an individual according biometric information (e.g., a fingertip, a pupil, and/or the like).

The authentication apparatus may further include a biometric information collecting unit, in addition to the organic light-emitting device described above.

The electronic apparatus may be applicable to various suitable displays, an optical source, lighting, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, and/or an endoscope display device), a fish finder, various suitable measurement devices, gauges (e.g., gauges of an automobile, an airplane, and/or a ship), and/or a projector.

General Definitions of Substituents

The term "$C_1$-$C_{60}$ alkyl group," as used herein, refers to a linear or branched aliphatic hydrocarbon monovalent group having 1 to 60 carbon atoms. Examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group," as used herein, refers to a divalent group having substantially the same structure as the $C_1$-$C_{60}$ alkyl group.

The term "$C_2$-$C_{60}$ alkenyl group," as used herein, refers to a hydrocarbon group having at least one carbon-carbon double bond at a main chain (e.g., in the middle) or at a terminal end (e.g., the terminus) of the $C_2$-$C_{60}$ alkyl group. Examples thereof include an ethenyl group, a propenyl group, and a butenyl group. The term "$C_2$-$C_{60}$ alkenylene group," as used herein, refers to a divalent group having substantially the same structure as the $C_2$-$C_{60}$ alkenyl group.

The term "$C_2$-$C_{60}$ alkynyl group," as used herein, refers to a hydrocarbon group having at least one carbon-carbon triple bond at a main chain (e.g., in the middle) or at a terminal end (e.g., the terminus) of the $C_2$-$C_{60}$ alkyl group. Examples thereof include an ethynyl group and a propynyl group. The term "$C_2$-$C_{60}$ alkynylene group," as used herein, refers to a divalent group having substantially the same structure as the $C_2$-$C_{60}$ alkynyl group.

The term "$C_1$-$C_{60}$ alkoxy group," as used herein, refers to a monovalent group represented by —$OA_{101}$ (wherein $A_{101}$ is a $C_1$-$C_{10}$ alkyl group). Examples thereof include a methoxy group, an ethoxy group, and an isopropyloxy group.

The term "$C_3$-$C_{10}$ cycloalkyl group," as used herein, refers to a monovalent monocyclic saturated hydrocarbon group including 3 to 10 carbon atoms. Examples thereof include a cyclopropyl group, a cyclobutyl group, a cyclopentyl group, a cyclohexyl group, and a cycloheptyl group. The term "$C_3$-$C_{10}$ cycloalkylene group," as used herein, refers to a divalent group having substantially the same structure as the $C_3$-$C_{10}$ cycloalkyl group.

The term "$C_1$-Cia heterocycloalkyl group," as used herein, refers to a monovalent monocyclic group including at least one heteroatom selected from N, O, Si, P, and S as a ring-forming atom and 1 to 10 carbon atoms. Examples thereof include a 1,2,3,4-oxatriazolidinyl group, a tetrahydrofuranyl group, and a tetrahydrothiophenyl group. The term "$C_1$-$C_{10}$ heterocycloalkylene group," as used herein, refers to a divalent group having substantially the same structure as the $C_1$-$C_{10}$ heterocycloalkyl group.

The term "$C_3$-$C_{10}$ cycloalkenyl group," as used herein, refers to a monovalent monocyclic group that has 3 to 10 carbon atoms and at least one double bond in its ring, and is not aromatic. Examples thereof include a cyclopentenyl group, a cyclohexenyl group, and a cycloheptenyl group. The term "$C_3$-$C_{10}$ cycloalkenylene group," as used herein, refers to a divalent group having substantially the same structure as the $C_3$-$C_{10}$ cycloalkenyl group.

The term "$C_1$-$C_{10}$ heterocycloalkenyl group," as used herein, refers to a monovalent monocyclic group including at least one heteroatom selected from N, O, Si, P, and S as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkylene group," as used herein, refers to a divalent group having substantially the same structure as the $C_1$-$C_{10}$ heterocycloalkyl group.

The term "$C_6$-$C_{60}$ aryl group," as used herein, refers to a monovalent group having a carbocyclic aromatic system having 6 to 6 carbon atoms. The term "$C_6$-$C_{60}$ arylene group," as used herein, refers to a divalent group having a carbocyclic aromatic system having 6 to 60 carbon atoms. Examples of the $C_6$-$C_{60}$ aryl group include a fluorenyl group, a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each independently include two or more rings, the respective rings may be fused (e.g., combined together).

The term "$C_1$-$C_{60}$ heteroaryl group," as used herein, refers to a monovalent group having a heterocyclic aromatic system having at least one heteroatom selected from N, O, Si, P, and S as a ring-forming atom and 1 to 60 carbon atoms. The term "$C_1$-$C_{60}$ heteroarylene group," as used herein, refers to a divalent group having a heterocyclic aromatic system having at least one heteroatom selected from N, O, Si, P, and S as a ring-forming atom and 1 to 60 carbon atoms. Examples of the $C_1$-$C_{60}$ heteroaryl group include a carbazolyl group, a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each independently include two or more rings, the respective rings may be fused (e.g., combined together).

The term "$C_6$-$C_{60}$ aryloxy group," as used herein, is represented by —$OA_{102}$ (wherein $A_{102}$ is the $C_6$-$C_{60}$ aryl group). The term "$C_6$-$C_{60}$ arylthio group," as used herein, is represented by —$SA_{103}$ (wherein $A_{103}$ is the $C_6$-$C_{60}$ aryl group).

The term "monovalent non-aromatic condensed polycyclic group," as used herein, refers to a monovalent group that has two or more rings condensed and only carbon atoms as ring forming atoms (e.g., 8 to 60 carbon atoms), wherein the entire molecular structure is non-aromatic. Examples of the monovalent non-aromatic condensed polycyclic group may include an adamantyl group. The term "divalent non-aromatic condensed polycyclic group," as used herein, refers to a divalent group having substantially the same structure as the monovalent non-aromatic condensed polycyclic group.

The term "monovalent non-aromatic condensed heteropolycyclic group," as used herein, refers to a monovalent group that has two or more condensed rings and at least one heteroatom selected from N, O, Si, P, and S, in addition to carbon atoms (e.g., 1 to 60 carbon atoms), as a ring-forming atom, wherein the entire molecular structure is non-aromatic. Examples of the monovalent non-aromatic condensed heteropolycyclic group may include an azaadamantyl group. The term "divalent non-aromatic condensed heteropolycyclic group," as used herein, refers to a divalent group having substantially the same structure as the monovalent non-aromatic condensed heteropolycyclic group.

The term "$C_5$-$C_{60}$ carbocyclic group," as used herein, refers to a monocyclic or polycyclic group having 5 to 60 carbon atoms only as ring-forming atoms, and the term "$C_4$-$C_{30}$ carbocyclic group," as used refers to a monocyclic or polycyclic group having 4 to 60 carbon atoms only as ring-forming atoms. The $C_5$-$C_{60}$ carbocyclic group (or the $C_4$-$C_{30}$ carbocyclic group) may be an aromatic carbocyclic group or a non-aromatic carbocyclic group. The terms "$C_5$-$C_{60}$ carbocyclic group" and "$C_4$-$C_{30}$ carbocyclic group," as used herein, refers to a ring (e.g., a benzene group), a monovalent group (e.g., a phenyl group), or a divalent group (e.g., a phenylene group). Also, depending on the number of substituents connected to the $C_5$-$C_{60}$ carbocyclic group or the $C_4$-$C_{30}$ carbocyclic group, the $C_5$-$C_{60}$ carbocyclic group or the $C_4$-$C_{30}$ carbocyclic group may be a trivalent group or a quadrivalent group.

The term "$C_1$-$C_{60}$ heterocyclic group," as used herein, refers to a group having substantially the same structure as the $C_5$-$C_{60}$ carbocyclic group, except that at least one heteroatom selected from N, O, Si, P, and S is used as a ring-forming atom, in addition to carbon atoms (e.g., 1 to 60 carbon atoms).

In the present specification, at least one of substituents of the substituted $C_5$-$C_{60}$ carbocyclic group (or the substituted $C_4$-$C_{30}$ carbocyclic group), the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, and —$P(=O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, —$N(Q_{21})$ ($Q_{22}$), —B($Q_{21}$)($Q_{22}$), —C(═O)($Q_{21}$), —S(═O)$_2$($Q_{21}$), and —P(═O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), wherein $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_1$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

"Ph," as used herein, represents a phenyl group, "Me," as used herein, represents a methyl group, "Et," as used herein, represents an ethyl group, "ter-Bu" or "$Bu^t$," as used herein, represents a tert-butyl group, and "OMe," as used herein, represents a methoxy group.

The term "biphenyl group," as used herein, refers to a phenyl group substituted with at least one phenyl group. The "biphenyl group" belongs to "a substituted phenyl group" having a "$C_6$-$C_{60}$ aryl group" as a substituent.

The term "terphenyl group," as used herein, refers to a phenyl group substituted with at least one phenyl group. The "terphenyl group" belongs to "a substituted phenyl group" having a "$C_6$-$C_{60}$ aryl group substituted with a $C_6$-$C_{60}$ aryl group" as a substituent.

The symbols * and *', as used herein, unless defined otherwise, refer to a binding site to an adjacent atom in a corresponding formula.

Hereinafter an organic light-emitting device according to an embodiment will be described in more detail with reference to Examples.

EXAMPLES

Comparative Example 1

An anode was manufactured by cutting a Corning 15 Ω/cm$^2$ (1,200 Å) ITO glass substrate to a size of 50 mm×50 mm×0.5 mm, ultrasonically cleaning the glass substrate by using acetone, isopropyl alcohol, and pure water for 15 minutes each, and then irradiating UV light for 30 minutes thereto and being exposed to ozone to clean. Then, the anode was loaded into a vacuum deposition apparatus.

HT18 and Compound 202 (2 percent by weight, wt %) was deposited on the ITO glass substrate to a thickness of 100 Å to form a hole injection layer, and HT18 was deposited on the hole injection layer to a thickness of 1,000 Å to form a hole transport layer.

TCTA was deposited on the hole transport layer to a thickness of 100 Å to form an electron blocking layer, thereby forming a hole transport region.

CBP as a host and BD1 (at a concentration of 10 vol %) as a dopant were co-deposited on the hole transport region to form an emission layer having a thickness of 300 Å.

DIC-TRZ was deposited on the emission layer to form a hole blocking layer having a thickness of 50 Å, and ET1 and Liq were deposited to a weight ratio of 1:1 to form an electron transport layer having a thickness of 300 Å.

LiF was deposited on the electron transport layer to form an electron injection layer having a thickness of 10 Å, and Al was deposited to a thickness of 120 Å to form a cathode. HT28 was deposited on the cathode to form a capping layer having a thickness of 800 Å, thereby completing the manufacture of an organic light-emitting device.

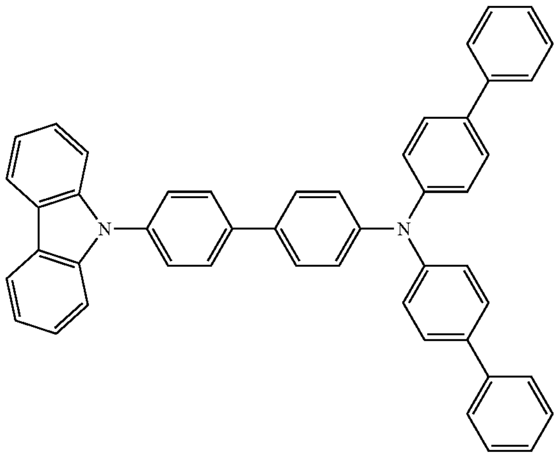

HT18

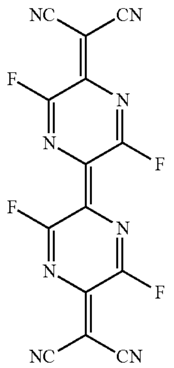

202

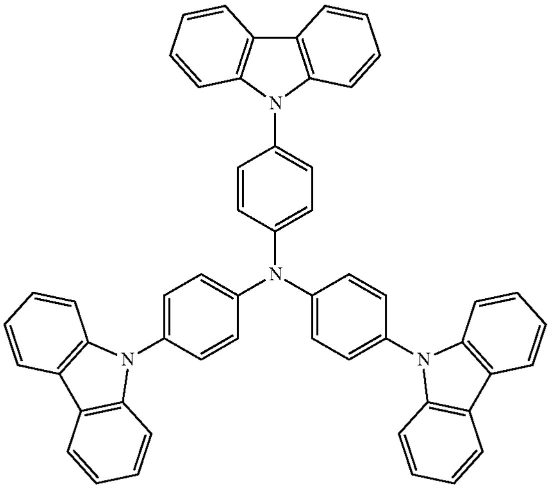

TCTA

-continued

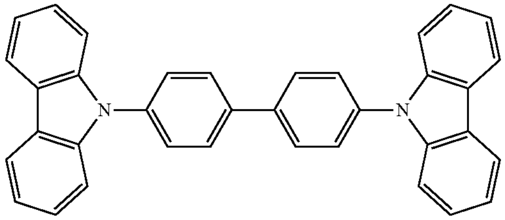

CBP

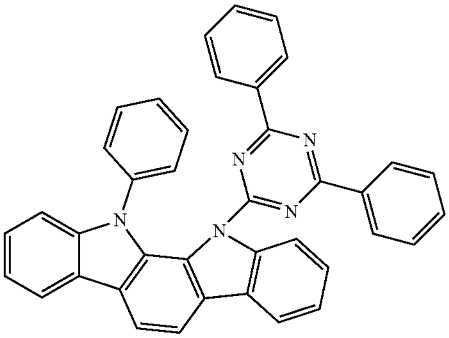

DIC-TRZ

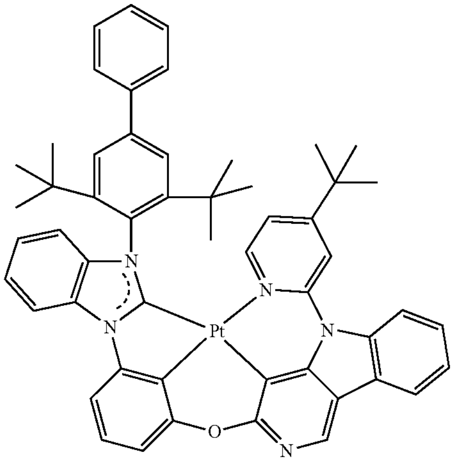

BD1

-continued

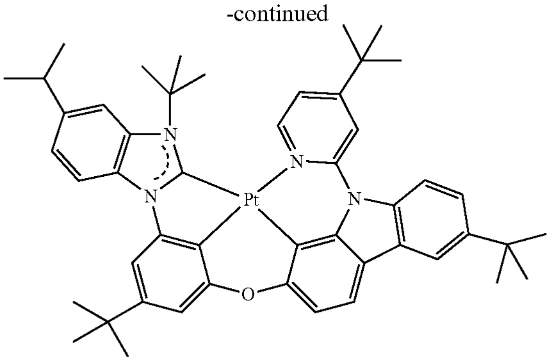

BD2

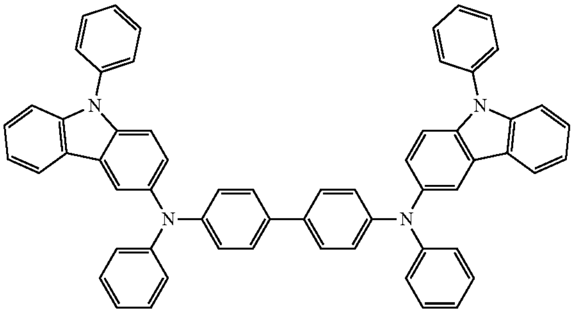

HT28

Examples 1 and 2 and Comparative Examples 2 and 3

Organic light-emitting device were manufactured in substantially the same manner as in Comparative Example 1, except that hosts and dopants shown in Table 1 were used in the formation of an emission layer.

Examples 3 and 4

Organic light-emitting device were manufactured in substantially the same manner as in Comparative Example 1, except that the emission layer was formed as two emission layers in the order of a first emission layer and a second emission layer from the anode by using hosts and dopants shown in Table 1.

Example 5

Organic light-emitting device were manufactured in substantially the same manner as in Comparative Example 1, except that the emission layer was formed as three emission layers in the order of a first emission layer, a second emission layer, and a third emission layer from the anode by using hosts and dopants shown in Table 1.

TABLE 1

| | First emission layer | | Second emission layer | | Third emission layer | |
|---|---|---|---|---|---|---|
| No. | Host | Dopant | Host | Dopant | Host | Dopant |
| Comparative Example 1 | CBP (thickness of 300 Å) | BD1 (10 vol %) | — | — | — | — |
| Comparative Example 2 | CBP (thickness of 300 Å) | BD2 (10 vol %) | — | — | — | — |

TABLE 1-continued

| No. | First emission layer Host | First emission layer Dopant | Second emission layer Host | Second emission layer Dopant | Third emission layer Host | Third emission layer Dopant |
|---|---|---|---|---|---|---|
| Comparative Example 3 | CBP (thickness of 300 Å) | $Ir(dmp)_3$ (10 vol %) + mer-$Ir(pmp)_3$ (3 vol %) | — | — | — | — |
| Example 1 | CBP:DIC-TRZ (6:4) (thickness of 300 Å) | BD1(10 vol %) + BD2 (1 vol %) | — | — | — | — |
| Example 2 | CBP:DIC-TRZ (6:4) (thickness of 300 Å) | BD1(10 vol %) + BD2 (3 vol %) | — | — | — | — |
| Example 3 | CBP:DIC-TRZ (6:4) (thickness of 100 Å) | BD1 (10 vol %) | CBP:DIC-TRZ (6:4) (thickness of 100 Å) | BD2 (10 vol %) | — | — |
| Example 4 | CBP:DIC-TRZ (6:4) (thickness of 100 Å) | BD2 (10 vol %) | CBP:DIC-TRZ (6:4) (thickness of 200 Å) | BD1 (10 vol %) | — | — |
| Example 5 | CBP:DIC-TRZ (6:4) (thickness of 100 Å) | BD2 (10 vol %) | CBP:DIC-TRZ (5:5) (thickness of 100 Å) | BD1 (10 vol %) | CBP:DIC-TRZ (4:6) (thickness of 100 Å) | BD2 (10 vol %) |

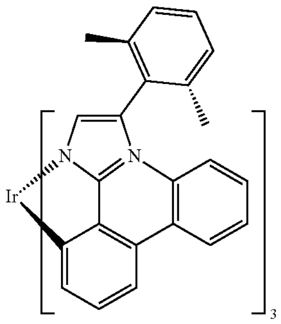

$Ir(dmp)_3$

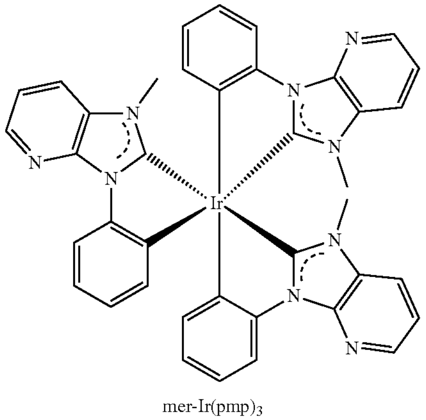

mer-$Ir(pmp)_3$

Evaluation Example

The driving voltage (V), current efficiency (Cd/A), and lifespan (T95) of the organic light-emitting devices of Examples 1 to 5 and Comparative Examples 1 to 3 were measured at a luminance of 1,000 nit. The results thereof are shown in Table 2. The driving voltage and efficiency of the organic light-emitting devices were measured by using a current voltmeter Keithley SMU 236 and a luminance meter PR650. The lifespan indicates a time (hour) for the luminance of the organic light-emitting device to decline to 95% of its initial luminance.

TABLE 2

| No. | Driving voltage (V) | CIE_y | Efficiency (Cd/A) | T95 lifespan (@1,000 nit) (h) |
|---|---|---|---|---|
| Comparative Example 1 | 6.1 | 0.052 | 18.3 | 49 |
| Comparative Example 2 | 5.9 | 0.063 | 18.8 | 62 |
| Comparative Example 3 | 6.8 | 0.112 | 13.1 | 9 |
| Example 1 | 6.1 | 0.053 | 18.5 | 60 |
| Example 2 | 6.0 | 0.055 | 18.8 | 75 |
| Example 3 | 6.0 | 0.057 | 18.8 | 55 |
| Example 4 | 5.9 | 0.055 | 19.1 | 71 |
| Example 5 | 5.6 | 0.053 | 19.3 | 78 |

As shown in Table 2, the organic light-emitting devices of Examples 1 to 5 exhibited improved driving voltage, color purity, efficiency, and/or lifespan, as compared with the organic light-emitting devices of Comparative Examples 1 to 3.

As is apparent from the foregoing description, the organic light-emitting device may have high color purity, high efficiency, and long lifespan.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims, and equivalents.

What is claimed is:

1. A light-emitting device comprising:
a first electrode;
a second electrode facing the first electrode; and
an organic layer between the first electrode and the second electrode and comprising an emission layer, wherein the emission layer comprises a red emission layer, a green emission layer, and a blue emission layer,
wherein the blue emission layer comprises a host and a dopant,
the host comprises a first compound and a second compound different from the first compound,
the dopant comprises a third compound and a fourth compound different from the third compound, and
the third compound is a platinum-containing organometallic compound, and
wherein a y coordinate among CIE color-coordinates of light emitted from the blue emission layer is in a range of about 0.045 to about 0.06.

2. The light-emitting device of claim 1,
wherein the blue emission layer comprises a first emission layer and a second emission layer,
the first emission layer is between the first electrode and the second emission layer,
the first emission layer comprises the first compound, the second compound, and a first dopant,
the second emission layer comprises the first compound, the second compound, and a second dopant,
the first dopant is one selected from the third compound and the fourth compound, and
the second dopant is different from the first dopant and is the other one selected from the third compound and the fourth compound.

3. The light-emitting device of claim 2,
wherein a difference between a maximum emission wavelength of light emitted from the first emission layer and a maximum emission wavelength of light emitted from the second emission layer is in a range of about 0 nm to about 35 nm.

4. The light-emitting device of claim 1,
wherein the blue emission layer comprises a first emission layer, a second emission layer, and a third emission layer,
wherein the first emission layer is between the first electrode and the second emission layer,
the second emission layer is between the first electrode and the third emission layer,
the first emission layer comprises the first compound, the second compound, and a first dopant,
the second emission layer comprises the first compound, the second compound, and a second dopant,
the third emission layer comprises the first compound, the second compound, and a third dopant,
the first dopant and the third dopant are each one selected from the third compound and the fourth compound, and
the second dopant is different from the first dopant and the third dopant and is the other one selected from the third compound and the fourth compound.

5. The light-emitting device of claim 1, further comprising a hole transport region between the first electrode and the emission layer; and
an electron transport region between the second electrode and the emission layer,
wherein the hole transport region comprises a hole injection layer, a hole transport layer, an emission auxiliary layer, an electron blocking layer, or a combination thereof, and
the electron transport region comprises an electron transport layer, an electron injection layer, an electron control layer, a hole blocking layer, or a combination thereof.

6. The light-emitting device of claim 5,
wherein at least one of the hole injection layer, the hole transport layer, the emission auxiliary layer and the electron blocking layer comprises a p-dopant,
wherein the lowest unoccupied molecular orbital (LUMO) energy level of the p-dopant is −3.5 eV or less.

7. The light-emitting device of claim 6,
wherein the p-dopant comprises at least one selected from the group consisting of a quinone derivative, a metal oxide and a cyano group-containing compound.

8. The light-emitting device of claim 1,
wherein the first compound comprises at least one moiety represented by any one selected from Formulae 3-1 to 3-3:

3-1

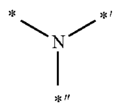

3-2

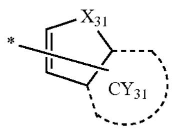

3-3

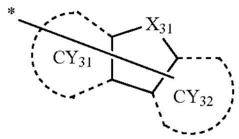

wherein, in Formulae 3-1 to 3-3,
$X_{31}$ is selected from O, S, N-$(L_{33})_{a33}$-$(R_{33})_{b33}$, C($R_{33}$)($R_{34}$), and Si($R_{33}$)($R_{34}$),
$CY_{31}$ and $CY_{32}$ are each independently a π-electron rich cyclic group,
$L_{33}$ is selected from a single bond, a substituted or unsubstituted $C_5$-$C_{30}$ carbocyclic group, and a substituted or unsubstituted $C_1$-$C_{30}$ heterocyclic group,
a33 is an integer from 1 to 10,
$R_{33}$ and $R_{34}$ are each independently selected from hydrogen, deuterium, —F, —Cl, —Br, —I, a hydroxyl group, a cyano group, a nitro group, an amidino group, a hydrazino group, a hydrazono group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, and —$P(=O)(Q_1)(Q_2)$, b33 is an integer from 1 to 10, and

*, *', and *" each indicate a binding site to an adjacent atom.

9. The light-emitting device of claim 1, wherein the second compound is a compound represented by Formula 4-1:

Formula 4-1

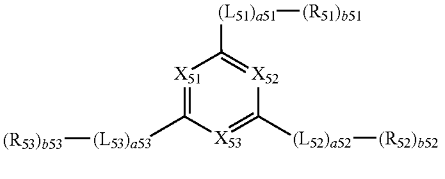

wherein, in Formula 4-1, $X_{51}$ is N or $C[(L_{54})_{a54}$-$(R_{54})_{b54}]$, $X_{52}$ is N or $C[(L_{55})_{a55}$-$(R_{55})_{b55}]$, and $X_{53}$ is N or $C[(L_{56})_{a56}$-$(R_{56})_{b56}]$, $L_{51}$ to $L_{56}$ are each independently selected from a single bond, a substituted or unsubstituted $C_5$-$C_{30}$ carbocyclic group, and a substituted or unsubstituted $C_1$-$C_{30}$ heterocyclic group, a51 to a56 are each independently an integer from 1 to 10, $R_{51}$ to $R_{56}$ are each independently selected from hydrogen, deuterium, —F, —Cl, —Br, —I, a hydroxyl group, a cyano group, a nitro group, an amidino group, a hydrazino group, a hydrazono group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, and —$P(=O)(Q_1)(Q_2)$, b51 to b56 are each independently an integer from 1 to 10, and at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, and —$P(=O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_1$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, and —$P(=O)(Q_{21})(Q_{22})$; and —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amino group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

10. The light-emitting device of claim 1, wherein the third compound and the fourth compound are each independently an organometallic compound represented by Formula 1:

Formula 1

$M(L_1)_{n1}(L_2)_{n2}$

Formula 1A

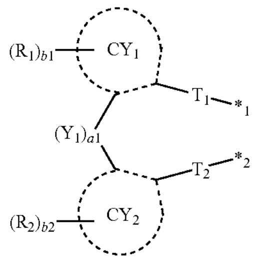

Formula 1B

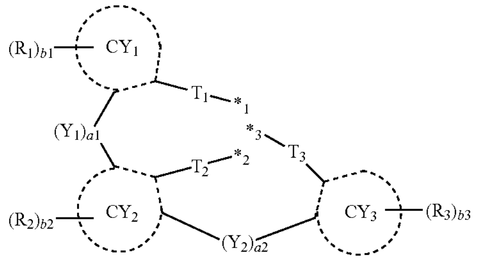

Formula 1C

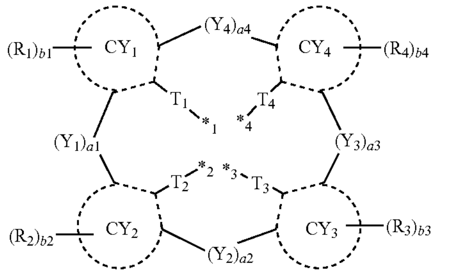

wherein, in Formulae 1 and 1A to 1C,

M is selected from a first-row transition metal, a second-row transition metal, and a third-row transition metal, wherein M in the third compound is platinum (Pt), $L_1$ is selected from a ligand represented by Formula 1A, a ligand represented by Formula 1B, and a ligand represented by Formula 1C, $L_2$ is selected from a monodentate ligand, a bidentate ligand, and a tridentate ligand, n1 is selected from 1, 2, and 3, n2 is selected from 0, 1, 2, 3, and 4, $CY_1$ to $CY_4$ are each independently selected from a $C_5$-$C_{30}$ carbocyclic group and a $C_1$-$C_{30}$ heterocyclic group, $Y_1$ to $Y_4$ are each independently selected from a single bond, a double bond, a substituted or unsubstituted $C_6$-$C_{60}$ arylene group, a substituted or unsubstituted $C_1$-$C_{30}$ heteroarylene group, *—O—*', *—S—*', *—C(=O)—*', *—S(=O)—*', *—C($R_5$)($R_6$)—*', *—C($R_5$)=C($R_6$)—*' *—C($R_5$)=*', *—Si($R_5$)($R_6$)—*', *—B($R_5$)—*', *—N($R_5$)—*', and *—P($R_5$)—*', a1 to a3 are each independently selected from 1, 2, and 3, a4 is selected from 0, 1, 2, and 3, and when a4 is 0, $CY_2$ and $CY_4$ are not connected to each other, $T_1$ to $T_4$ are each independently selected from a chemical bond, *—O—*', *—S—*', *—B($R_7$)—*', *—N($R_7$)—*', *—P($R_7$)—*', *—C($R_7$)($R_8$)—*', *—Si($R_7$)($R_8$)—*', *—Ge($R_7$)($R_8$)—*', *—C(=O)—*', and *—C(=S)—*', $*_1$, $*_2$, $*_3$, and $*_4$ are each a binding site to M, $R_1$ to $R_8$ are each independently selected from hydrogen, deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), wherein adjacent groups from among $R_1$ to $R_8$ are optionally bound to form a substituted or unsubstituted $C_5$-$C_{60}$ carbocyclic group or a substituted or unsubstituted $C_1$-$C_{60}$ heterocyclic group, adjacent groups from among $R_1$ to $R_8$ and $Y_1$ to $Y_4$ are optionally bound to form a substituted or unsubstituted $C_5$-$C_{60}$ carbocyclic group or a substituted or unsubstituted $C_1$-$C_{60}$ heterocyclic group, b1 to b4 are each independently an integer from 0 to 10, and at least one substituent of the substituted $C_6$-$C_{60}$ arylene group, the substituted $C_1$-$C_{30}$ heteroarylene group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, the substituted monovalent non-aromatic condensed heteropolycyclic group, the substituted $C_5$-$C_{60}$ carbocyclic group, and the substituted $C_1$-$C_{60}$ heterocyclic group is selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, and —$P(=O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_1$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, and —$P(=O)(Q_{21})(Q_{22})$; and —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amino group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, and

* and *' each indicate a binding site to an adjacent atom.

11. The light-emitting device of claim 10, wherein the third compound and the fourth compound are each independently selected from compounds represented by Formulae 1-1 and 1-2:

Formula 1-1

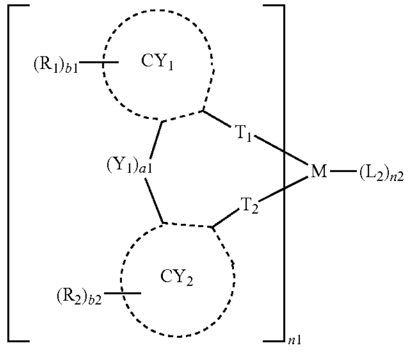

Formula 1-2

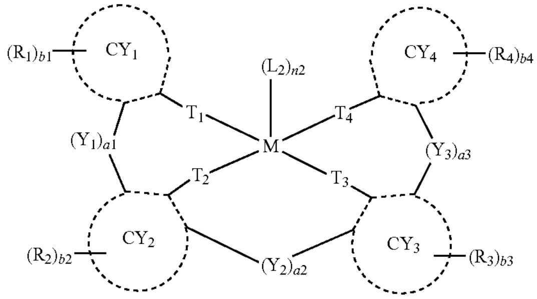

wherein, in Formulae 1-1 and 1-2,

M, $L_2$, n1, n2, $CY_1$ to $CY_4$, $Y_1$ to $Y_3$, a1 to a3, $T_1$ to $T_4$, $R_1$ to $R_4$, and b1 to b4 are respectively understood by referring to the descriptions of M, $L_2$, n1, n2, $CY_1$ to $CY_4$, $Y_1$ to $Y_3$, a1 to a3, $T_1$ to $T_4$, $R_1$ to $R_4$, and b1 to b4 in Formulae 1 and 1A to 1C.

12. The light-emitting device of claim 1, wherein the total content of the third compound and the fourth compound is in a range of about 1 percent by volume (vol %) to about 50 vol %, based on the total volume of the first compound and the second compound in the blue emission layer.

13. The light-emitting device of claim 1, further comprising a capping layer on the second electrode, wherein the capping layer has a refractive index of 1.6 or greater at a wavelength of 589 nanometers (nm).

14. An electronic apparatus comprising:

a thin-film transistor comprising a source electrode, a drain electrode, and an active layer; and the organic light-emitting device of claim 1, wherein the first electrode of the organic light-emitting device is electrically coupled to any one selected from the source electrode and the drain electrode of the thin-film transistor.

15. The electronic apparatus of claim 14, further comprising a color filter, a color-conversion layer, or a color filter and a color-conversion layer, wherein the color-conversion layer comprises a quantum dot.

16. The electronic apparatus of claim 14, further comprising a sealing portion for sealing the organic light-emitting device.

17. The electronic apparatus of claim 14, further comprising a functional a layer, wherein the functional a layer comprises a touch screen layer, a polarization layer or a combination thereof.

18. The electronic apparatus of claim 14, being applicable to displays, an optical source, lighting, a personal computer, a cellphone, a digital camera, an electronic note, an electronic dictionary, an electronic game console, a medical device, a fish finder, various suitable measurement devices, gauges, and/or a projector.

* * * * *